United States Patent [19]
Uenishi et al.

[11] Patent Number: 6,040,600
[45] Date of Patent: Mar. 21, 2000

[54] TRENCHED HIGH BREAKDOWN VOLTAGE SEMICONDUCTOR DEVICE

[75] Inventors: Akio Uenishi; Tadaharu Minato, both of Hyogo, Japan

[73] Assignee: Mitsubishi Denki Kabushiki Kaisha, Tokyo, Japan

[21] Appl. No.: 08/909,411

[22] Filed: Aug. 11, 1997

[30] Foreign Application Priority Data

Feb. 10, 1997 [JP] Japan ................................. 9-026997

[51] Int. Cl.[7] .................................................. H01L 29/78
[52] U.S. Cl. ........................ 257/330; 257/335; 257/347; 257/655
[58] Field of Search ................... 257/327–334, 257/347, 655

[56] References Cited

U.S. PATENT DOCUMENTS

| | | | |
|---|---|---|---|
| 4,065,742 | 12/1977 | Kendall et al. | |
| 5,216,275 | 6/1993 | Chen | |
| 5,324,966 | 6/1994 | Muraoka et al. | 257/330 |
| 5,341,011 | 8/1994 | Hshieh et al. | 257/335 |
| 5,391,506 | 2/1995 | Tada et al. | |
| 5,438,215 | 8/1995 | Tihanyi | |
| 5,629,543 | 5/1997 | Hshieh et al. | 257/330 |
| 5,689,128 | 11/1997 | Hshieh et al. | 257/330 |

FOREIGN PATENT DOCUMENTS

| | | |
|---|---|---|
| 5-343679 | 12/1993 | Japan |
| 8-222735 | 8/1996 | Japan |

*Primary Examiner*—David B. Hardy
*Attorney, Agent, or Firm*—McDermott, Will & Emery

[57] ABSTRACT

An n type diffusion region and a p type diffusion region are formed in a region sandwiched between trenches arranged at a first main surface of a semiconductor substrate. A p type well is formed in the n- and p-type diffusion regions nearer the first main surface. A source $n^+$ diffusion region is formed at the first main surface within the p type well. A gate electrode layer is formed opposite to the p type well sandwiched between the n type diffusion region and the source $n^+$ diffusion region with a gate insulating layer disposed therebetween. The n- and p-type diffusion regions each have an impurity concentration distribution diffused from a sidewall surface of a trench. Thus, a fine, micron-order pn repeat structure can be achieved with sufficient precision and a high breakdown voltage semiconductor device is thus obtained which has superior on-state voltage and breakdown voltage as well as fast switching characteristics.

20 Claims, 46 Drawing Sheets

TRENCHED HIGH BREAKDOWN VOLTAGE SEMICONDUCTOR DEVICE

BACKGROUND OF THE INVENTION

1. Field of the Invention

The present invention relates to a high breakdown voltage semiconductor device, and more particularly to a high breakdown voltage and low loss high breakdown voltage semiconductor device used for various power supply devices.

2. Description of the Background Art

High breakdown voltage semiconductor devices used for switching power sources, inverter devices or the like have been improved to power MOSFET (Metal Oxide Semiconductor Field Effect Transistor), SIT (Static Induction Thyristor) and the like and further to IGBT (Insulated Gate Bipolar Transistor) to achieve fast switching characteristic, low on-state voltage and the like in response to demand for high efficiency and miniaturization of the devices. While optimization of structures of these conventional devices has been actively promoted, demands for the devices with still higher frequency and miniaturization of the devices, and more inexpensive devices are difficult to meet and thus some new approach need be taken.

Since conventional high breakdown voltage semiconductor devices are provided with a thick, high relative resistance drift region at a main current path to obtain high breakdown voltage, a device with higher breakdown voltage has larger voltage drop at this portion and its on-state voltage is increased. In particular, a power MOSFET and an SIT of a so-called unipolar device which use only majority carrier for conduction are capable of fast-switching but have high on-state voltage and it has been believed that the trade-off relation between on-state voltage and breakdown voltage cannot exceed a limit characteristic to semiconductor material known as the so-called silicon limit.

For IGBT, a small amount of minority carrier is introduced to a drift region to increase conductivity and thus the trade-off relation between on-state voltage and breakdown voltage has been greatly improved. However, since switching thereof is accompanied with a transient phenomenon caused by minority carrier accumulation effect, thereby increasing switching loss and since a pn junction for introducing minority carrier is provided at a main current path, an on-state voltage equal to or less than the voltage drop cannot be achieved. Thus, for IGBT, it has been difficult to decrease on-state voltage to approximately 1V or less in a device with a breakdown voltage on the order of several hundreds volts.

For bipolar transistors and bipolar mode SITs, minority carrier is supplied from a base or a gate terminal. Thus, while voltage drop due to a pn junction is not caused, switching loss is increased, and also a large base (gate) forward current (approximately ¹⁄₁₀ of a main current for a device with a breakdown voltage on the order of several hundreds volts) need be supplied to increase carrier density to a saturation state, disadvantageously leading to large drive loss.

In order to overcome such limitations on conventional high breakdown voltage devices, a device having a structure in cross section such as that shown in FIG. 58 has been suggested, for example, in U.S. Pat. No. 5,216,275.

The structure shown in FIG. 58 is an example in which the technique disclosed in the above document is applied to a trench gate type power MOSFET and a drift region, which is formed of a high resistivity n type semiconductor in a conventional device, is substituted with a repeat structure of narrow n type region 301 and p type region 302.

The above document does not specifically describe a positional relation between a gate 309 which forms a channel and a p type well 303 which forms a back gate, and pn repeat structure 301 and 302. However, the channel and p type well 303 need be connected to n type region 301 and p type region 302, respectively, as shown in the figure. The above document suggests that it is now important that the amount of the impurity in n type region 301 is equal to that of the impurity in p type region 302 and that the width of each of regions 301 and 302 need be sufficiently narrow.

When a device of this structure is in an on-state, an n channel is induced by MOS gate 309 at a surface of p type well 303 opposite to MOS gate 309 with a gate insulating layer 308 disposed therebetween. Then, electronic current passes the route from a drain $n^+$ region 304 via n type region 301 and the n type channel to a source $n^+$ diffusion region 305. If MOS gate 309 is sufficiently biased to suppress voltage drop at the channel portion, the on-state voltage is generally determined depending on the voltage drop caused by the resistance of n type region 301. A on-state resistance Ron per unit area is given by the following relation:

$$Ron \approx Ld/(q \times Nd \times \mu) \times (Wn+Wp)/Wn \quad (1)$$

wherein

Ld: the length of a drift layer q: unit charge

Nd: the net impurity concentration in n type region 1

$\mu$: mobility of electrons of n type region 1.

In an off state wherein a drain voltage is as low as approximately 10V, a space-change region is formed along a junction of an n type region portion (formed of drain $n^+$ region 304 and n type region 301 connected to a drain) and a p type region portion (formed of p type well 303 and p type region 302 connected to a source). Thus, when seen along line 59—59 in the figure, the space-charge region expands from a boundary of the pn junction. As the drain voltage is increased, all of n type region 301 and p type region 302 are depleted, since these regions are thin. When a still higher drain voltage is applied, the space-charge region expands only toward p type well 303 and drain $n^+$ region 304.

Now FIG. 59 which shows an impurity distribution at the pn repeat structure portion is referred to to discuss electric field strength thereof.

An electric field component at a cross section along line 59—59 in the X direction in FIG. 58 is increased within n type region 301 and decreased within p type region 302 and thus exhibits a continuous triangular waveform, as shown in FIG. 60. When going around a repeat structure portion through p type region 302 and n type region 301, the potential at the cross section along line 59—59 returns to the same level. Thus, an offset point is determined such that an area $S_1$ (a hatched area) at the positive side of the electric field in the X direction is equal to an area $S_2$ (a hatched area) at the negative side. When the present model is simplified by Nd=Na (Na: a net impurity concentration of p type region 302), the largest value of the electric field in the X direction is given by the following equation:

$$Ex(max) = q \times Nd \times Wn/2/\in \quad (2)$$

$\in$: dielectric constant of silicon.

An electric field strength at a cross section along line 60—60 exhibits a distribution in the shape of a rectangle or trapezoid. If the condition that the amount of the impurity in n type region 301 is equal to that of the impurity in p type region 302, a rectangular electric field distribution is obtained. When the amount of the impurity in n type region 301 is relatively larger the strength of an electric field closer to the source (S) is increased, as is typical with a device having a typical n type drift layer.

Here, a breakdown voltage Vbr of a device is almost determined with the largest value of the electric field reaching a critical electric field strength Ec (for silicon, $Ec \approx 2e5V/cm$ ($2 \times 10^5 V/cm$)), and thus when $Na=Nd$, the following relation can be obtained:

$$Vbr \approx Ec \times Ld \qquad (3)$$

According to expression (1), while an impurity concentration Nd of n type region 301 need only be increased to reduce an on-state voltage (on-state resistance), an impurity concentration Na of p type region 302 is also increased to maintain breakdown voltage. As the absolute value of these impurity concentrations is increased, the gradient of an electric field along the X direction in an off state becomes steep. Then, when the largest value Ex(max) of the electric field approaches a critical electric field, breakdown voltage no longer attains a value expected in expression (3). Thus, the following relation is required:

$$Wn < 2 \times \in \times Ec/(q \times Nd) \qquad (4)$$

The on-state resistance is:

$$Ron = Vbr \times (Wn+Wp)/(2 \times \in \times \mu \times Ec) \qquad (5)$$

and thus if Wn and Wp are decreased, the on-state resistance can be extremely decreased. While an on-state resistance in this structure is proportional to the breakdown voltage raised to the first power, an on-state resistance in a power MOSFET which employs a conventional, simple high resistance drift region is increased in proportional to the breakdown voltage raised to the second power (which, more specifically, also can be the breakdown voltage raised to the 2.6th power, taking into consideration the dependence of a critical electric field on the impurity concentration of the drift layer). Thus, it is appreciated that if a fine pn repeat structure as shown in FIG. 58 can be built in, a high breakdown voltage and low on-state voltage device can be obtained.

The above document describes that the pn repeat structure shown in FIG. 58 can be obtained by epitaxially growing silicon which selectively contains an impurity at an etched trench or by causing nuclear transformation by selective neutron radiation. However, any of these methods, in fact, hardly has the possibility of achieving a pn repeat structure. This will be described hereinafter in detail with reference to each manufacturing method shown in the figures.

It should be noted that the above document describes the above manufacturing methods in the form of text and thus the following description by means of the figures is derived from the text.

FIGS. 62–64 are schematic cross sectional views for illustrating a method of producing a pn repeat structure by epitaxial growth method in the order of process step. Referring to FIG. 62, an n⁻ epitaxial layer 301 is formed by epitaxial growth method on an n⁺ region 304 which serves as a drain n+region.

Referring to FIG. 63, n⁻ epitaxial layer 301 is anisotropically etched with n⁻ epitaxial layer 301 masked by a mask 310 formed of, for example, a silicon oxide film. This causes n⁺ region 304 to be exposed and a trench 301a is formed in n⁻ epitaxial layer 301. Then mask 310 is removed.

Referring to FIG. 64, a p⁻ epitaxial layer 302 is selectively formed in trench 301a by epitaxial growth method. Thus a pn repeat structure is formed by epitaxial growth method.

With such an epitaxial growth method, a film being formed grows while sucking an impurity closer to a substrate, as is commonly known as autodope phenomenon. Thus, even for a growth at a low temperature of approximate 800° C., an impurity closer to a substrate (an impurity in n⁻ epitaxial layer 301) will be readily diffused into p⁻ epitaxial layer 302 during the growth of p⁻ epitaxial layer 302. Thus, clear p- and n-type impurity layers 301 and 302 in a pn repeat structure cannot be formed in a micron-order fine repeat structure.

Furthermore, it is known that impurity concentration in epitaxial growth method can be controlled by at best approximately 5% and that it is difficult to control by even 10% for the present case in which the value of the impurity concentration of a p type impurity layer is required to be close to that of the impurity concentration of an n type impurity layer.

FIGS. 65 and 66 are schematic cross sectional views for illustrating a method of producintrenchn repeat structure by nuclear transformation caused by neutron radiation in the order of process step. Referring first to FIG. 65, a p⁻ epitaxial layer 302 is formed on an n⁺ region 304 which serves as a drain n⁺ region by epitaxial growth method.

Referring to FIG. 66, a mask 350 is used and p⁻ epitaxial layer 302 is selectively irradiated with neutron ray. Thus, nuclear transformation is caused in part of silicon (Si) to produce phosphorus (P). The phosphorus is an n type dopant and thus an n⁻ layer 301 is formed in p⁻ epitaxial layer 302 irradiated with neutron ray. Thus nuclear transformation by neutron radiation forms a pn repeat structure.

For the nuclear transformation by selective neutron radiation, presently there is not a mask material required for forming patterns of micron size. More specifically, while a mask requires a light shielding film for shielding neutron ray radiation, a material typically used for a light shielding film is too thin to shield neutron ray in forming patterns of micron size. Furthermore, since parallel neutron flux cannot be obtained, it is impossible to achieve fine fabrication by the selective neutron ray radiation described above.

As described above, while the structure described in the above document has the possibility of greatly improving the trade-off between the breakdown voltage and on-state voltage of existing devices, there also is a fatal disadvantage that the structure cannot be achieved.

SUMMARY OF THE INVENTION

An object of the present invention is to allow a fine pn repeat structure to provide a high breakdown voltage semiconductor device capable of greatly improving the trade-off between the breakdown voltage and on-state voltage thereof.

A high breakdown voltage semiconductor device according to the present invention includes a semiconductor substrate, a first impurity region of a first conductivity type, a second impurity region of a second conductivity type, a third impurity region of the second conductivity type, a fourth impurity region of the first conductivity type, and a gate electrode layer. The semiconductor substrate has first and second main surfaces opposite to each other and has a plurality of trenches provided at the first main surface. The first impurity region is formed within a region of the semiconductor substrate sandwiched between one trench and another trench of the plurality of trenches at a sidewall surface of one trench. The second impurity region is formed within the region sandwiched between one trench and another trench at a sidewall surface of another trench and forms a pn junction with the first impurity region. The third impurity region is formed at the first and second impurity regions closer to the first main surface. The fourth impurity region is formed at at least either the first main surface or a sidewall surface of one trench such that the fourth impurity region is opposite to the first impurity region with the third impurity region disposed therebetween. The gate electrode layer is opposite to the third impurity region sandwiched between the first impurity region and the fourth impurity region with a gate insulating layer disposed therebetween. The first impurity region has an impurity concentration distribution diffused from a sidewall surface of one trench, and the second impurity region has an impurity concentration distribution diffused from a sidewall surface of another trench.

A high breakdown voltage semiconductor device according to the present invention has first and second impurity regions as a pn structure formed at a region sandwiched between a first trench and a second trench. Thus, the trade-off between the breakdown voltage and on-state voltage of existing devices can be greatly improved.

Furthermore, each of the first and second impurity regions has an impurity concentration distribution diffused from a sidewall surface of the first and second trenches. A structure having an impurity concentration distribution can be formed by, for example, oblique ion implantation method. The ion implantation method has a greatly higher controllability of impurity concentration than epitaxial growth method does. Thus, a fine micron-order pn repeat structure in which the value of the p type impurity concentration is close to that of the n type impurity concentration can be formed with good controllability.

In one preferred aspect of the present invention, a source electrode is formed on the first main surface such that the source electrode is electrically connected to the third and fourth impurity regions, and a drain electrode is formed on the second main surface such that the drain electrode is electrically connected to the first impurity region.

This allows a fine micron-order pn repeat structure in a longitudinal power MOSFET.

In another preferred aspect of the present invention, a source electrode is formed on the first main surface such that the source electrode is electrically connected to the third and fourth impurity regions, and a drain electrode is formed on the first main surface such that the drain electrode is electrically connected to the first impurity region.

This allows a fine micron-order pn repeat structure in a lateral power MOSFET.

In another preferred aspect of the present invention, the space between adjacent trenches is equal to or less than one third of the depth of the trench.

This allows a pn repeat structure of fine size.

In another preferred aspect of the present invention, the first impurity region is formed at one of sidewall surfaces of one trench opposite to each other, and an impurity region the conductivity type of which is different from that of the first impurity region is formed at the other of the sidewall surfaces.

This structure can be obtained by, for example, oblique ion implantation method.

In another preferred aspect of the present invention, the first impurity region is formed at one of sidewall surfaces of one trench opposite to each other, and an impurity region the conductivity type of which is the same as that of the first impurity region is formed at the other of sidewall surfaces.

This structure can be obtained, for example, by oblique, rotational ion implantation method.

In another preferred aspect of the present invention, an interior of a trench is filled with silicon having an impurity concentration of no more than 10% of an impurity concentration of the first impurity region at a sidewall surface of one trench.

This can prevent the charge density of a filling layer formed of silicon from significantly affecting the electric field distribution when the filling layer fills a trench.

In another preferred aspect of the present invention, a fifth impurity region of the first conductivity type having an impurity concentration higher than that of the first impurity region is provided closer to the second main surface than the first and second impurity regions. The drain electrode is electrically connected to the first impurity region with the fifth impurity region disposed therebetween. Silicon which fills an inside of a trench is separated from the first and second impurity regions by an insulating layer and is in contact with the fifth impurity region.

In another preferred aspect of the present invention, an interior of a trench is filled with an insulating layer.

Since a trench is filled with an insulating layer and the insulating layer has a sufficiently low charge density, the charge density does not significantly affect the electric field distribution.

In another preferred aspect of the present invention, a gate electrode layer extends in a direction in which one and another trenches extend.

In another preferred aspect of the present invention, a gate electrode layer extends in a direction in which the gate electrode layer intersects with one and another trenches.

This allows designing with higher degree of freedom. Furthermore, the space between gates can be increased, and thus increase of input capacitance due to increase of gate density and hence decrease in switching speed can be prevented.

In another preferred aspect of the present invention, a gate electrode layer has trench gate structure and is formed at the first main surface and disposed only on the first impurity region.

This allows designing with higher degree of freedom. Moreover, gate capacitance can be further decreased and thus switching speed is further improved.

In another preferred aspect of the present invention, a gate electrode layer has planar gate structure and is formed at the first main surface.

This allows the space between gates to be increased as compared with trench gate type and thus allows a simpler process for forming a gate structure and thus manufacturing at low cost.

In another preferred aspect of the present invention, a repeat structure is formed in which a pn structure formed of first and second impurity regions adjacent to each other, and a trench are repeated. A perimeter of the repeat structure is covered with a resistive film with a separating insulating layer disposed therebetween, and that end of the resistive film closer to the first main surface is electrically connected to a source electrode and that end of the resistive film closer to the second main surface is electrically connected to a drain electrode.

This allows an electric field of a pn repeat structure to be linked to equipotential surface at an end portion of the repeat structure without contradiction, and a breakdown voltage of the pn repeat structure is obtained intact. Furthermore, a resistive film connected to a source electrode and to a drain electrode serves as a resistive field plate and this prevents effects of ions and the like within a sealing resin or the like and thus stable breakdown voltage can be obtained in the long term. Furthermore, only a small area for the end structure is required and thus it can be manufactured at low cost.

In another preferred aspect of the present invention, a repeat structure is formed in which a pn structure formed of first and second impurity regions adjacent to each other, and a trench are repeated. The repeat structure is connected at its perimeter to a semiconductor region of a first conductivity type and has a structure in which a tip of a depletion layer expanding from the repeat structure when voltage is applied to a drain electrode ends within the semiconductor region.

This allows an end structure with a simple repeat structure.

In another preferred aspect of the present invention, a diffusion length of an impurity in the first impurity region from a sidewall surface of one trench is shorter than a width of the first impurity region between the sidewall surface of one trench and a pn junction of the first and second impurity regions. A diffusion length of an impurity in the second impurity region from a sidewall surface of another trench is shorter than a width of the second impurity region between the sidewall surface of another trench and the pn junction of the first and second impurity regions.

This relaxes changes of electric field in the pn repeat structure and thus can prevent electric field concentration.

In another preferred aspect of the present invention, a repeat structure is formed in which a pn structure formed of first and second impurity regions adjacent to each other, and a trench are repeated. The space between trenches is narrower at an perimeter than at the center of the first main surface of the repeat structure.

This restrains drop of breakdown voltage.

In another preferred aspect of the present invention, a filling layer containing silicon as a material fills an inside of a trench. An impurity concentration of the filling layer is lower than that of a semiconductor region.

In another preferred aspect of the present invention, the total amount of an impurity which is opposite in conductivity to the semiconductor region is larger when the total amount of an impurity of the first conductivity type introduced into the first and second impurity regions is compared with that of an impurity of the second conductivity type introduced into the first and second impurity regions.

In another preferred aspect of the present invention, the semiconductor substrate is an SOI substrate having a substrate disposed closer to the second main surface and a semiconductor layer disposed closer to the first main surface and insulated from the substrate, and the first, second, third, and fourth impurity regions are formed at the semiconductor layer.

This allows an SOI type lateral power MOSFET.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter embodiments according to the present invention will be described with reference to the figures.

First Embodiment

Figure 1:
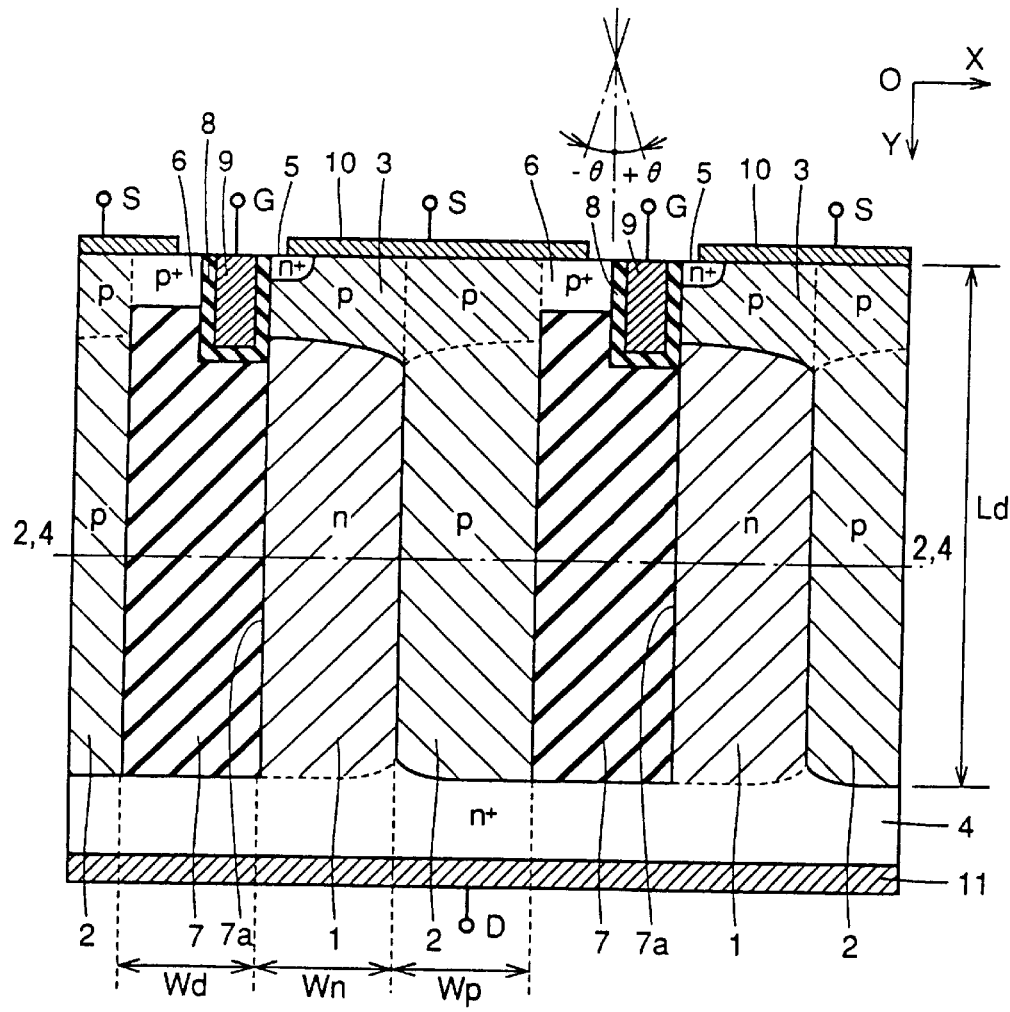
FIG. 1 is a schematic cross sectional view of a configuration of a high breakdown voltage semiconductor device according to a first embodiment of the present invention.

Referring to FIG. 1, a first main surface of a semiconductor substrate is provided with a plurality of repeated trenches 7a. Provided within a region sandwiched between trenches 7a are n- and p-type diffusion regions 1 and 2, and n type diffusion region 1 is provided on a sidewall surface of one trench 7a and p type diffusion region 2 is provided on a sidewall surface of another trench 7a. n- and p-type diffusion regions 1 and 2 form a pn junction along the direction of the depth of trench 7a.

A p type well (also referred to as a p type base region) 3 is formed closer to the first main surface than n- and p-type diffusion regions 1 and 2. A source $n^+$ diffusion region 5 is provided within p type well 3 at a sidewall surface of one trench 7a. A gate electrode layer 9 is formed along a sidewall surface of one trench 7a such that gate electrode layer 9 is opposite to p type well 3 sandwiched between source $n^+$ diffusion region 5 and n type diffusion region 1 with a gate insulating layer 8 disposed between p type well 3 and gate electrode layer 9.

Trench 7a is filled with a filling layer 7 formed of an insulator of silicon of low impurity concentration (including single crystal, polycrystal, non-crystal and fine crystal), silicon oxide film or the like. A $p^+$ diffusion region 6 is provided closer to the first main surface than filling layer 7 and is in contact with p type well 3.

Furthermore, a drain $n^+$ region 4 is formed closer to a second main surface than a repeat structure of n- and p-type diffusion regions 1 and 2 and trench 7a (referred to as a p-n-trench repeat structure hereinafter).

A source electrode layer 10 is formed on the first main surface such that source electrode layer 10 is electrically connected to p type well 3, source $n^+$ diffusion region 5 and $p^+$ diffusion region 6. A drain electrode layer 11 is formed on the second main surface such that drain electrode layer 11 is electrically connected to drain $n^+$ region 4.

Figure 58:
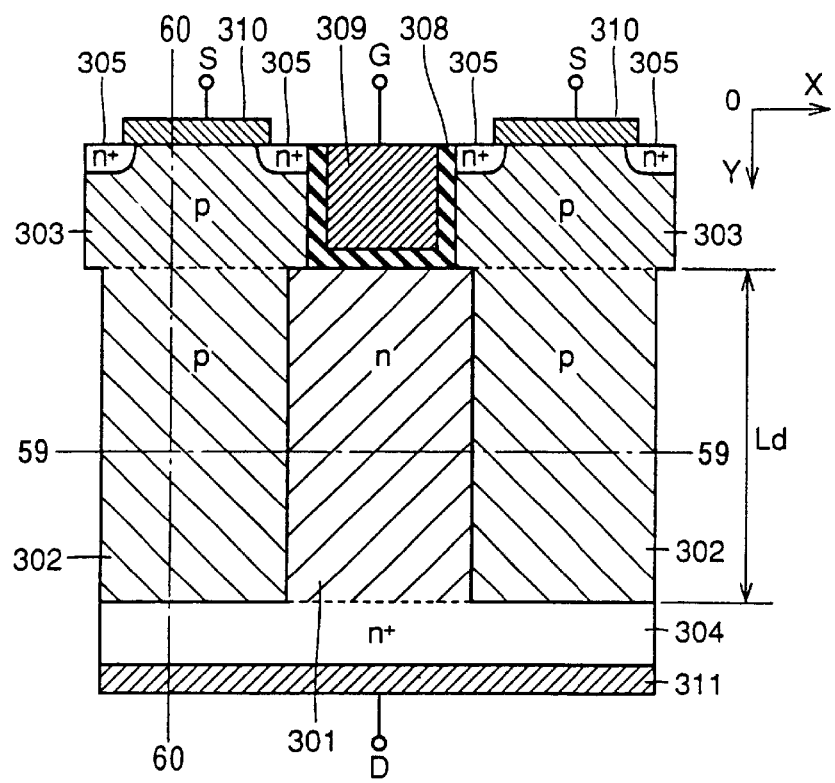
FIG. 58 is a schematic cross sectional view of a configuration of a conventional high breakdown voltage semiconductor device which is derived from the document.
Figure 59:
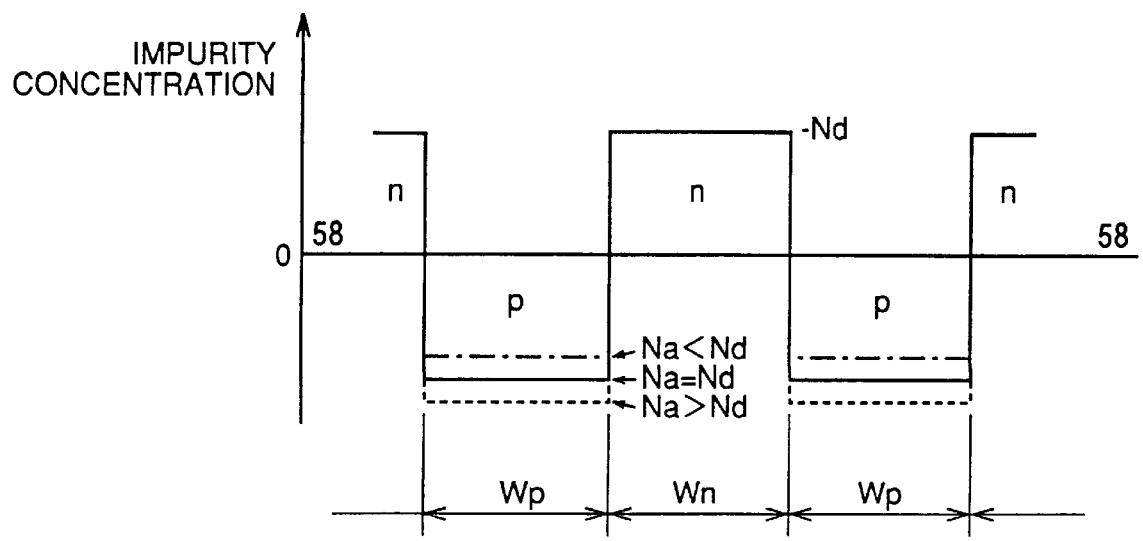
FIG. 59 shows a net impurity concentration distribution at 59—59 cross section of FIG. 58.
Figure 60:
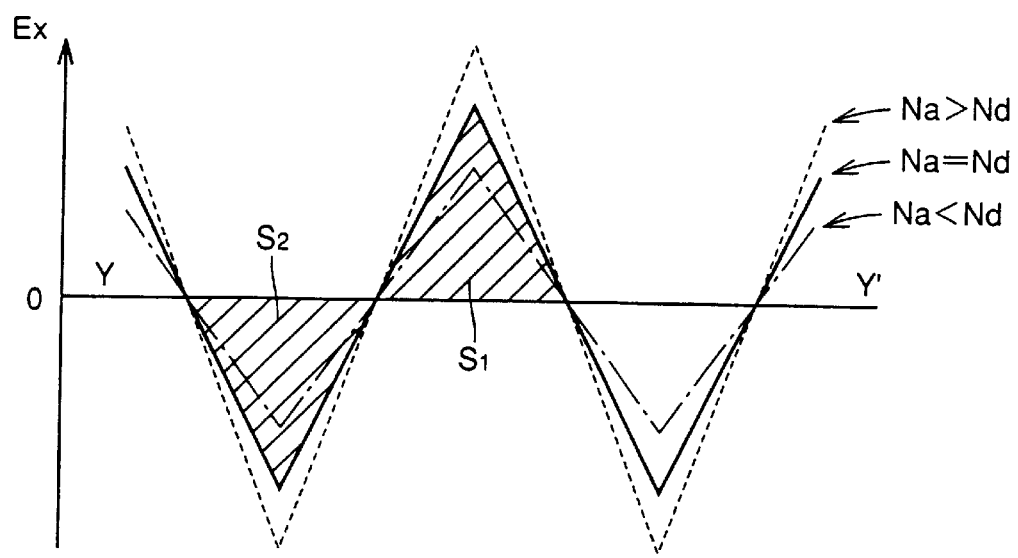
FIG. 60 shows an electric field strength distribution at 59—59 cross section shown in FIG. 58 in the X direction in an off state.
Figure 61:
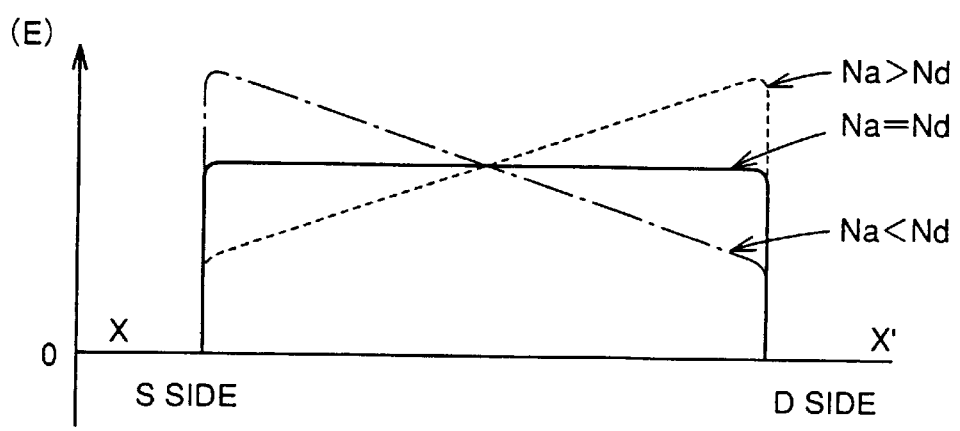
FIG. 61 shows an electric field strength distribution at 60—60 cross section shown in FIG. 58 in an off state.
Figure 62:
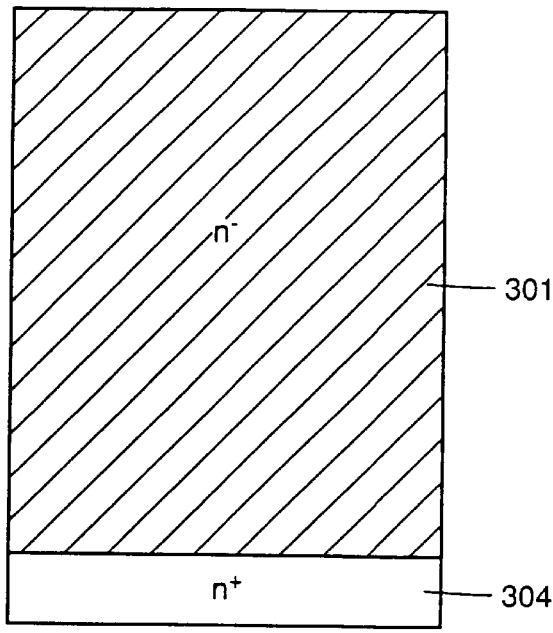
FIGS. 62–64 are schematic cross sectional views in the order of process step when a conventional high breakdown voltage semiconductor device is manufactured employing epitaxial growth method.
Figure 63:
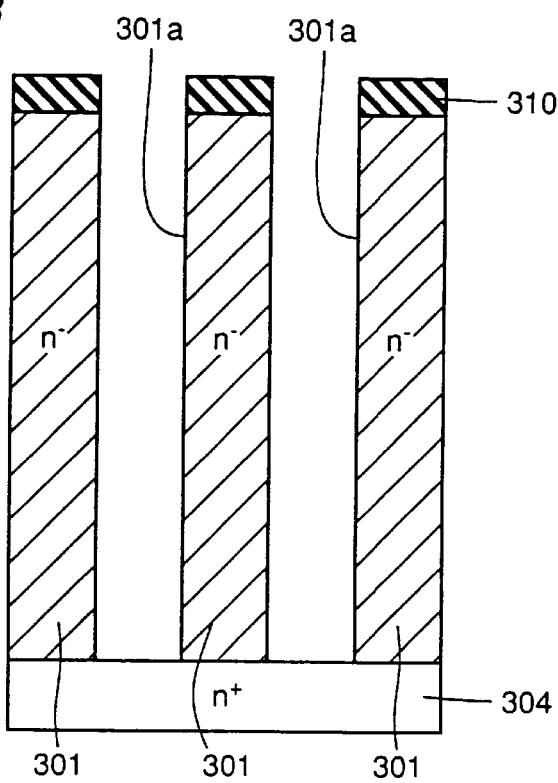
Figure 64:
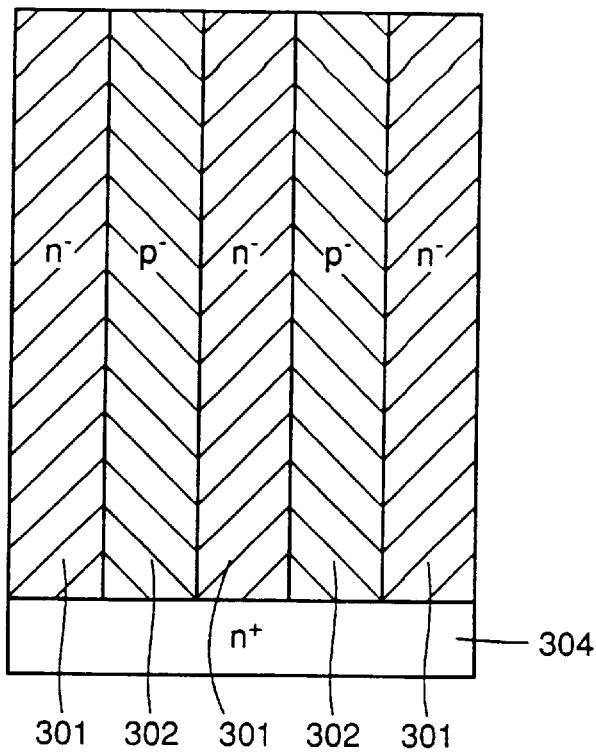
Figure 65:
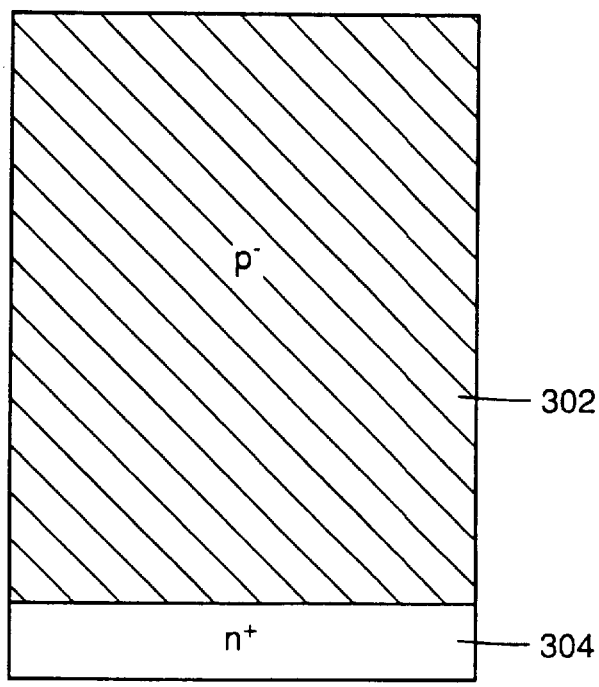
FIGS. 65 and 66 are schematic cross sectional views in the order of process step when a convention high breakdown voltage semiconductor device is manufactured by selective neutron radiation.
Figure 66:
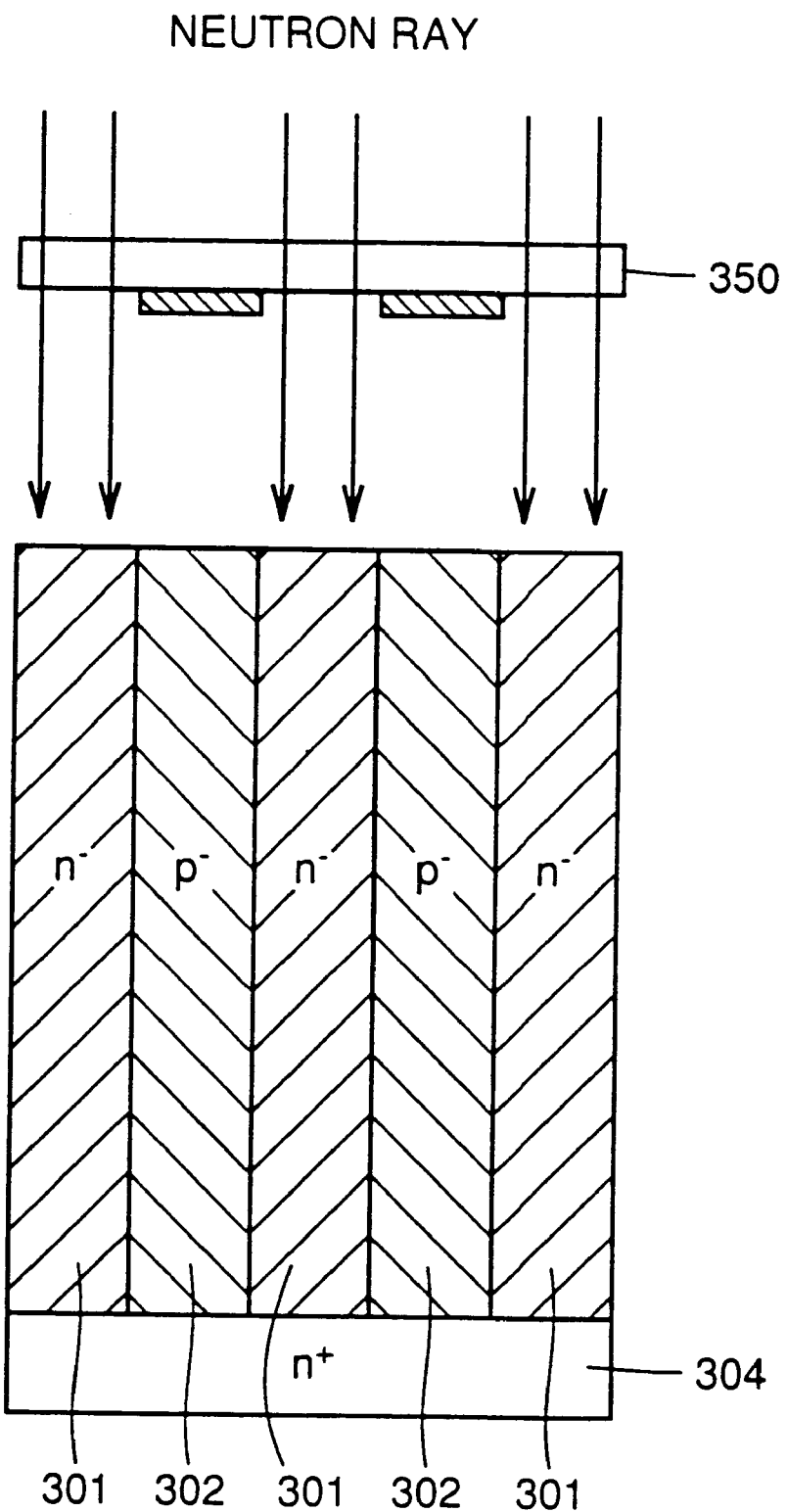

The structure of the high breakdown voltage semiconductor device described above differs, in particular, from an conventional example shown in FIG. 58 in that pn structure portion 1, 2 is sandwiched between trenches 7a and that an n type impurity is introduced from a sidewall surface of one trench 7a to form n type diffusion region 1 and a p type impurity is introduced from a sidewall surface of another trench 7a to form p type diffusion region 2. Due to such a structure, n type diffusion region 1 has an impurity concentration distribution diffused from the sidewall surface of one trench 7a and p type diffusion region 2 has an impurity concentration distribution diffused from the sidewall surface of another trench 7a.

In other words, an advantage of the structure is to allow an actual manufacturing which cannot be obtained with conventional structures. While the detail will be described later, the point is: for example, a wafer having an $n^-$ layer formed on drain $n^+$ region 4 by epitaxial growth is provided with p type well 3 by ion implantation, thermal diffusion and the like. Then trench 7a is formed by trench etching or the like and oblique ion implantation of a p type impurity is performed offset from a normal to the wafer by a tilt angle θ shown in FIG. 1:

$$\theta = \arctan(Wd/Ld) \tag{6}$$

Then the tilt angle is changed to −θ to obliquely ion-implant an n type impurity. Thus pn structure portion 1, 2 is formed at a region sandwiched between trenches 7a.

Figure 2:
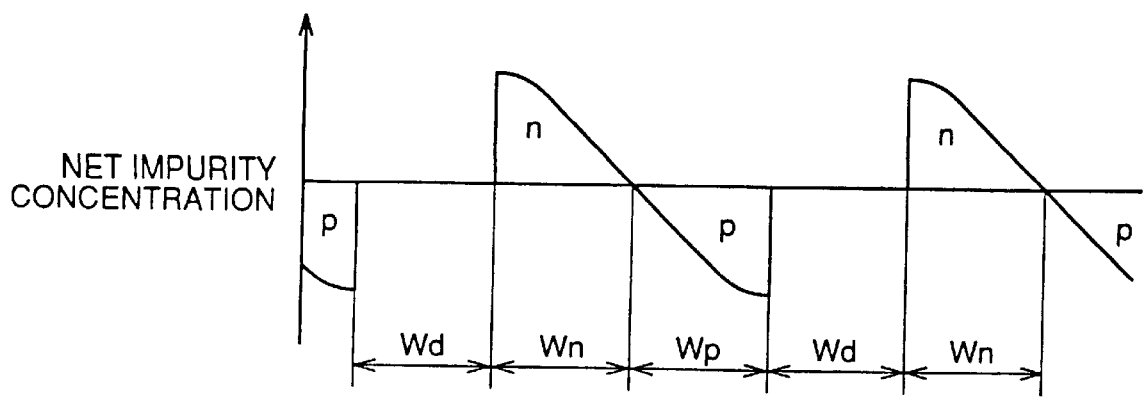
FIG. 2 shows a net impurity concentration distribution at 24—24 cross section shown in FIG. 1.
Figure 3:
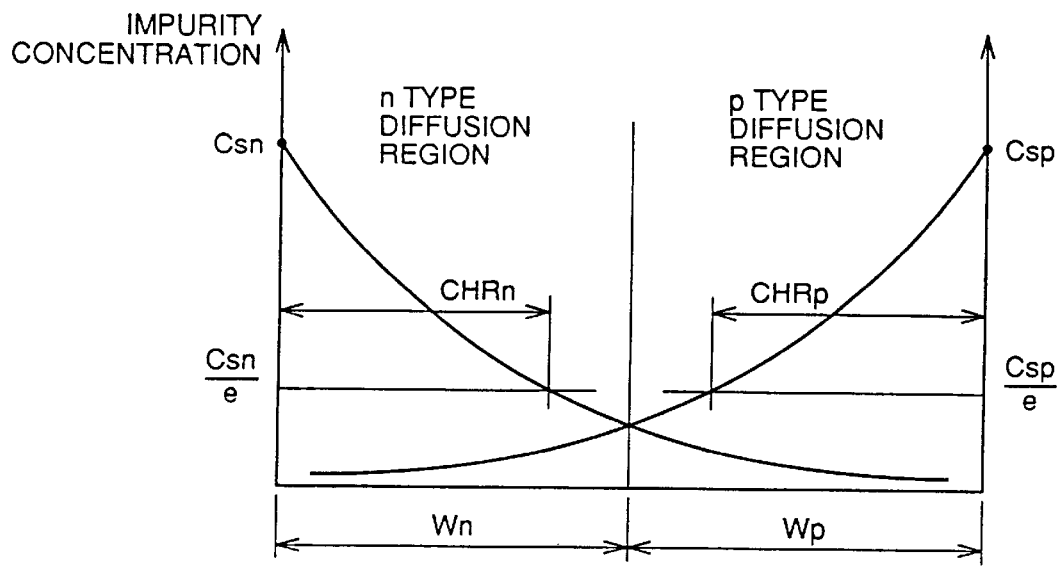
FIG. 3 is a graph for illustrating parameters of impurity distribution in the structure shown in FIG. 1.

A net impurity concentration of a cross section taken along line 24—24 in the structure of the high breakdown voltage semiconductor device is as shown in FIG. 2. Referring to FIG. 2, since an impurity is introduced from trench 7a, the impurity concentration is higher at a sidewall surface of trench 7a and lower toward the inside of the silicon. When thermal diffusion is performed, the impurity is distributed almost according to Gaussian distribution and exhibits a distribution such as that shown in FIG. 3. The shape of an impurity distribution is determined when surface impurity concentrations Csn and Csp and diffusion lengths CHRn and CHRp are defined as parameters. In this example, a junction formed by n- and p-type diffusion regions 1 and 2 is formed at a position at which impurity diffusions from the both sides are equal to each other.

When ions are obliquely implanted into a trench having high aspect ratio, the ions are reflected and/or scattered at a sidewall surface of the trench and thus the ions are also implanted into an undesired sidewall surface. However, practical net impurity distribution can be obtained by, for example, raising injection energy.

Furthermore, as is described later, the p-n-trench repeat structure is typically built in an $n^-$ semiconductor of low impurity concentration due to constraints of the end structure at the perimeter of the device. In this example, an n type impurity contained in the $n^-$ semiconductor is to be contained in n- and p-type diffusion regions 1 and 2 as a background impurity.

In filling trench 7a with various silicons, the amount of an impurity of filling layer 7 is desirably as sufficiently low as no more than 10% of the amounts of impurities of an n- and p-type diffusion regions 1 and 2 so that the charge density within trench 7a does not affect electric field distribution.

Figure 4:
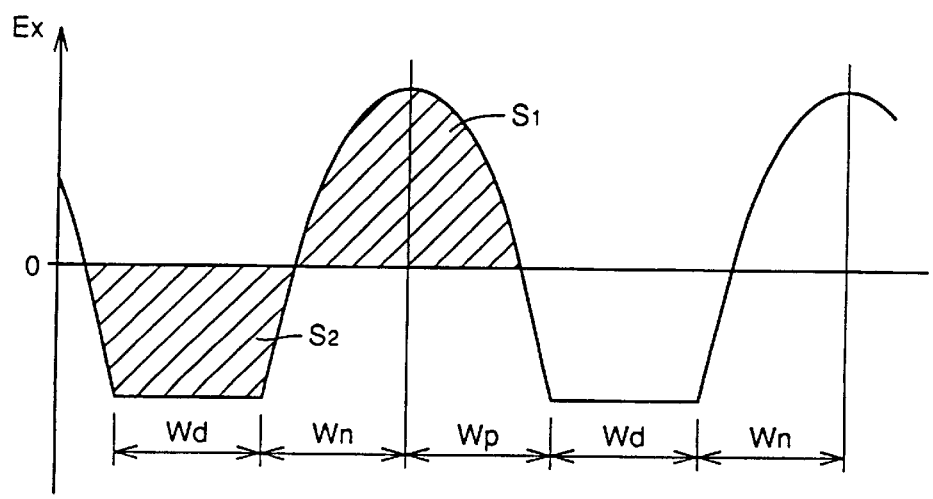
FIG. 4 illustrates an electric field strength distribution at 24—24 cross section shown in FIG. 1 in the X direction in an off state.

FIG. 4 shows an electric field distribution of a p-n-trench repeat structure in the X direction taken along line 24—24 when drain voltage is increased in the structure shown in FIG. 1 in an off state and the p-n-trench repeat structure is sufficiently depleted. Referring to FIG. 4, while the electric field in the X direction is increased in n type diffusion region 1 and decreased in p type diffusion region 2, the impurity concentration changes in the X direction according to Gaussian distribution and thus the electric field in the X direction is in the form of an error function integrating this. Furthermore, since an inside of trench 7a is constituted by an insulator such as silicon having low impurity concentration, silicon oxide or the like, the electric field density of the inside is sufficiently low and thus the electric field in the X direction inside trench 7a is constant.

In this example also, since potential need be returned to the same level in one period due to the repeat structure, an offset is determined such that an area $S_1$ (a hatched area) at the positive portion of the electric field in the X direction is equal to an area $S_2$ (a hatched area) at the negative portion. An analytic representation of the breakdown voltage characteristics obtained by this structure is complex and thus is not described any further.

Now a method of manufacturing a high breakdown voltage semiconductor device according to the present embodiment will be described.

Figure 5:
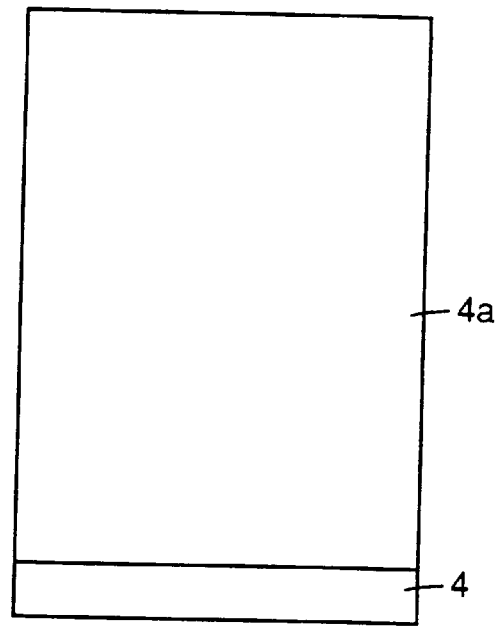
FIGS. 5–18 are schematic cross sectional views showing a method of manufacturing a high breakdown voltage semiconductor device according to the first embodiment of the present invention in the order of process step.

Referring to FIG. 5, formed on an n type high impurity concentration substrate 4 as a drain $n^+$ region is an n type epitaxial growth layer 4a having a sufficiently low impurity concentration as compared with a concentration distribution of the impurity diffusion process described later. Practically, an impurity concentration of n type epitaxial growth layer 4a need only be in a range of $1 \times 10^{13}$ $cm^{-3}$ to $1 \times 10^{16}$ $cm^{-3}$. If a desired breakdown voltage of a device is approximately 300V, the thickness of n type epitaxial growth layer 4a need only be approximately 20 $\mu$m. Furthermore, instead of forming n type epitaxial growth layer 4a, it is possible to directly join a substrate having approximately the same impurity concentration and polish it to a desired thickness.

Figure 6:
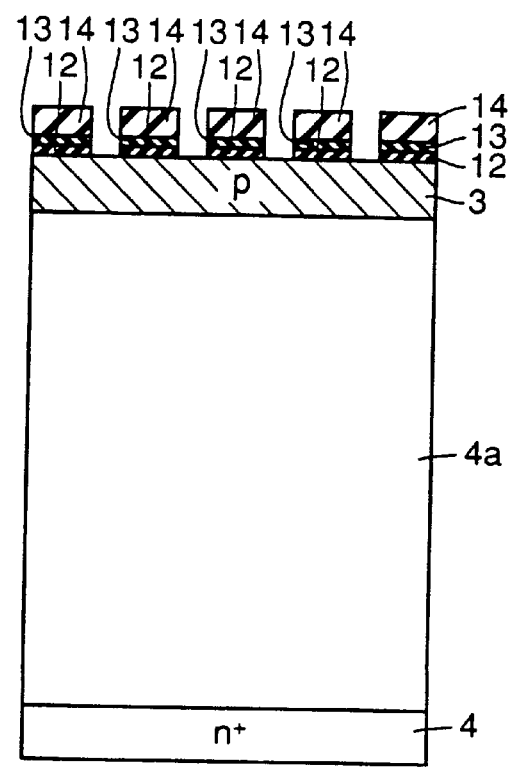

Referring to FIG. 6, a p type diffusion region 3 as a p type base region of an MOSFET is formed on a surface of n type epitaxial growth layer 4a employing an existing impurity diffusion method. Formed on p type diffusion region 3 is a three-layer stack structure constituted by a thermal oxide film 12, a CVD (Chemical Vapor Deposition) silicon nitride film 13 and a CVD silicon oxide film 14 such that the structure is in a desired shape. Stack structure 12, 13, 14 is used as a mask and the underlying layer is anisotropically etched.

Figure 7:
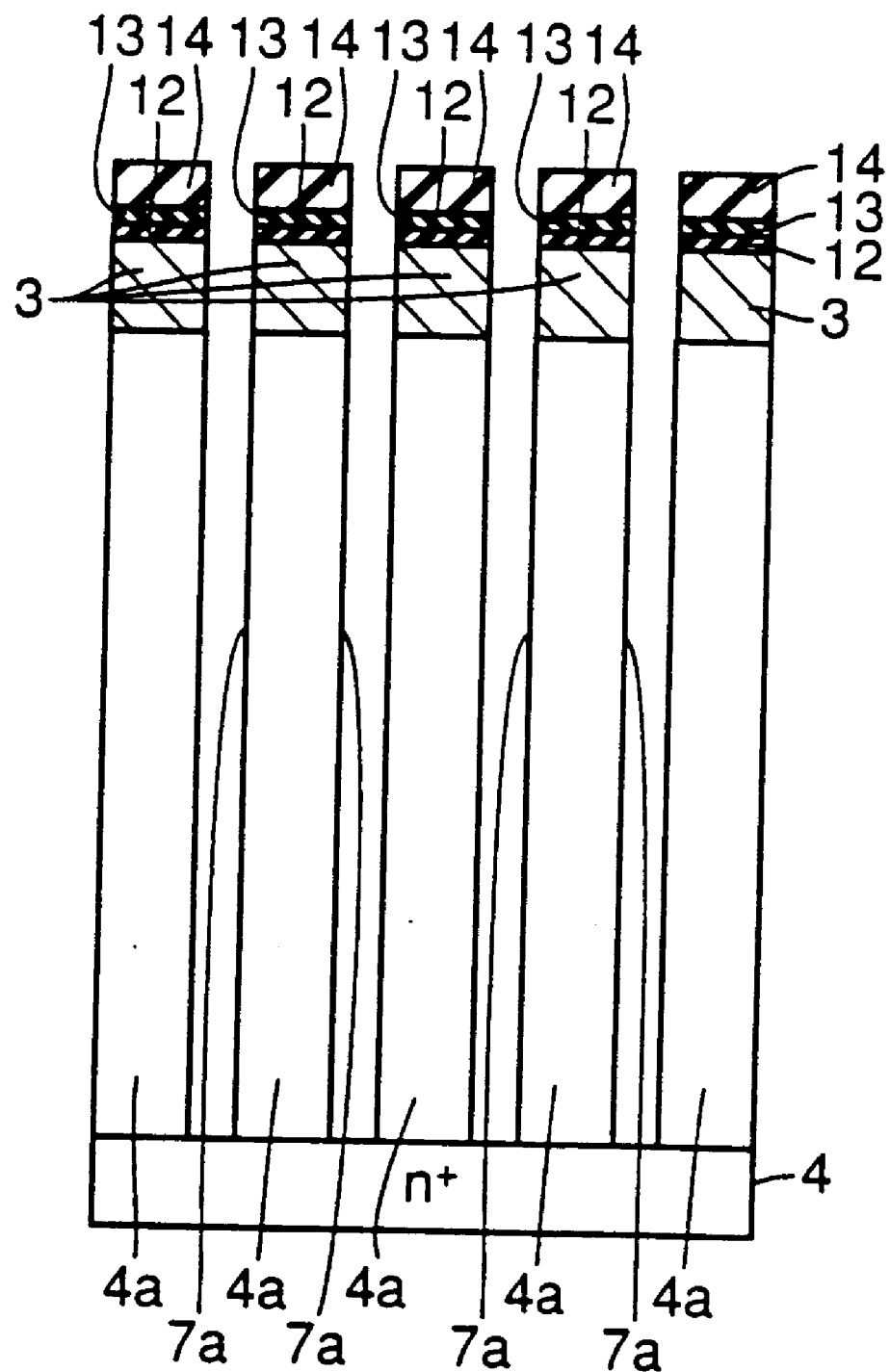

Referring to FIG. 7, the etching penetrates p type base region 3 and n type epitaxial growth layer 4a to form a trench 7a which reaches $n^+$ high impurity concentration substrate region 4.

In the anisotropic silicon etching process, a protection film against etching is required at a mesa portion. Thus a silicon etching resistant film such as CVD silicon oxide film 14 is preformed and then typical photolithography and etching processes are used for patterning. As described above, trench 7a needs highly precise width and aspect ratio and thus dry etching is performed using a gas of fluorine group such as $NF_3$, $SF_6$, $SiF_4$.

During the above dry etching, a thin film commonly referred to as a deposition film the composition of which is close to that of silicon oxide film is formed at a sidewall of trench 7a. Thus, the deposition film is removed by an agent of hydrogen fluoride (HF) group immediately after the anisotropic silicon etching.

Furthermore, instead of the dry etching process, it is possible to perform wet-etching by using an alkaline solution of KOH, hydrazine or the like which exhibits a strong anisotropy depending on the orientation of a silicon crystal. These alkaline etchants themselves contain more component which readily becomes mobile ions of an atom, such as K, generally constituting impurities and etchants themselves than acidic etchants. Accordingly, although a careful washing process is required as a post-etching process, this process is practically difficult to perform and thus the dry etching mentioned above is more efficient.

However, dry etching devices are very expensive, have slow etching rate and do not have batch process capability to process a plurality of wafers at one time, and thus have poor mass-productivity. Thus, the wet etching can be selected taking into consideration cost versus production efficiency.

In order to form p type diffusion region 3 at a portion which serves as a projection of a semiconductor sandwiched between trenches 7a, as shown in FIG. 7, the step of:

(1) performing ion implantation prior to forming trench 7a, (2) performing epitaxial growth prior to forming trench 7a, (3) performing vapor diffusion prior to forming trench 7a or the like can be used. Then an appropriate heat treatment is performed to obtain a desired depth of the p type base.

The depth of p type base region 3 or epitaxial growth region 4a is set to be shallower than a required finished depth, taking into consideration the total amount of process time period until the final step. Generally the time period of heat treatment required for the step of diffusing an impurity from a sidewall of trench 7a described later is, however, relatively shorter than a heat treatment step required for formation of p type base region 3. Thus, p type base region 3 is formed prior to the trench 7a formation step. If the time period of heat treatment required for the step of diffusion from the sidewall surface of trench 7a is sufficient for formation of p type base region 3, however, p type base region 3 may be formed immediately after formation of trench 7a.

Figure 8:
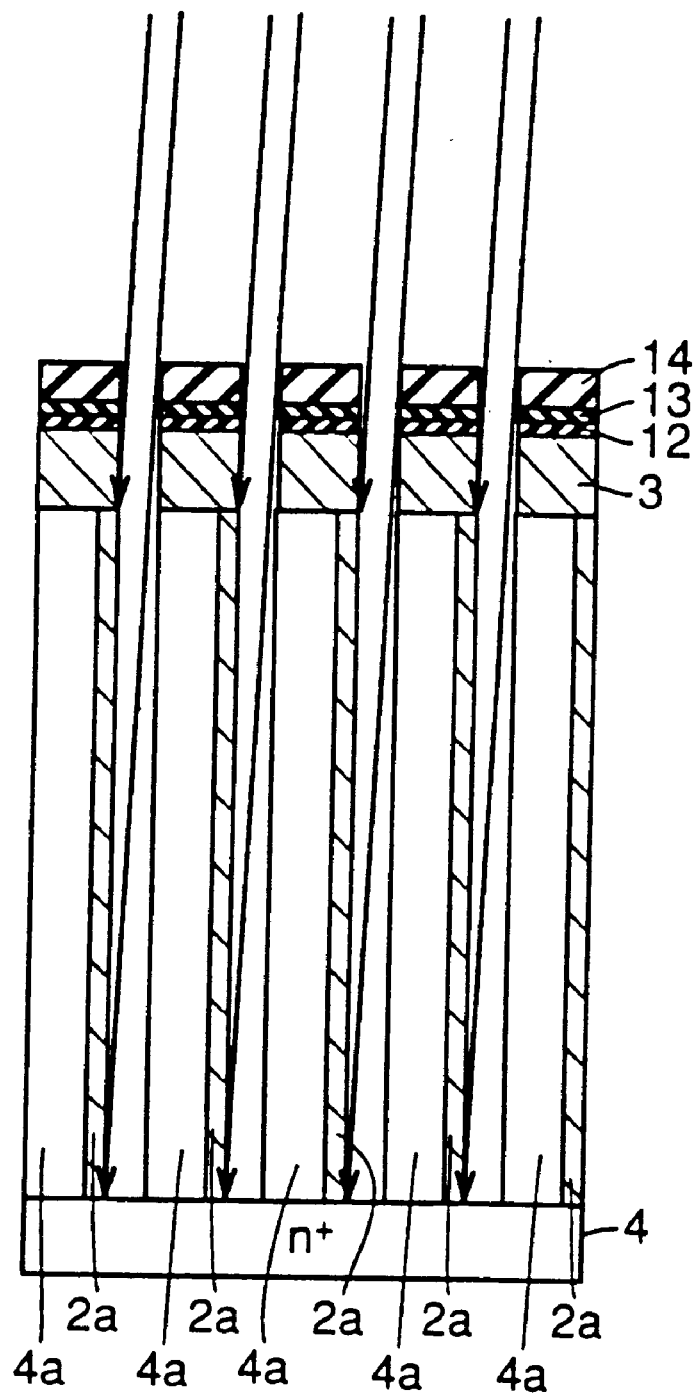

Referring to FIG. 8, oblique ion implantation is used to implant boron (B) into one sidewall surface of trench 7a and thus forms a boron implantation region 2a.

Figure 9:
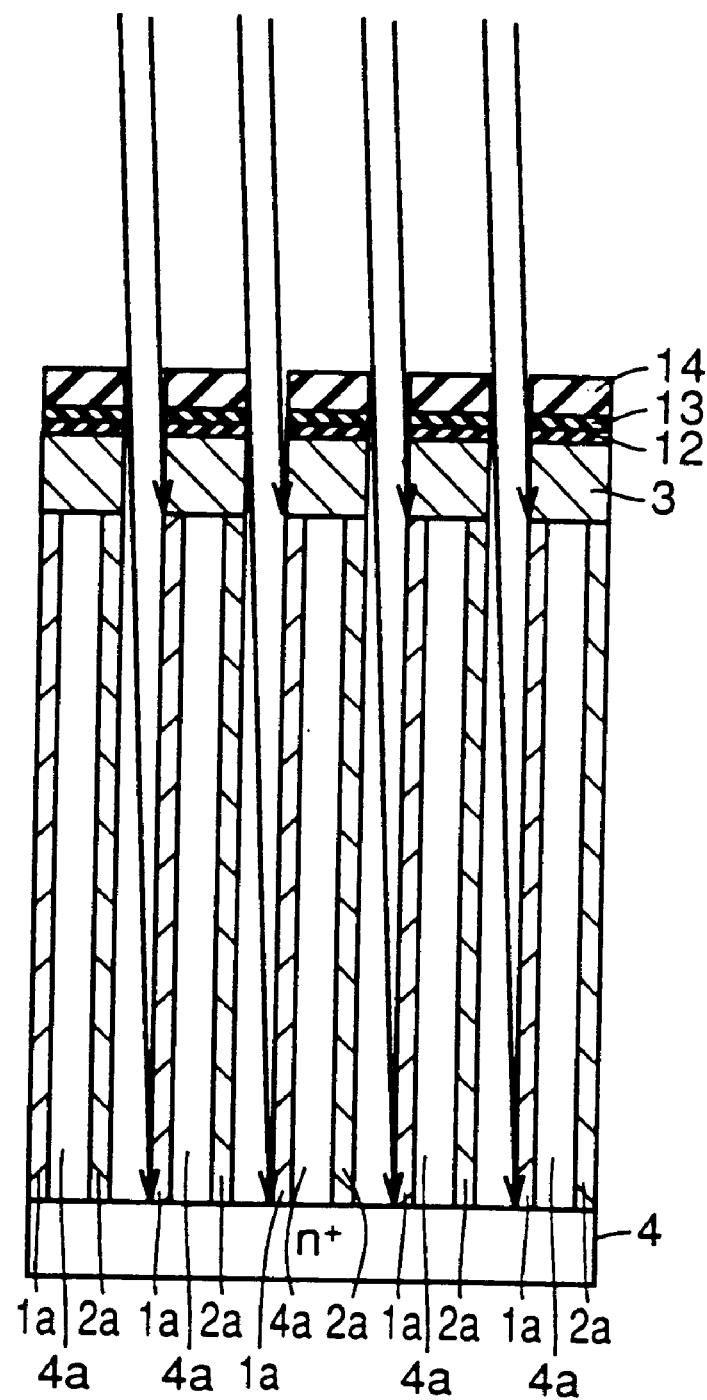

Referring to FIG. 9, oblique ion implantation is performed with its gradient opposite to that of the above boron implantation to implant phosphorus (P) into the other sidewall surface of trench 7a and thus forms a phosphorus implantation region 1a.

While the method of introducing an impurity from a sidewall surface of trench 7a includes oblique ion implantation method, gas diffusion method employing $B_2H_6$ gas, $PH_3$ gas or the like and a method employing a solid source of boron nitride or the like, which is also one type of gas diffusion, can be used. Furthermore, a liquid glass of a diffusion species referred to as SOG (Spin on Glass) in high concentration can be cast into trench 7a and the diffusion species can be diffused by heat treatment. For these methods, however, selective diffusion into only one side surface of trench 7a cannot be achieved and furthermore the controllability of impurity concentration distribution of a diffusion species thus obtained is as poor as at least 10% and thus these methods are inappropriate for highly precise impurity diffusion and fixation required for the structure according to the present invention.

Thus, ion implantation method is used as described above. Generally, for the ion implantation method, the controllability of concentration of atoms implanted is as highly precise as no less than 0.1% and the final finished concentration and diffusion profile taking into consideration variation of the other process steps can be controlled in an extremely highly precision of no more than 3%.

Furthermore, the aspect ratio, the dimension ratio of the depth to the opening, of trench 7a is as extremely large as approximately 20:1. Accordingly, an impurity need be introduced into a sidewall surface of trench 7a by ion implantation tilted with relative to a normal to a wafer surface by an angle of approximately $\tan^{-1}(1/20) \approx 2.9°$. In implanting ions only into a desired side surface of a trench, good controllability of the angle between a wafer and an ion ray injected is the most important in this step. Thus, p- and n-type impurities are separately implanted into the both side surfaces of a trench.

Figure 10:
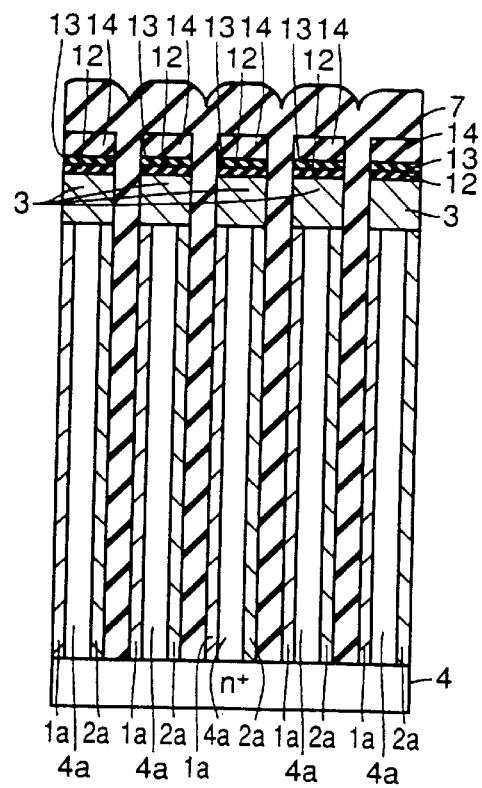

Referring to FIG. 10, the both regions 1a and 2a are simultaneously heat-treated so that profiles of p- and n-type impurities introduced by the ion implantation approach finally required diffusion profiles.

In the heat treatment, trench 7a is filled with a CVD silicon oxide film as an insulating film as soon as possible after the ion implantation to prevent the ion-implanted atoms from outwardly diffusing from the sidewall surfaces of trench 7a to the atmosphere. Furthermore, since trench 7a is filled as soon as possible, dust in the atmosphere during the manufacturing process can be prevented from entering the inside of trench 7a.

In order to fill trench 7a with silicon as a semi-insulating film, heat treatment is first performed with a thin thermal oxide film disposed instead of the aforementioned CVD silicon oxide film. Then a method such as dry etching is employed to remove the oxide film at least at the bottom surface of trench 7a with and then CVD method or the like is employed to fill trench 7a with the aforementioned silicon of various forms.

Figure 11:
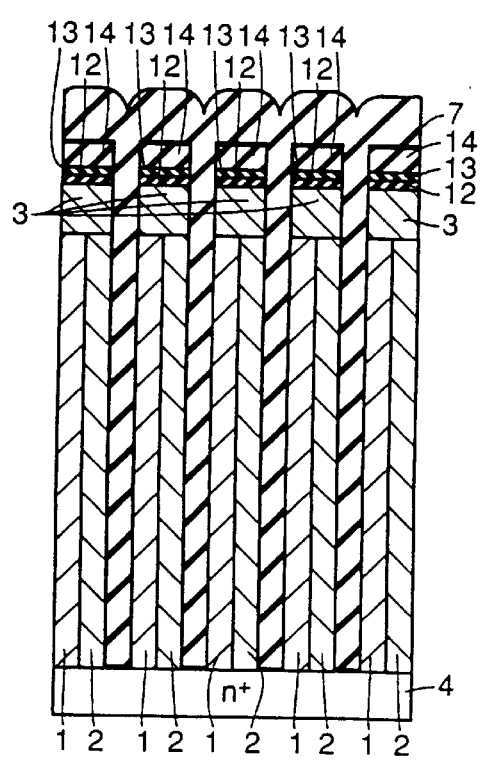

Referring to FIG. 11, p- and n-type impurities introduced through the ion implantation are diffused by heat treatment. Thus, n type diffusion region 1 and p type diffusion region 2 are formed at a region sandwiched by trenches 7a. A film retreat step by entire surface etching, i.e., etch-back is performed on an insulating film 7.

Figure 12:
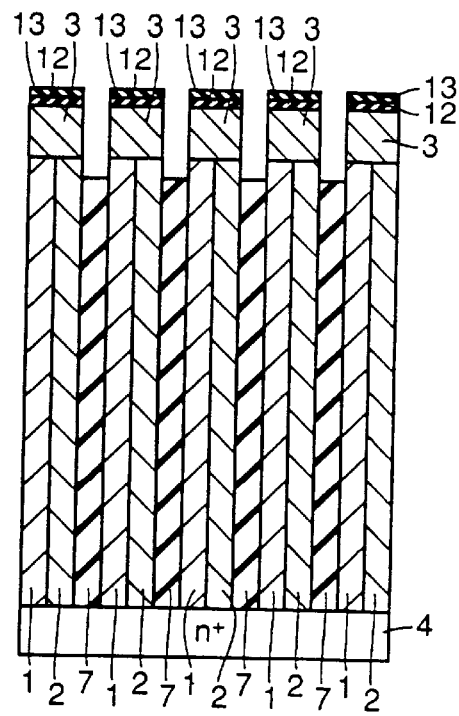

Referring to FIG. 12, this allows a side surface of p type base region 3 to be exposed at a sidewall surface of trench 7a. It is noted that when insulating film 7 is removed, the top CVD silicon oxide film 14 layer of the three-layer stack structure is also removed.

Although the insulating film 7 etching back step may be either dry etching or wet etching, dry etching is generally preferred for precise processing.

Figure 13:
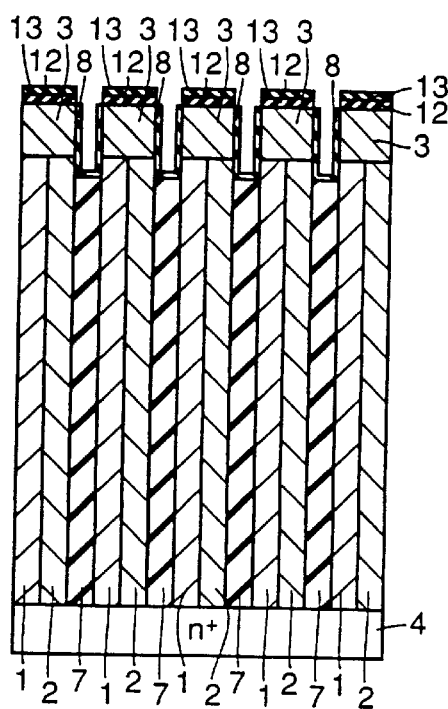

Referring to FIG. 13, then thermal oxidation method or the like is employed to form a gate insulating layer 8 of a silicon oxide film on the silicon portion exposed at the sidewall surface of trench 7a.

Figure 14:
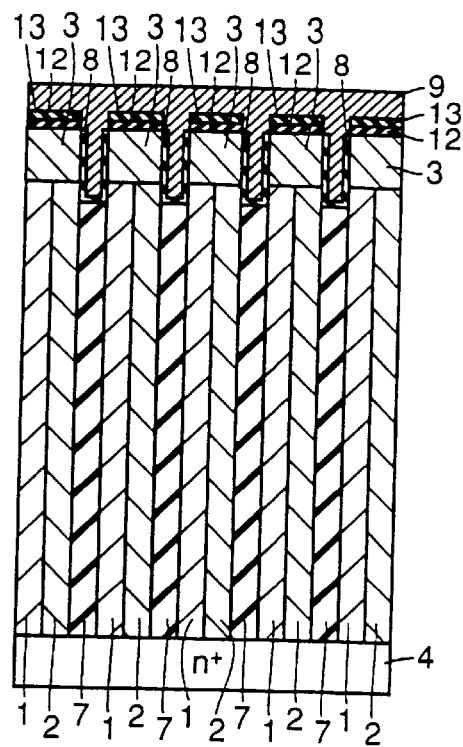

Referring to FIG. 14, an impurity-introduced polycrystalline silicon film (a doped polysilicon film) 9 is formed by CVD method such that it fills an upper portion of trench 7a and also covers CVD silicon nitride film 13. Doped polysilicon film 9 is etched back.

Figure 15:
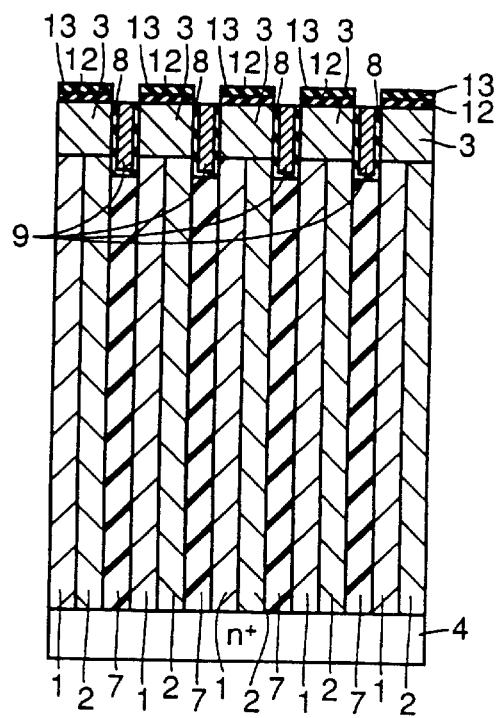

Referring to FIG. 15, thus a gate electrode layer 9 is formed opposite to a side surface of p type base region 3 with gate insulating layer 8 disposed therebetween. Then CVD silicon nitride film 13 and thermal oxide film 12 are successively removed.

Figure 16:
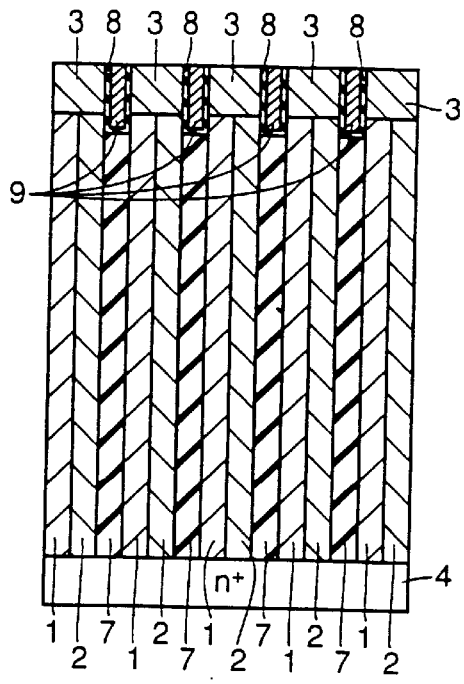

Referring to FIG. 16, thus an upper surface of p type base region 3 is exposed.

Figure 17:
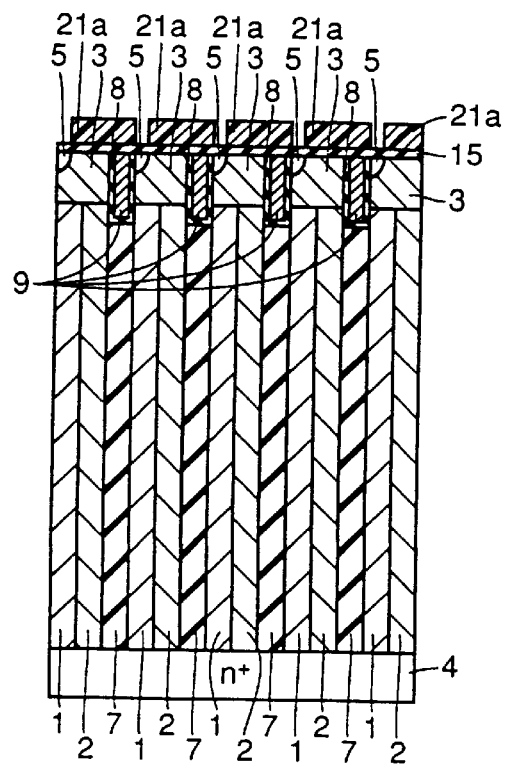

Referring to FIG. 17, a cap oxide film 15 is formed by thermal oxidation method on the exposed p type base region 3 and the filled trench 7a. A resist pattern 21a having a desired shape is formed by a typical photolithography technique on cap oxide film 15. Resist pattern 21a is used as a mask and ion implantation is performed to form a source $n^+$ diffusion region 5 in p type base region 3. After resist pattern 21a is removed, typical photolithography and etching techniques are used to selectively remove only cap oxide film 15 on p type base region 3.

Figure 18:
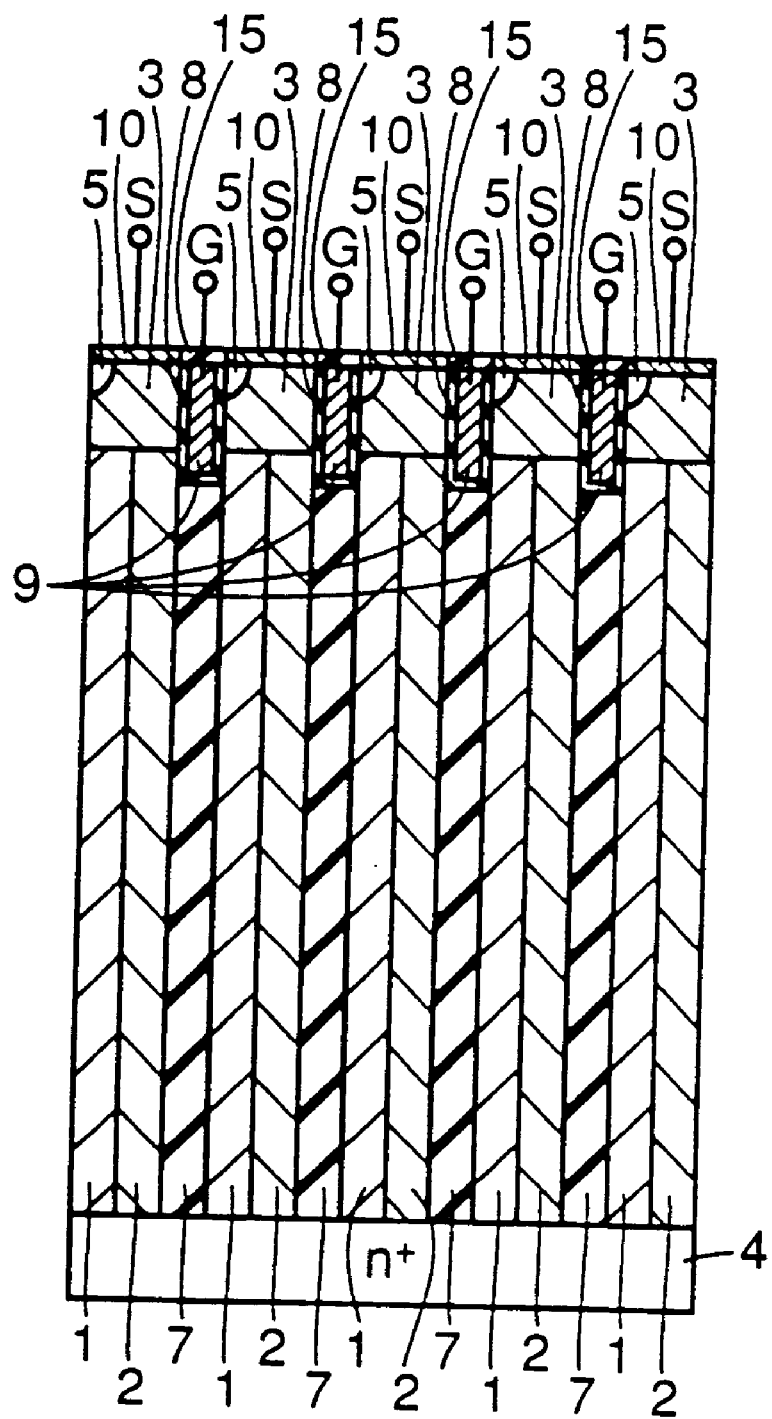

Referring to FIG. 18, a source electrode layer 10 is formed in contact with the surface of p type base region 3 thus exposed.

It should be noted that while the present manufacturing method has been described with respect to an example without $p^+$ diffusion region 6 shown in FIG. 1, $p^+$ diffusion region 6 may be formed at the first main surface within trench 7a sandwiched by gate electrode layer 8 and p type base region 3, if necessary, by forming gate electrode layer 9 closer to that sidewall surface of trench 7a on which n type diffusion region 1 is formed.

Now assuming that an MOSFET in the order of 300V is used, a result of a numerical simulation with respect to the structure of the conventional example shown in FIG. 58 and the structure according to the present embodiment shown in FIG. 1 will now be described.

Figure 19:
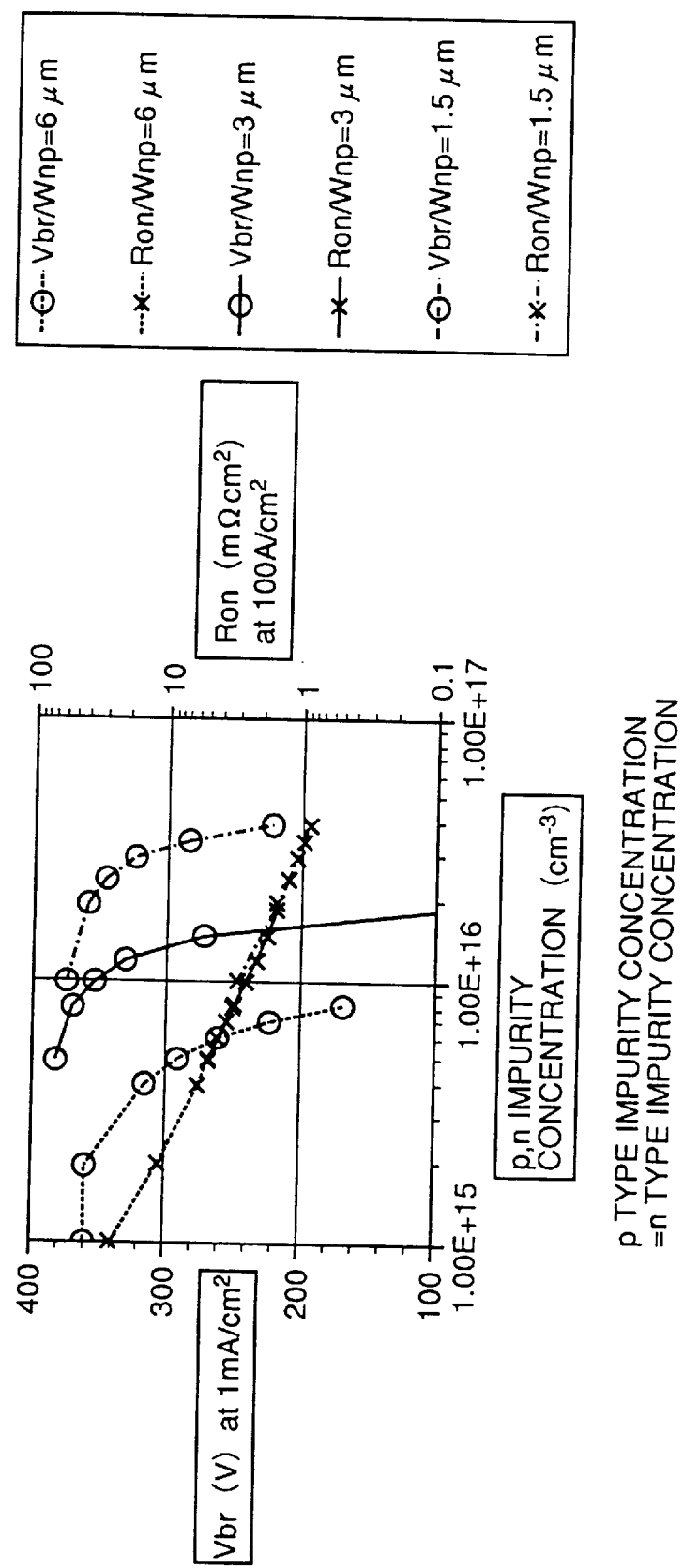
FIG. 19 shows a result of simulation of a breakdown voltage and an on-state resistance of the structure shown in FIG. 58.
Figure 20:
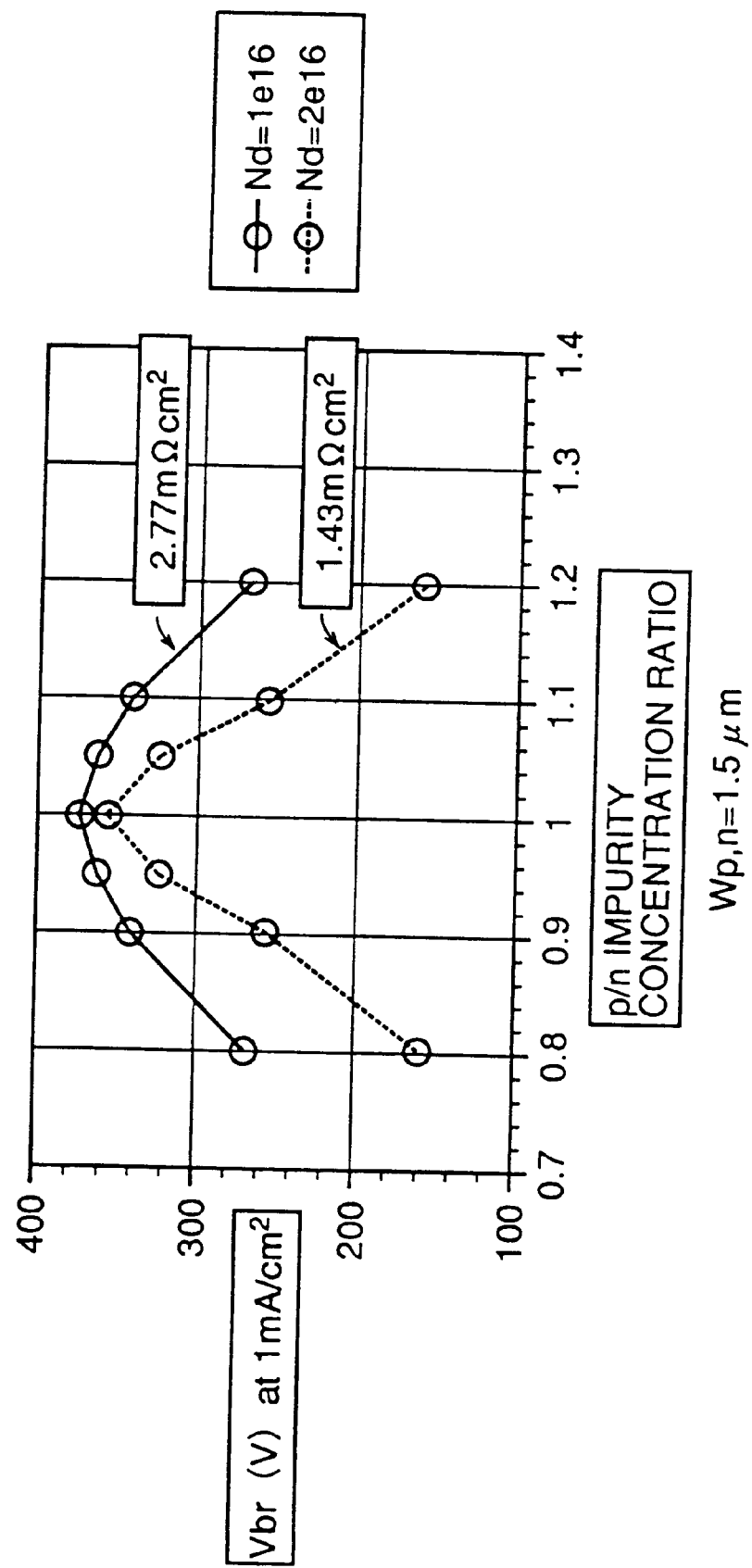
FIG. 20 shows a result of simulation of an impurity ratio dependence of a breakdown voltage in the structure shown in FIG. 58.

FIGS. 19 and 20 show graphs representing a result of numerical simulation with respect to an MOSFET having the structure of the conventional example shown in FIG. 58. Since it is assumed that a device in the order of 300V is used, a dimension Ld shown in FIG. 58 is 20 μm.

FIG. 19 represents a breakdown voltage and an on-state resistance when Wn(=Wp) is 6 μm, 3 μm and 1.5 μm and an impurity concentration of n- and p-type regions 301 and 302 in each case is changed. Furthermore, the maximum value of an impurity concentration Nd of n type region 301 for each Wn value according to the aforementioned expression (4) and the Ron calculated according to expression (1) are as shown in Table 1.

TABLE 1

| Wn(=Wp)(μm) | Ndmax(cm⁻³) | Ron(mΩcm²) |
|---|---|---|
| 1.5 | 1.74e16 | 1.1 |
| 3.0 | 8.70e15 | 2.2 |
| 6.0 | 4.35e15 | 4.4 |

As the result is compared with the simulation result shown in FIG. 19, the impurity concentration at which breakdown voltage Vbr starts to decrease matches the theoretical value well for a small Wn. It can be seen, however, that for a large Wn, the breakdown voltage of the simulation decreases at lower impurity concentration. This is because when Wn increases and thus approaches Ld, electric field is concentrated at an end portion of the pn repeat structure portion (more specifically, a portion closer to p type well 303 and a portion closer to drain n⁺ region 304) and a critical electric field is readily reached.

Furthermore, the on-state resistance of the simulation is larger by approximately 10%–40%, since the junction of the pn repeat structure portion is reverse-biased biased corresponding to built-in voltage and to internal voltage drop in the Y direction even in an on-state, a space-charge region slightly extends laterally and thus an area through which current can flow within n type region 301 is reduced.

The amount of the reduction can be estimated for a built-in voltage of 0.7V as:

$$dn = 0.21/\sqrt{(Nd/1e16)}(\mu m) \quad (7)$$

and Wn is reduced by dn at the both sides.

When Nd=1e16 and Wn=1.5 μm, the effective width of n type region 301 is 1.08 μm and it is seen that the on-state resistance is 39% higher than the value calculated according to expression (1). This trend is more significant in a design with smaller Wn and Wp and larger Nd and Na, as can be seen from expression (7).

Furthermore, it has been found according to a result obtained by the simulation that when a silicon oxide film is sandwiched between n type region 301 and p type region 302 of the pn repeat structure portion, a space-charge region in an on-state less expands and thus on-state resistance is slightly improved.

FIG. 20 shows a result of numerical simulation of how breakdown voltage changes when impurity concentration ratio of n type region 301 to p type region 302 is fluctuated. As compared with the ideal example when Nd=Na, breakdown voltage is decreased when Na is either too large or too small. As Nd is increased and on-state resistance is decreased, the degree of reduction of breakdown voltage is increased. For a device in the order of 300V, the desired breakdown voltage is approximately no less than 340V, in which case it is seen that an impurity concentration difference of approximately +11% can be tolerated when an on-state resistance of 2.8 mΩcm² is desired, whereas only approximately ±4% can be tolerated when an on-state resistance of 1.4 mΩcm² is desired.

It should be noted that the device of this structure is a unipolar device in which in an on-state only electrons enjoy conduction and thus the transient phenomenon of mere turning on and/or off of an MOS channel can result in fast switching, as with typical power MOSFETs.

Figure 21:
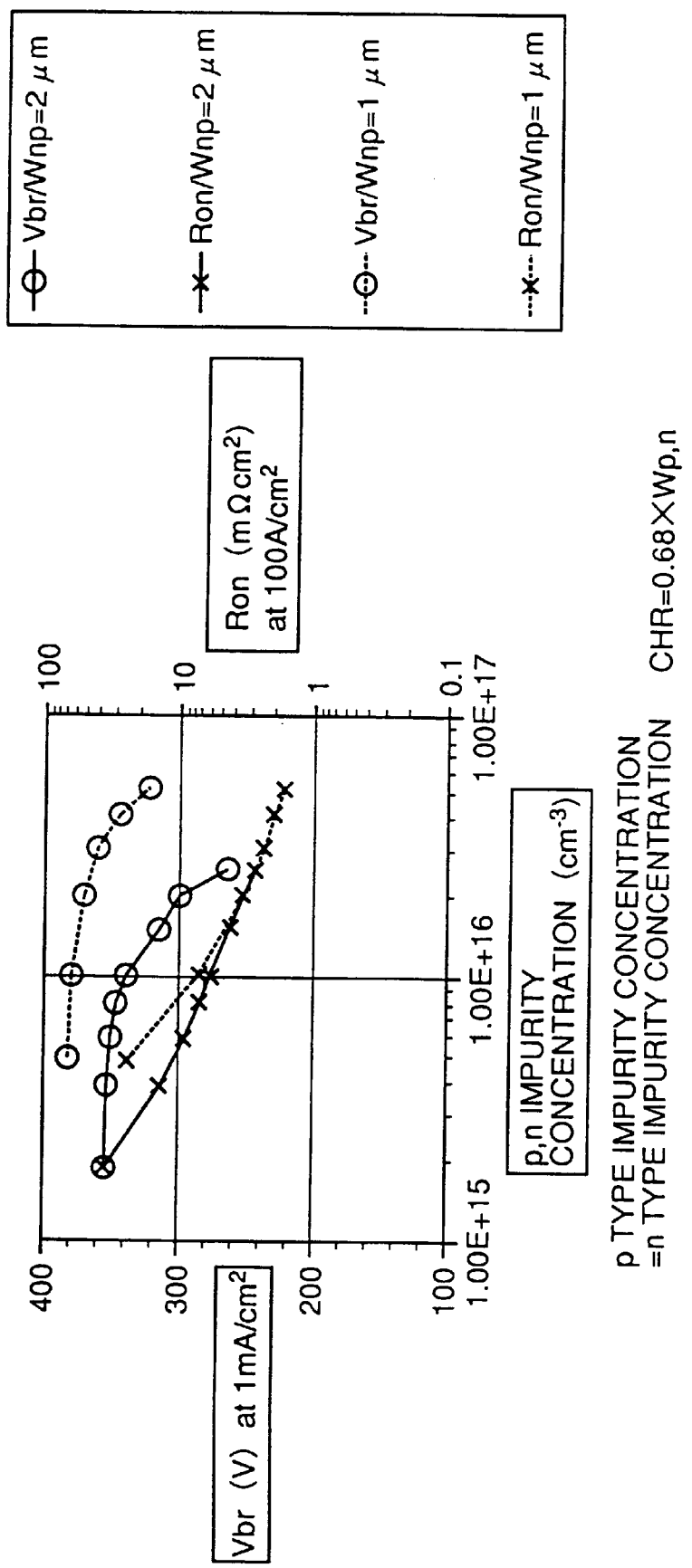
FIG. 21 shows a result of simulation of a breakdown voltage and an on-state resistance of the structure shown in FIG. 1.
Figure 22:
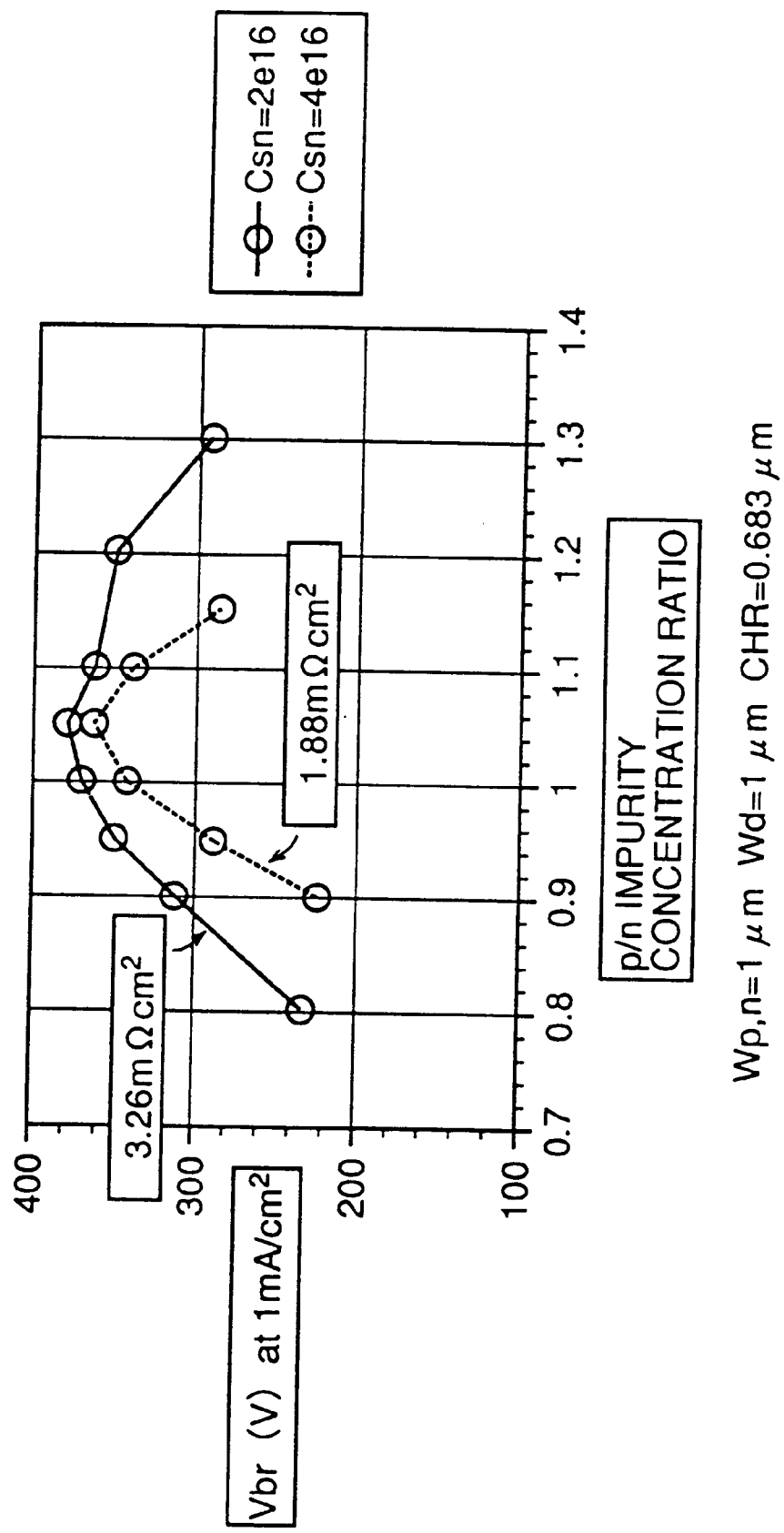
FIG. 22 shows a result of simulation of an impurity ratio dependence of a breakdown voltage of the structure shown in FIG. 1.

FIGS. 21 and 22 show a result of a numerical simulation with respect to the structure according to the present embodiment shown in FIG. 1. FIG. 21 shows how breakdown voltage and on-state resistance change as surface impurity concentration Csn(=Csp) is changed, wherein Wn(=Wp=Wd) is 1 μm and 2 μm and diffusion length CHRn is a Wn multiplied by 0.68. Referring to FIG. 21, in this example also, a trend is shown that as the impurity concentration is increased, on-state resistance Ron relatively linearly decreases, and breakdown voltage Vbr slightly rapidly decreases at an impurity concentration of a certain value or more. It is also seen that for this structure, on-state resistance is approximately 1.9 mΩcm² when a breakdown voltage of 340V is desired for Wn=1 μm.

Since Wn=Wp=Wd in this example, a space between trenches 7a is 6 μm for Wn=2 μm. When the space between trenches 7a is further increased, the breakdown voltage cannot be maintained and thus a practical limitation of the space between trenches 7a is believed to be no more than one third of the depth of trench 7a.

FIG. 22 shows the change of breakdown voltage when the Csp/Csn ratio in the structure according to the present embodiment shown in FIG. 1 is changed. Referring to FIG. 22, it is found that breakdown voltage reaches the maximum value at Csp/Csn=1.05. It is assumed in this simulation that as mentioned before, a p-n-trench repeat structure is built in within n⁻ silicon of low impurity concentration. Thus, n type diffusion region 1 and p type diffusion region 2 contain an n type impurity of 1.6e14 cm⁻³ as background, and the silicon in trench 7a contains the n type impurity of 5.0e13 cm⁻³. Accordingly, Csp is required to be slightly larger than Csn.

Furthermore in the structure of FIG. 1, the tolerable range of the Csp/Csn ratio at which a breakdown voltage of 340V is expected for an on-state resistance of 1.9 mΩcm² is approximately ±5%, which is found to be not at all inferior to the result with respect to the structure of the conventional example shown in FIG. 58.

Furthermore in the manufacturing method according to the present embodiment, oblique ion implantation method can be used to implant impurities into sidewall surfaces of trench 7a, as shown in FIGS. 8 and 9, so that n type diffusion region 1 and p type diffusion region 2 are formed. Since impurities are introduced by the ion implantation technique, precision of control of the amount of impurity can be as extremely high as ±1% as compared with epitaxial growth method. Furthermore, since the sidewall surfaces are masked by an oxide film or the like, extraordinal impurity diffusion in the X direction is not caused. This allows easy formation of a fine junction structure of no more than 1 μm and thus pn structure 1, 2 with precise pn impurity ratio can be formed in fine dimension.

Thus, according to the present embodiment, a fine pn structure 1, 2 of one micron-order can be obtained with sufficient precision and thus a high breakdown voltage semiconductor device can be obtained which has both superior on-state voltage and breakdown voltage and fast switching characteristics.

Furthermore, high precision of pn impurity ratio is only required at pn structures positioned relatively closer each other such that they are, for example, adjacent to each other at a same Y position and a variation of the precision between distant pn structures would not affect breakdown voltage, and thus macro variation within a wafer surface is not so problematic.

Furthermore, impurity concentration variation between portions at different Y positions would not affect breakdown voltage. Thus, more or less tapered angles caused by trench etching at a sidewall surface of trench 7a would not so problematic even if impurity concentration more or less changes in the direction of the depth, as long as the shape is bilaterally symmetrical.

Furthermore with this structure, trench 7a may be dug only once and thus the process can be simplified and the cost can be relatively reduced.

Second Embodiment

Figure 23:
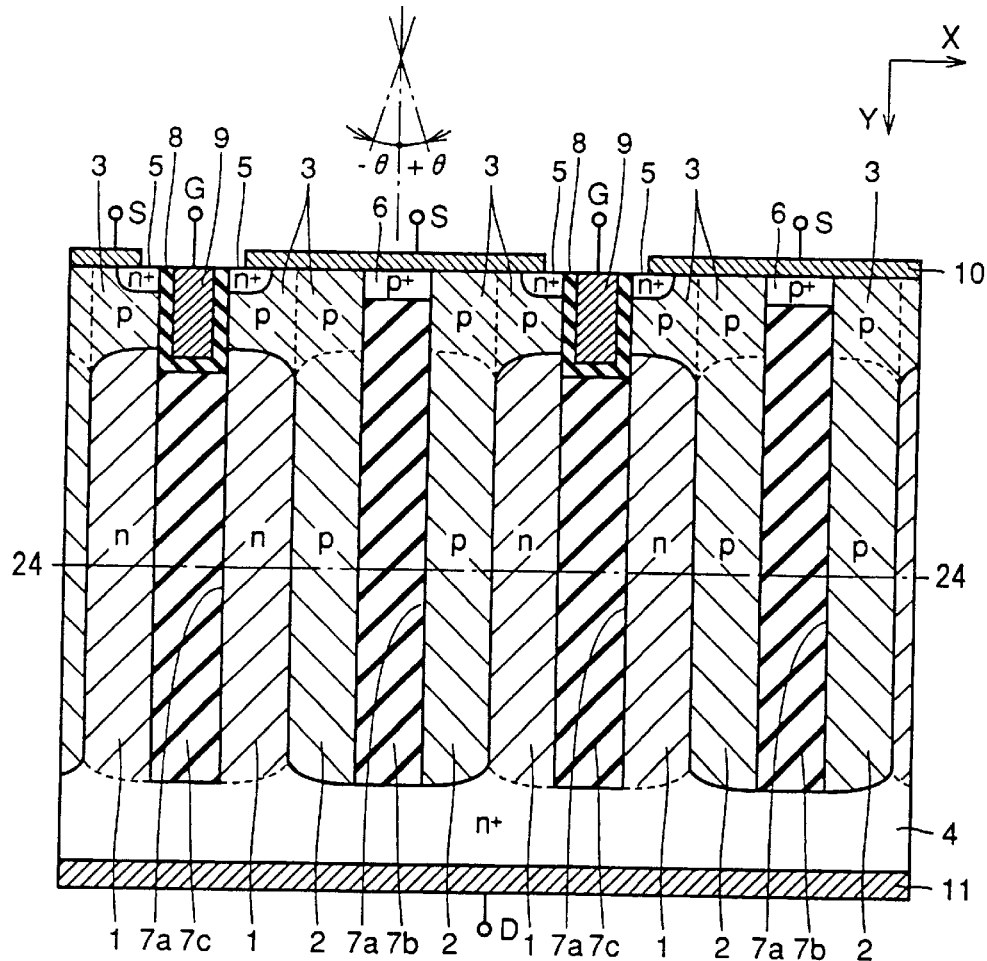
FIG. 23 is a schematic cross sectional view of a configuration of a high breakdown voltage semiconductor device according to a second embodiment of the present invention.

Referring to FIG. 23, a structure according to the present embodiment differs from the structure according to the above first embodiment in that impurity diffusion region 1, 2 of a same conductivity type is provided at the both sidewall surfaces of trench 7a. More specifically, n type diffusion region 1 is formed at the both sidewall surfaces of one trench 7a and p type diffusion region 2 is formed at the both sidewall surfaces of another trench 7a. Trench 7a provided with n type diffusion region 1 at the both sidewall surfaces and trench 7a provided with p type diffusion region 2 at the both sidewall surfaces are alternately arranged.

Such a structure dispenses with a gate electrode layer 9 for each trench 7a and gate electrode layer 9 need be formed only in trench 7a having n type diffusion region 1 formed at the both sidewall surfaces. Furthermore $p^+$ impurity diffusion region 6 is formed in trench 7a having p type diffusion region 2 formed at the both sidewall surfaces closer to the first main surface.

The rest of the structure is almost the same as the structure according to the first embodiment and thus an identical member is labeled by an identical reference character and a description thereof is not repeated.

Figure 24:
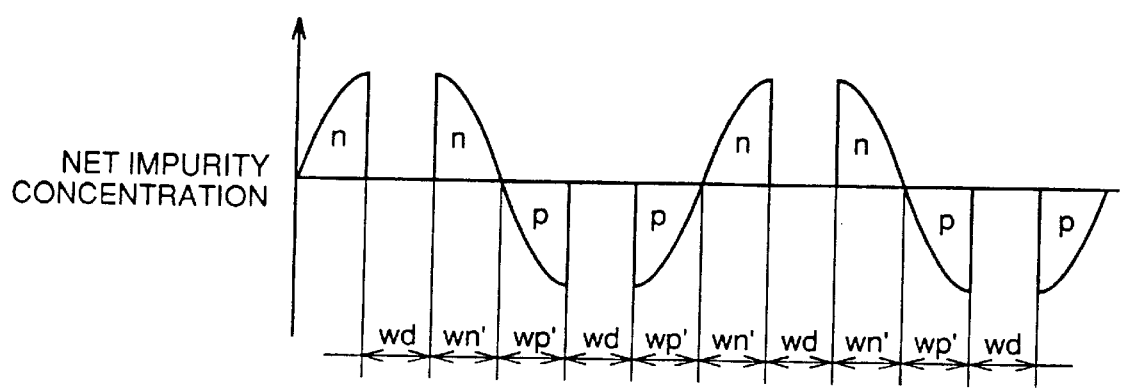
FIG. 24 shows a net impurity concentration distribution at 24—24 cross section shown in FIG. 23.

FIG. 24 represents a net impurity concentration distribution at a cross section taken along the lines 24—24 of the high breakdown voltage semiconductor device. Referring to FIG. 24, as with the first embodiment, n type diffusion region 1 and p type diffusion region 2 of the present embodiment each has an impurity concentration distribution diffused from a sidewall surface of trench 7a.

A manufacturing method according to the present embodiment will now be described.

Figure 25:
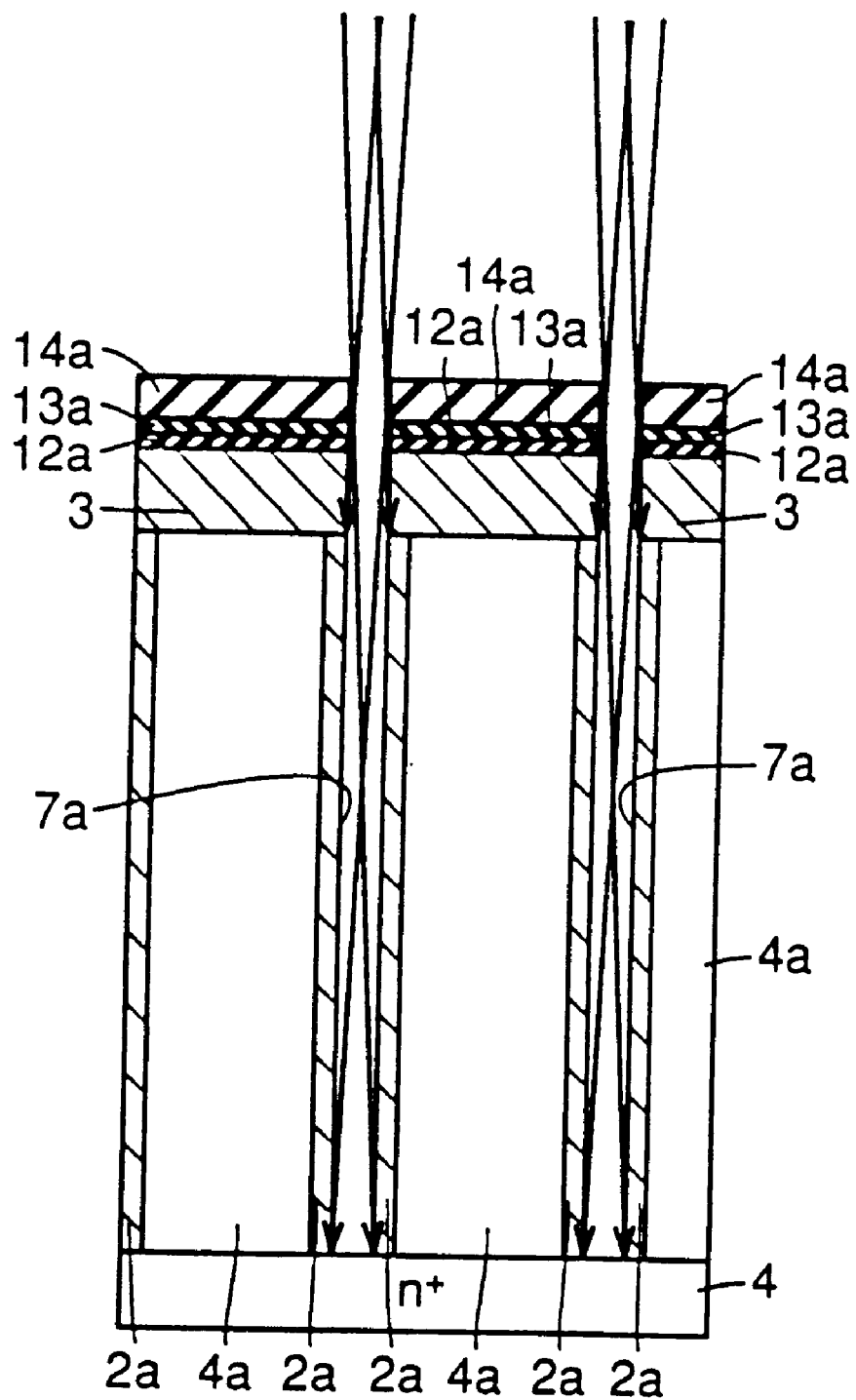
FIGS. 25–30 are schematic cross sectional views showing a method of manufacturing a high breakdown voltage semiconductor device according to the second embodiment of the present invention in the order of process step.

Referring to FIG. 25, a method similar to that described in the first embodiment is used to form an n type epitaxial growth layer 4a and a p type impurity diffusion region 3 on an n type high impurity concentration substrate 1. A thermal oxide film 12a, a CVD silicon nitride film 13a and a CVD silicon oxide film 14a are successively deposited on p type impurity diffusion region 3 and then patterned into a desired shape by typical photolithography and etching techniques. The patterned stack structure 12a, 13a, 14a is used as a mask to anisotropically etch the underlying layer. Thus, p type impurity diffusion region 3 and n type epitaxial growth layer 4a are penetrated to form a trench 7a which reaches n type high impurity concentration substrate 4.

Then stack structure 12a, 13a, 14a is used as a mask to implant boron into the both sidewall surfaces of trench 7a by oblique rotational ion implantation method. Thus, a boron implantation region 2a is formed on the both sidewall surfaces of trench 7a. The oblique rotational ion implantation is performed offset with respect to a normal to the wafer surface by approximately $\tan^{-1}(1/20) \approx 2.9°$, since an aspect ratio representing the dimension ratio of the depth to the opening of trench 7a is the same as that of the first embodiment, i.e., approximately 20:1.

Then a CVD silicon oxide film as an insulating film is formed to fill trench 7a and cover CVD silicon oxide film 14a. Then the CVD silicon oxide film is etched back.

Figure 26:
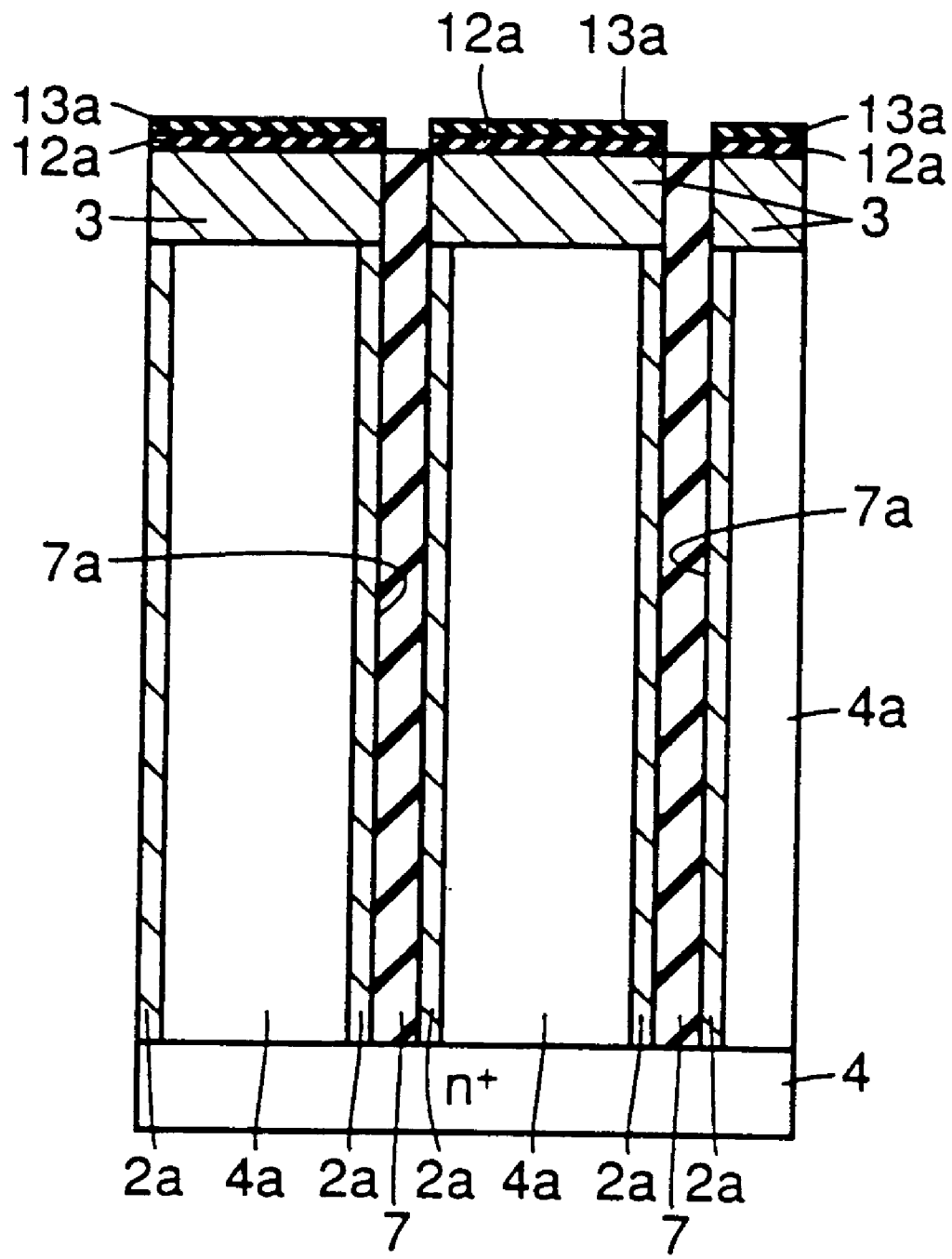

Referring to FIG. 26, a filling layer 7 which fills trench 7a is formed by the etch back. Furthermore the top CVD silicon oxide film 14a layer of the stack structure is also removed simultaneously with the etch back. Then CVD silicon nitride film 13a and thermal oxide film 12a are successively removed to expose an upper surface of p type base region 3.

Figure 27:
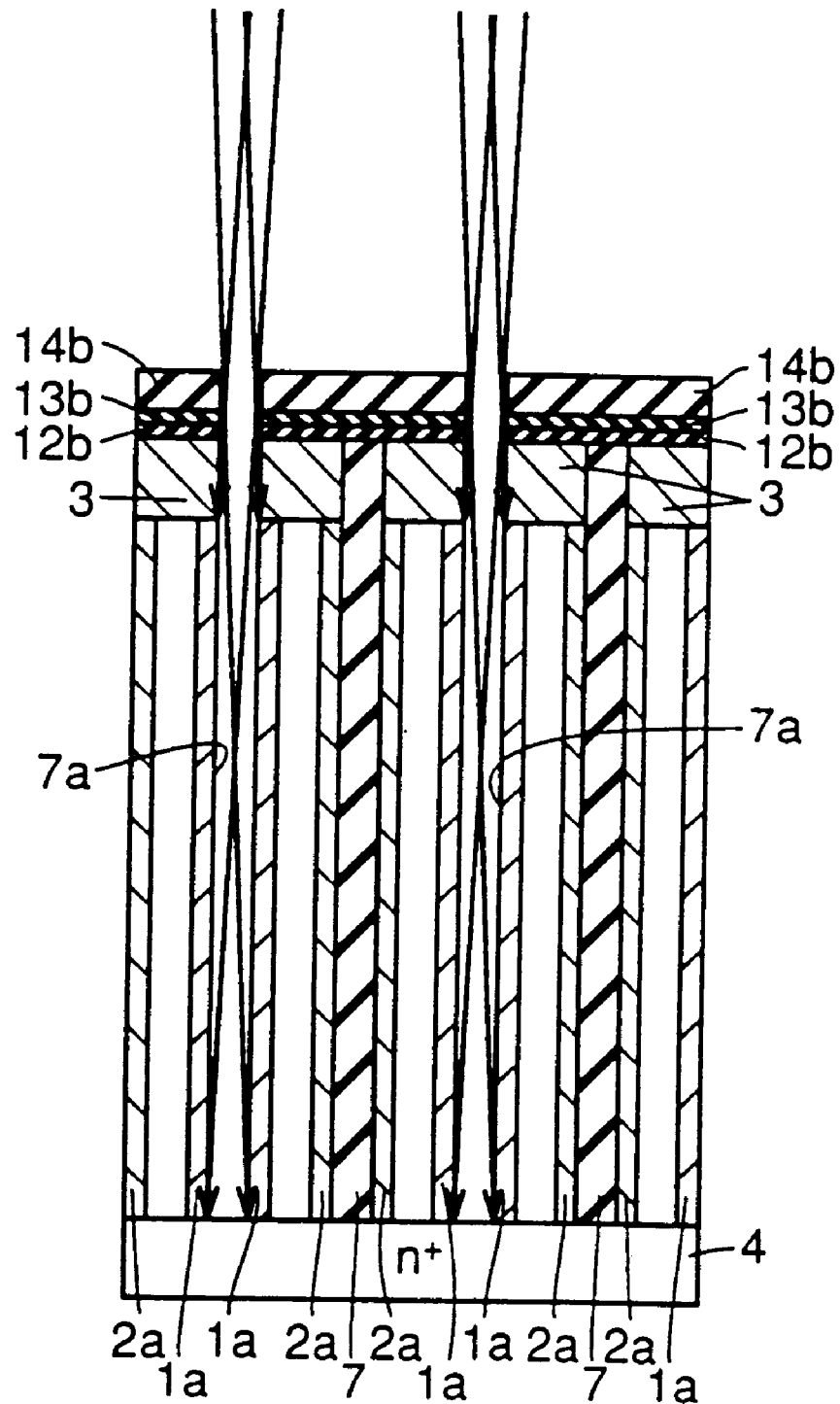

Referring to FIG. 27, a thermal oxide film 12b, a CVD silicon nitride film 13b and a CVD silicon oxide film 14b are successively deposited to cover the entire exposed surface and then patterned by typical photolithography and etching techniques. Stack structure 12b, 13b, 14b is used as a mask to anisotropically etch the underlying layers and thus p type base region 3 and n type epitaxial growth layer 4 are penetrated to form in trench 7a a new trench 7a which reaches n type high impurity concentration substrate 4.

Then stack structure 12b, 13b, 14b is still used as a mask to implant phosphorus at the both sidewall surfaces of the newly formed trench 7a by oblique, rotational ion implantation method. Thus a phosphorus implantation region 1a is formed at the both sidewall surfaces of the newly formed trench 7a.

Figure 28:
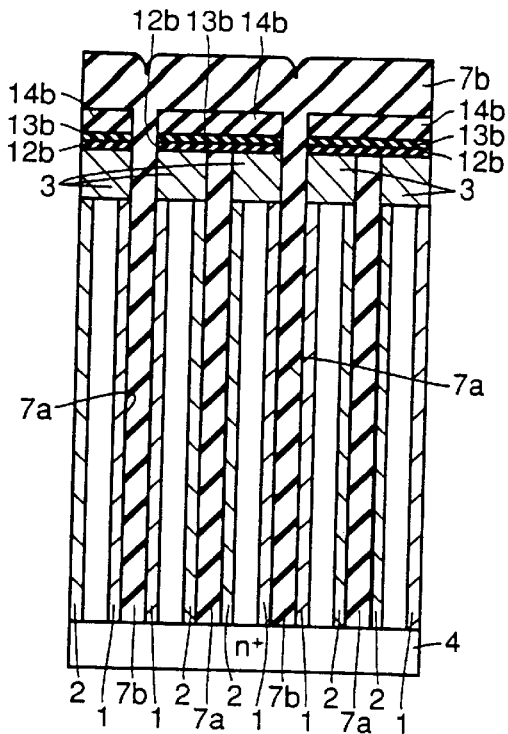

Referring to FIG. 28, a CVD silicon oxide film 7a as an insulating film is formed to fill the newly formed trench 7a and cover CVD silicon oxide film 14b. Heat treatment in this state allows diffusion of the impurities of boron implantation region 2a and phosphorus implantation region 1a.

Figure 29:
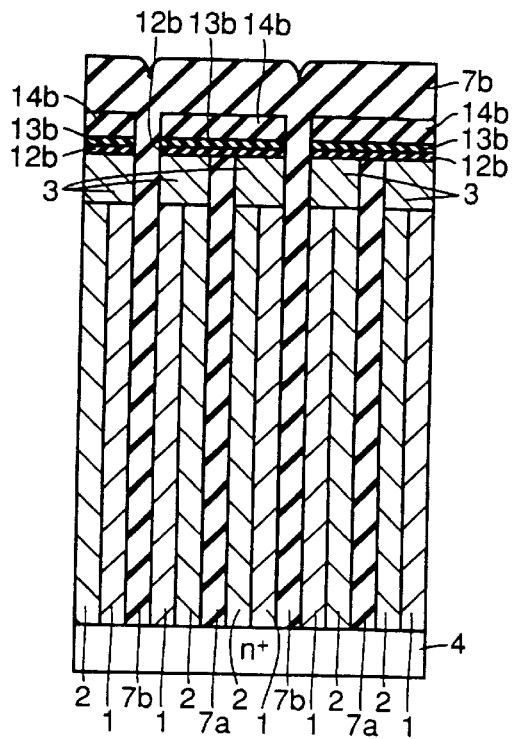

Referring to FIG. 29, thus n type diffusion region 1 and p type diffusion region 2 which form a pn junction are formed in a region sandwiched between trenches 7a.

Figure 30:
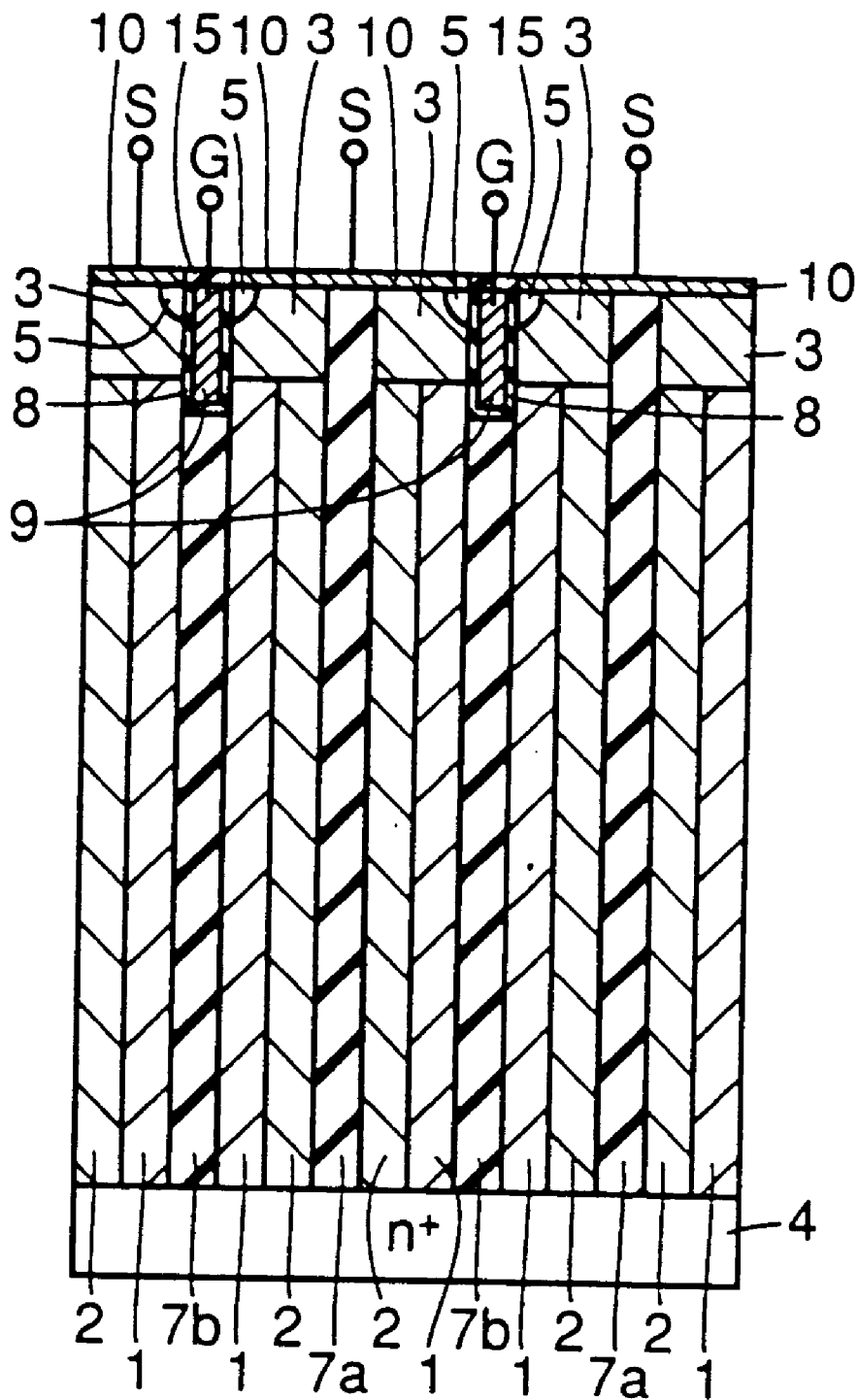

Then steps similar to those of the first embodiment shown in FIGS. 12–17 are performed to manufacture the high breakdown voltage semiconductor device according to the present embodiment shown in FIG. 30.

It should be noted that in FIG. 30, members identical to those of the first embodiment are labeled by identical reference characters.

A structure according to the present embodiment also allows a fine pn structure 1, 2 of no more than 1 $\mu$m and thus superior on-state voltage and breakdown voltage and also fast switching characteristics can be obtained, as with the first embodiment. In the present embodiment, however, an impurity diffusion region 1, 2 of a semiconductivity type is arranged at the both sidewall surfaces of one trench 7a and thus the width of an impurity diffusion region 1, 2 of a semiconductivity type is substantially doubled. Accordingly, when the shape of trench 7a is the same as that of the first embodiment, the present embodiment is slightly inferior in performance to the first embodiment.

Furthermore, trench 7a for forming n type diffusion region 1 and trench 7a for forming p type diffusion region 2 need be formed each at a different time and hence the process is complicated and the cost is increased. This structure, however, allows the both ends of the p-n-trench repeat structure to be terminated at either p type diffusion region 2 or n type diffusion region 1 and thus the degree of freedom in designing is advantageously increased.

Third Embodiment

Figure 31:
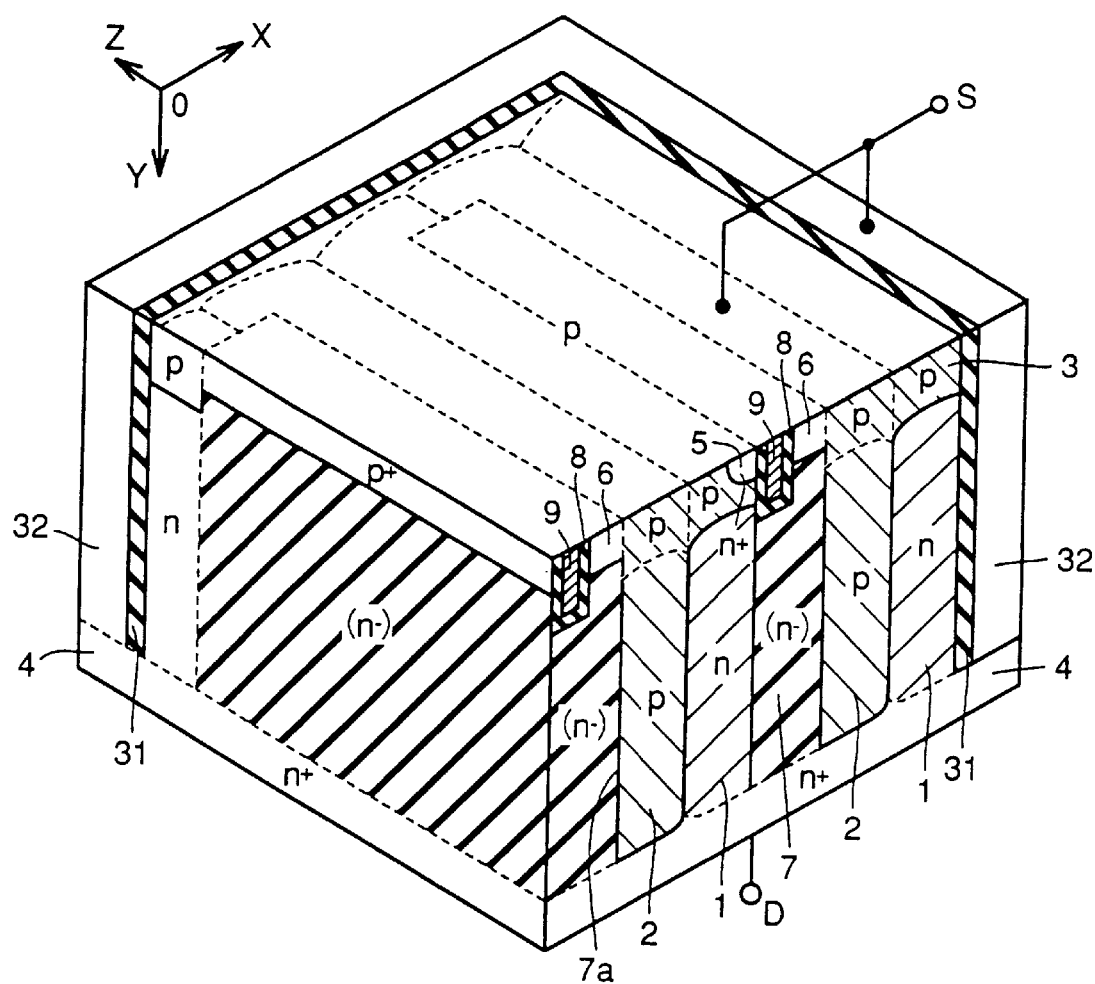
FIG. 31 is a schematic perspective view of a configuration of a high breakdown voltage semiconductor device according to a third embodiment of the present invention.

The structure in FIG. 31 shows a first example when the structure according to the first embodiment is applied to a perimeter of an actual device. A resistive field plate film 32 such as an SIPOS (semi-insulating polycrystalline silicon) film is provided at the end portion in the X direction and the end portion of the Z direction with an insulating film 31 of silicon oxide or the like disposed therebetween. An end of resistive field plate film 32 closer to the source is electrically connected to a source electrode (not shown) and an end of resistive field plate film 32 closer to the drain is electrically connected to an $n^+$ region 4.

The rest of the structure is almost the same as the structure according to the first embodiment and thus identical members are labeled by identical reference characters and descriptions thereof are not repeated.

A p-n-trench repeat structure portion in an off state has, as described above, an electric field which is uniform in the Y direction and thus in the shape of a rectangular. More specifically, the potential exhibits a linear distribution. Accordingly, resistive field plate film 32 having both ends fixed at source and drain potentials is linked to equipotential surface without contradiction and thus a breakdown voltage of the p-n-trench repeat structure portion is obtained intact.

Furthermore, a function of resistive field plate 32 prevents effects caused by ions or the like in a sealing resin or the like and thus stable breakdown voltage is obtained in the long term. Also, a small area is only required due to the end structure and thus the device can be manufactured at low cost.

Fourth Embodiment

Figure 32:
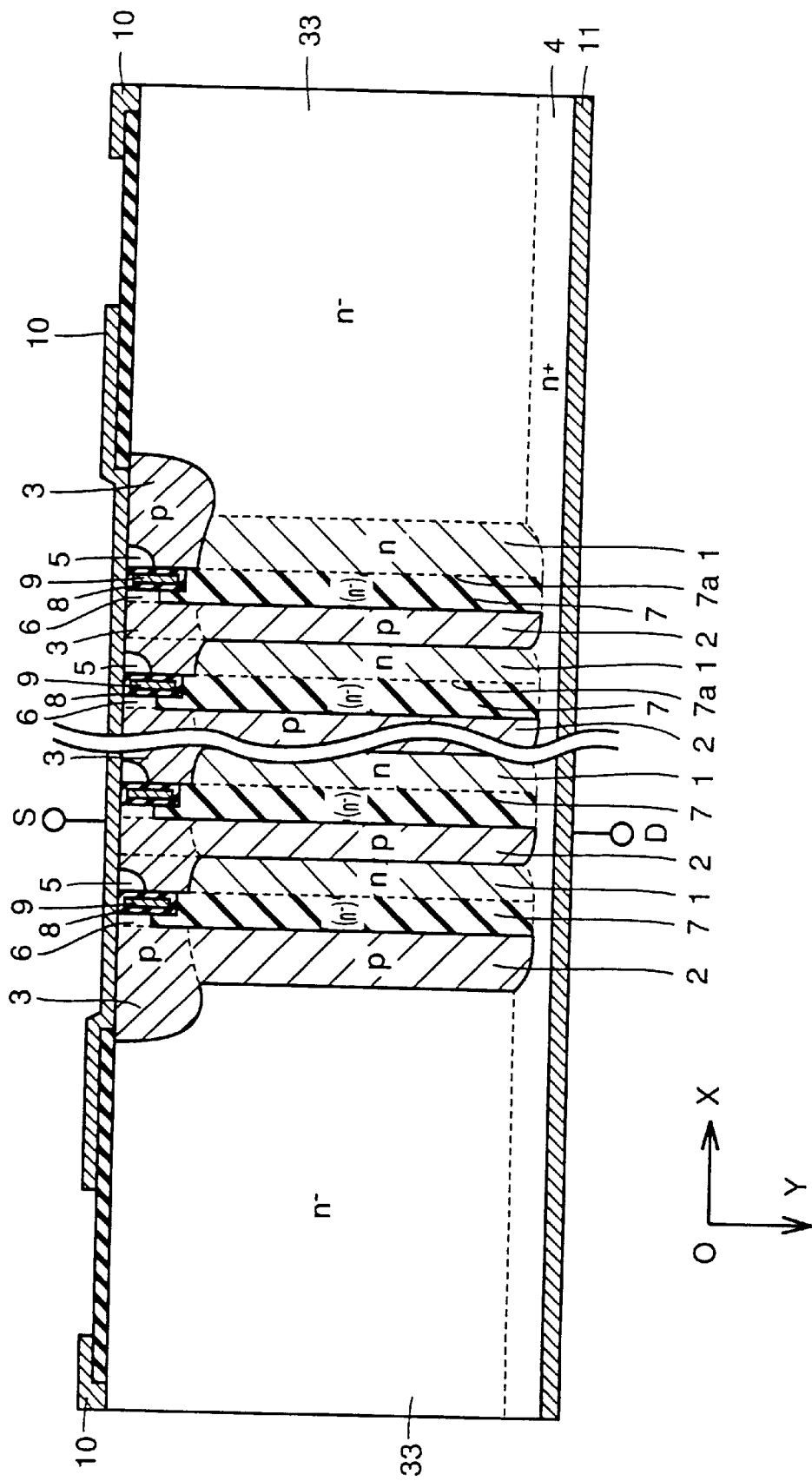
FIG. 32 is a schematic cross sectional view of a configuration of a high breakdown voltage semiconductor device according to a fourth embodiment of the present invention.

The structure shown in FIG. 32 shows a second example when the structure according to the first embodiment is applied to a perimeter of an actual device. The structure is also applied to a typical planar passivation structure in which a p-n-trench repeat structure is formed in an n-semiconductor region 33 of low impurity concentration and thus an end of a depletion layer formed in n⁻ semiconductor region 33 is rendered to appear and thus ends at a silicon surface closer to the source.

To relax an electric field in the X direction at the surface portion closer to the source, the field plate as shown in the figure, a typical guard ring structure, a RESURF structure employing a low concentration p type diffusion layer or the like can be used and thus the structure can be ended with conventionally employed passivations.

Figure 33:
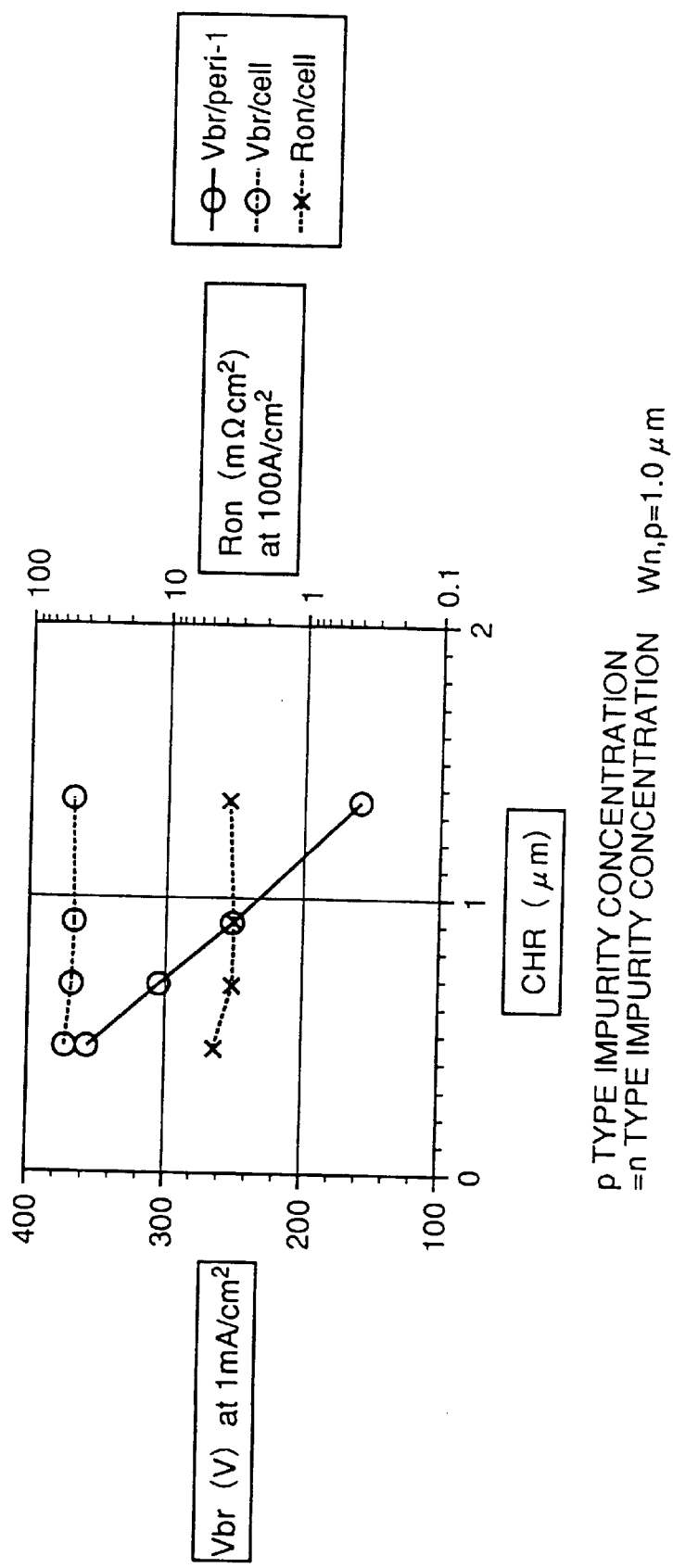
FIG. 33 shows a result of simulation of a breakdown voltage and an on-state resistance of the configuration shown in FIG. 32.

FIG. 33 shows a result of numerical simulation of diffusion length (CHR) dependence of the breakdown voltage with respect to this structure. In FIG. 33, "peri-1" designates the result with respect to a structure according to the present embodiment shown in FIG. 32, and as a reference, "cell" designates the breakdown voltage and on-state resistance calculated for the p-n-trench repeat structure shown in FIG. 1 only.

The result shows that while the breakdown voltage of the p-n-trench repeat structure portion does not so depend on diffusion length CHR, the breakdown voltage at the perimeter is greatly decreased as diffusion length CHR is increased, since the length of the junction formed by n- and p-type diffusion regions 1 and 2 at an end of the repeat structure portion and by peripheral n⁻ semiconductor region 33 at a contact of the p-n-trench repeat structure portion and peripheral n⁻ semiconductor region 33 is longer than the repeat portion and the length of the junction is further rendered longer for a longer diffusion length CHR and thus the electric field severely changes and electric field concentration is caused.

Accordingly, when the structure of the periphery as shown in FIG. 32 is employed, diffusion length CHR need be designed to be shorter than Wn and Wp.

Figure 34:
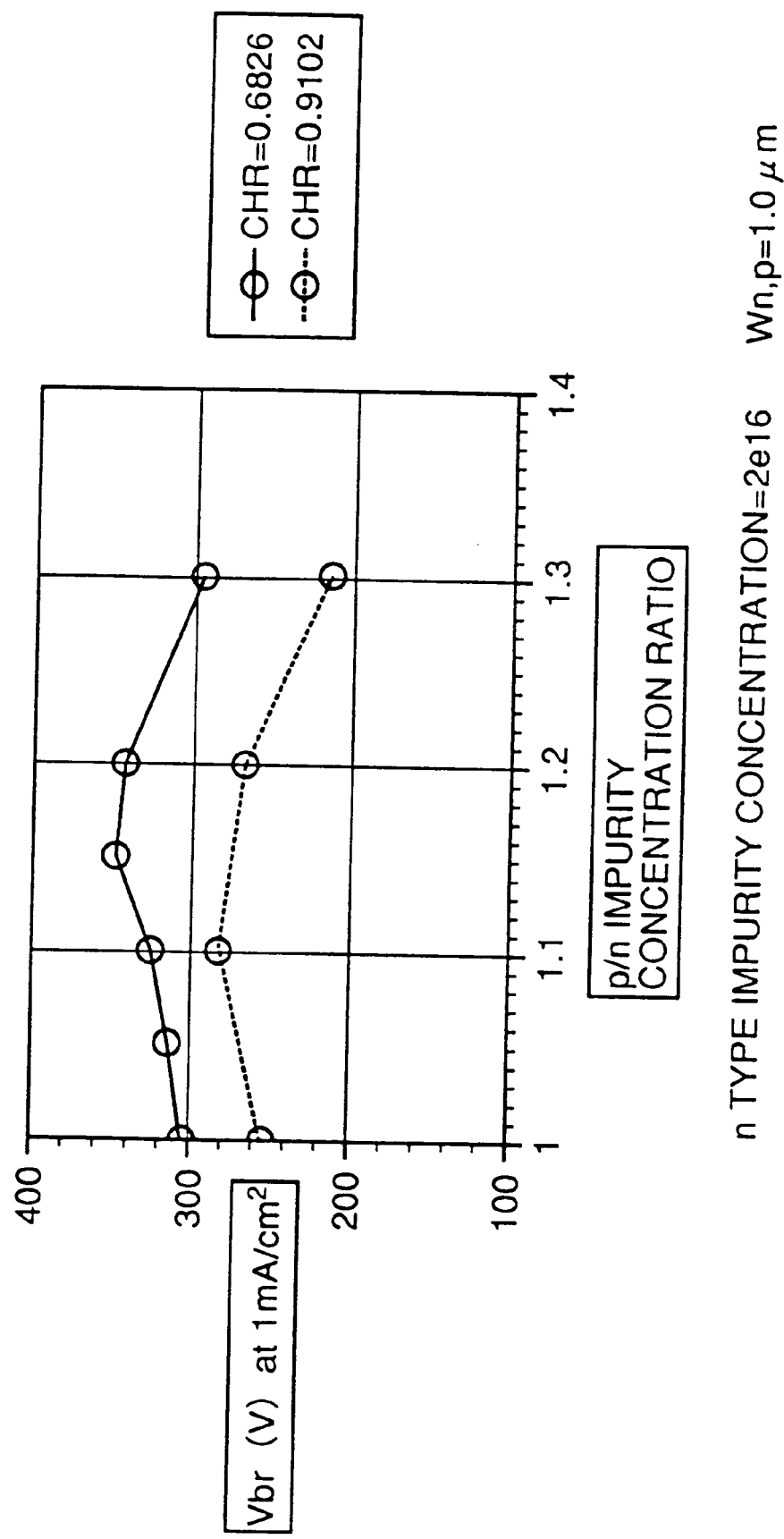
FIG. 34 shows a result of simulation of an impurity ratio dependence of a breakdown voltage of the structure shown in FIG. 32.

FIG. 34 furthermore shows a result of numerical simulation of an effect of Csp/Csn ratio on breakdown voltage in such a peripheral structure. Referring to FIG. 34, the Csp/Csn ratio at which breakdown voltage reaches the maximum is offset by approximately 10% larger than the simulation result with respect to a p-n-trench repeat structure shown in FIG. 22. This shows that a structure which ends with such a peripheral structure needs an increased amount of p type impurity implantation.

It is noted that an result is obtained that when CHR is set at an increased length of 0.91 μm and Csp/Csn ratio is set at approximately 1.1, breakdown voltage is slightly increased whereas a breakdown voltage of 300V cannot be obtained.

Furthermore when current at breakdown flows into a perimeter of a chip, destruction due to local heat emission can be disadvantageously caused. Thus, it is necessary to design the breakdown voltage of the perimeter of a p-n-trench repeat structure to be generally slightly higher than that of the center of the p-n-trench repeat structure. It has been found from a numerical simulation that when the space between trenches 7a is decreased in the present p-n-trench repeat structure, drop of breakdown voltage for higher Csn and Csp is more difficult to cause. Thus, a pattern in which the space between trenches 7a is narrower at a portion of a p-n-trench structure closer to the periphery than at the center of the a p-n-trench repeat structure allows a design which is more resistant to breakdown.

Fifth Embodiment

Figure 35:
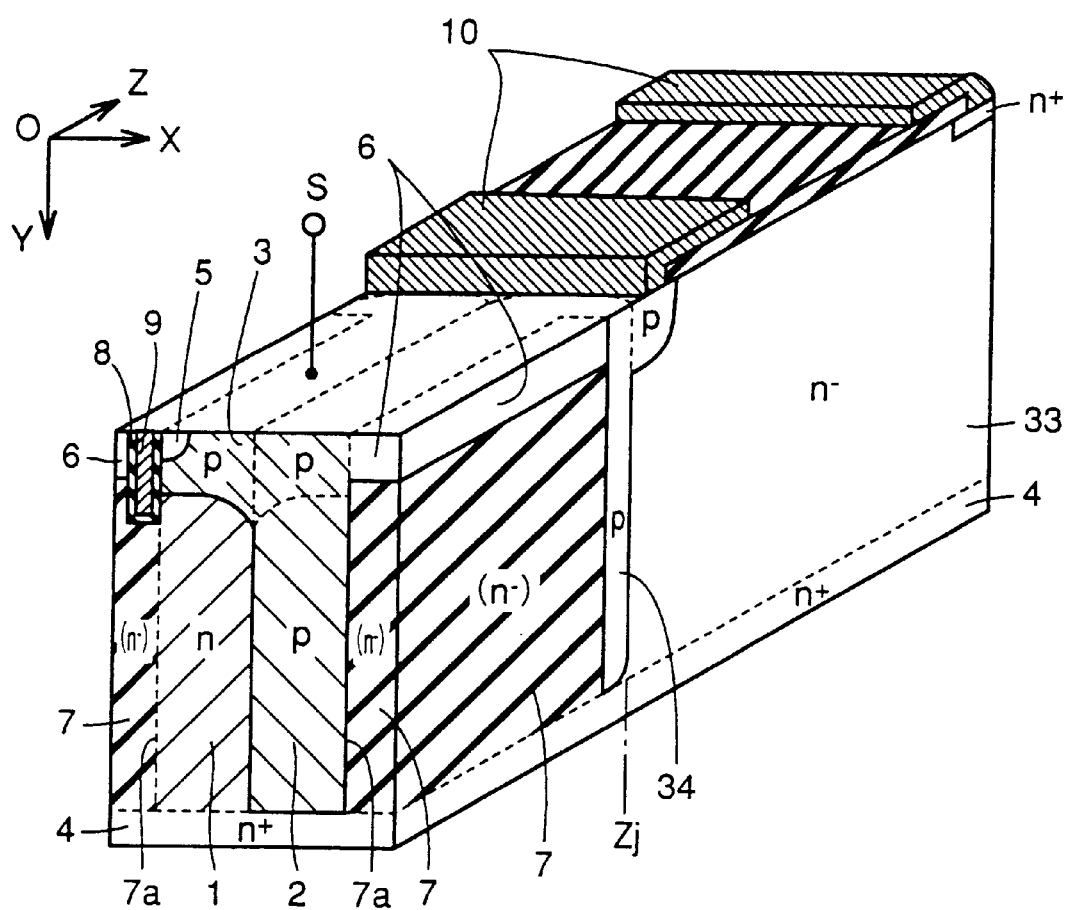
FIG. 35 is a schematic perspective view of a configuration of a high breakdown voltage semiconductor device according to a fifth embodiment of the present invention.

The structure shown in FIG. 35 shows an example of the peripheral structure in a plane perpendicular to the cross section shown in FIG. 32 (i.e., a plane along the Z direction). N⁻ semiconductor region 33 of low impurity concentration and the p-n-trench repeat structure are connected to each other at a position zj.

The rest of the structure is almost similar to the structure shown in FIG. 32 and thus identical members are labeled by identical numeral references and descriptions thereof are not repeated.

A result of three dimensional numerical simulation shows that a breakdown voltage in this structure is almost equal to that obtained in the p-n-trench repeat structure shown in FIG. 1. Thus, the structure according to the cross section does not have the risk that breakdown voltage is significantly reduced in relation with the peripheral structure and thus has the advantage that a superior amount of breakdown resistance can be readily obtained.

Sixth Embodiment

Figure 36:
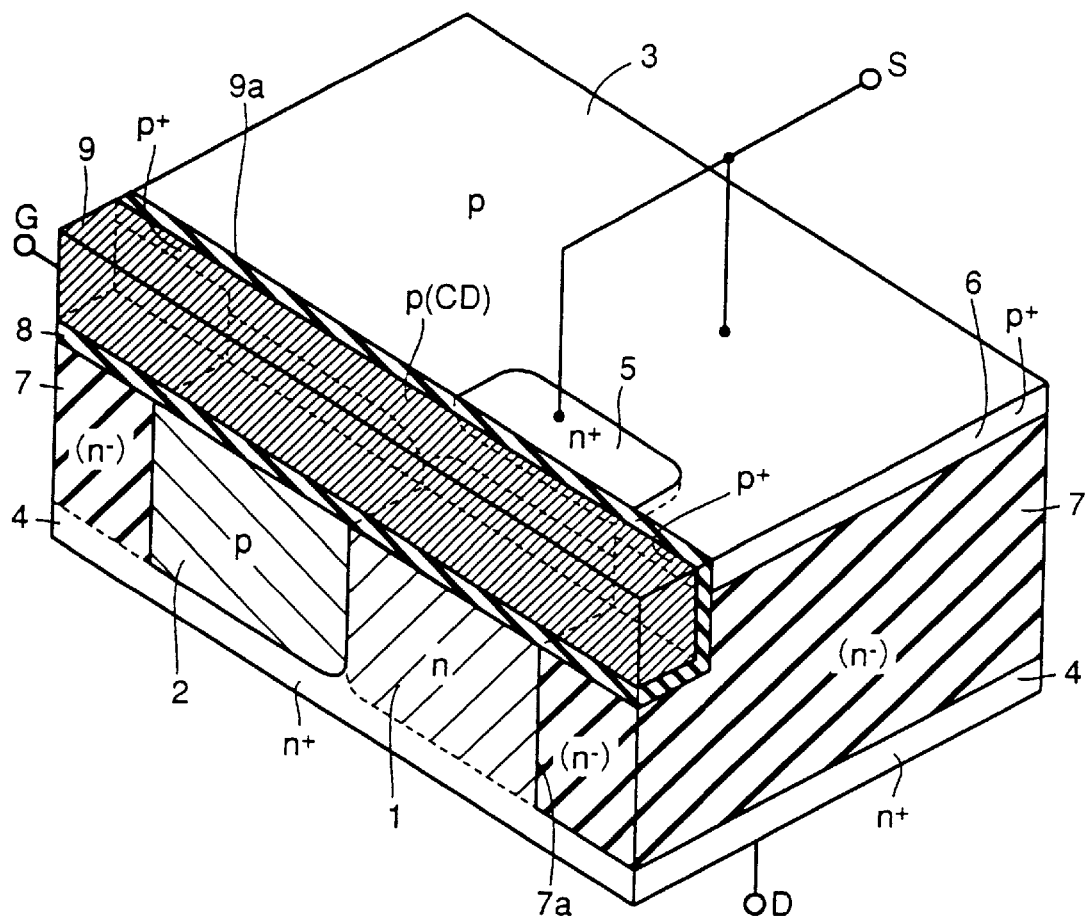
FIG. 36 is a schematic perspective view of a configuration of a high breakdown voltage semiconductor device according to a sixth embodiment of the present invention.

The structure in FIG. 36 shows an example of the structure in which a gate electrode layer is arranged in a direction perpendicular to the direction in which the gate electrode layer in FIG. 1 extends. More specifically, trench 9a for filling gate electrode layer 9 is provided such that trench 9a extends in the direction from one trench 7a to another trench 7a. Trench 9a is formed to penetrate p type base region 3 and thus has a depth reaching n- and p-type diffusion regions 1 and 2. Gate insulating layer 8 is formed to cover an internal wall surface of trench 9a, and gate electrode layer 9 fills trench 9a and extends in the direction perpendicular to trench 7a, more specifically, in the direction from one trench 7a to another trench 7a.

Source n⁺ diffusion region 5 is formed at the first main surface within p type well region 3 such that source n⁺ diffusion region 5 faces a sidewall surface of trench 9a.

The rest of the structure is almost the same as the structure according to the first embodiment and thus identical members are labeled by identical reference characters and descriptions thereof are not repeated.

A method of manufacturing the present embodiment will now be described.

The method of manufacturing the present embodiment first goes through steps similar to those of the first embodiment shown in FIGS. 5–11. Then insulating layer 7 shown in FIG. 11 is etched back.

Figure 37:
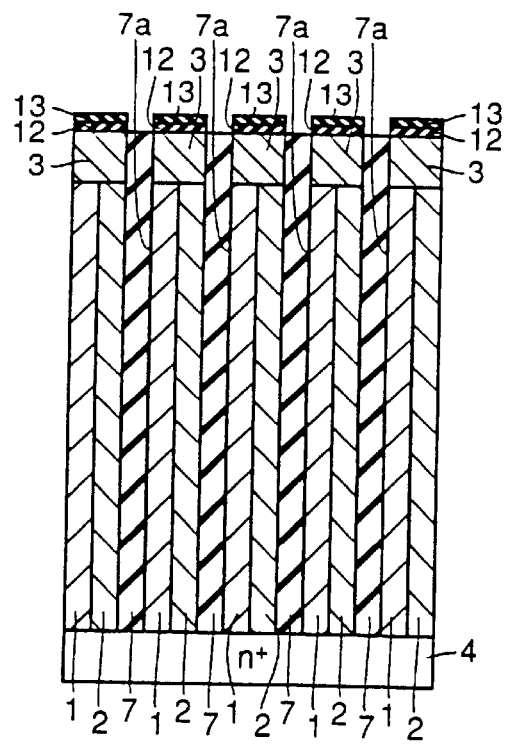
FIG. 37 is a schematic cross sectional view showing a first step of a method of manufacturing a high breakdown voltage semiconductor device according to the sixth embodiment of the present invention.

Referring to FIG. 37, filling layer 7 is thus formed to fill trench 7a and cover a sidewall of p type base region 3. CVD silicon oxide film 14 is simultaneously removed during the etch back. Then thermal oxide film 12 and CVD silicon nitride film 13 are also removed successively. The state is perspectively shown in FIG. 38.

Figure 38:
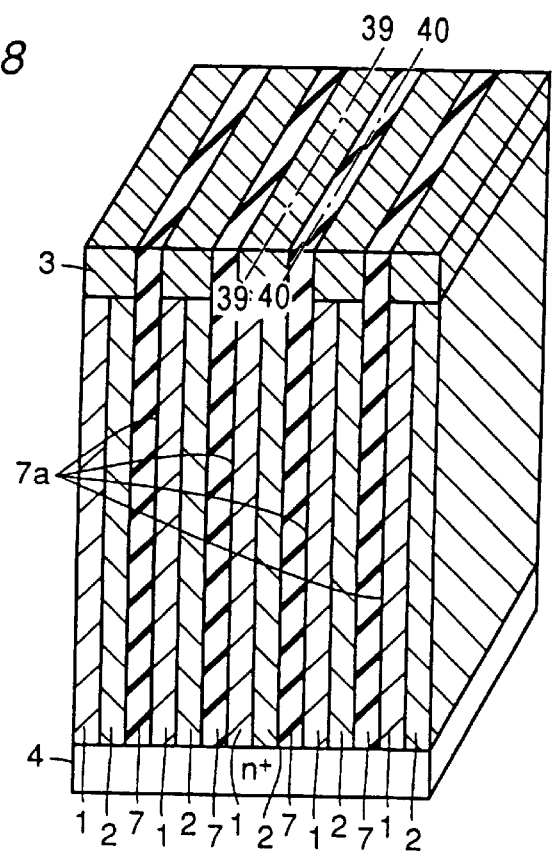
FIG. 38 is a schematic cross sectional view showing a second step of the method of manufacturing the high breakdown voltage semiconductor device according to the sixth embodiment of the present invention.
Figure 39:
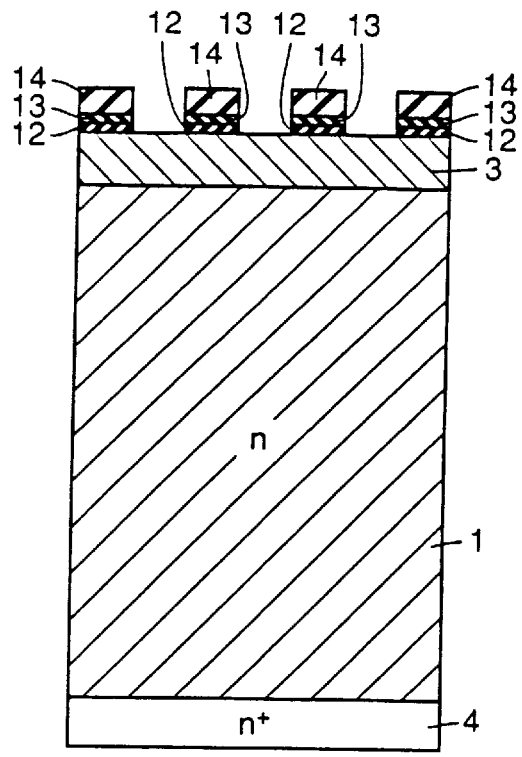
FIGS. 39 and 40 are schematic cross sectional views corresponding to 39—39 and 40—40 cross sections, respectively, of FIG. 38 showing a third step of the method of manufacturing the high breakdown voltage semiconductor device according to the sixth embodiment of the present invention.
Figure 40:
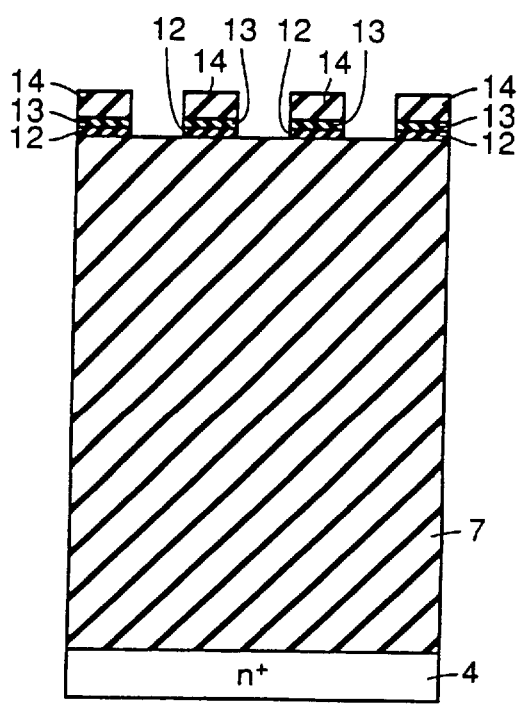

Referring to FIG. 38, thermal oxide film 12, CVD silicon nitride film 13 and CVD silicon oxide film 14 are again formed in a stack at the first main surface and then patterned into a desired pattern by typical photolithography and etching techniques. FIGS. 39 and 40 show the state in cross sections taken along lines 39—39 and 40—40 of FIG. 38, respectively.

Figure 41:
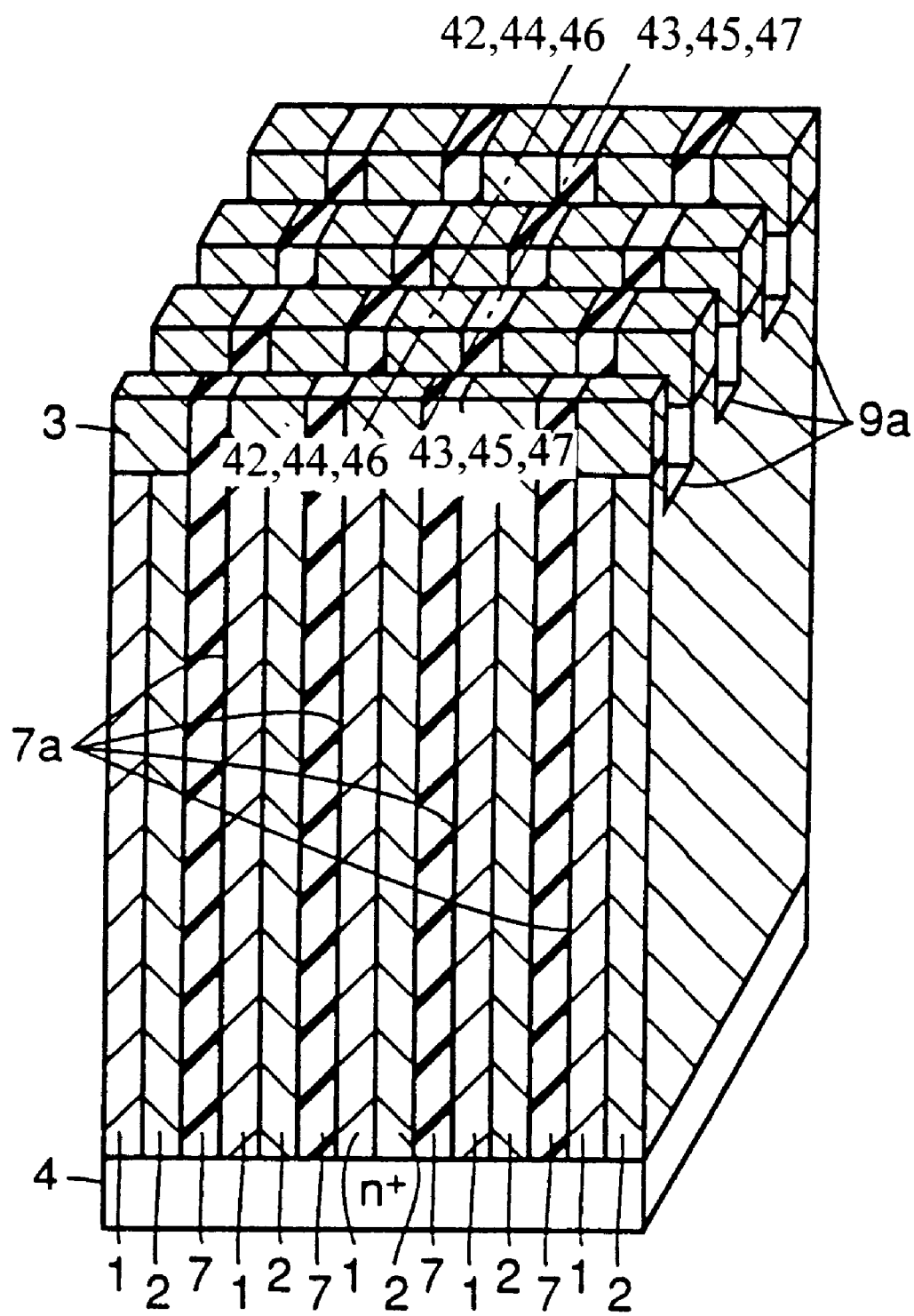
FIG. 41 is a schematic cross sectional view showing a fourth step of the method of manufacturing the high breakdown voltage semiconductor device according to the sixth embodiment of the present invention.
Figure 42:
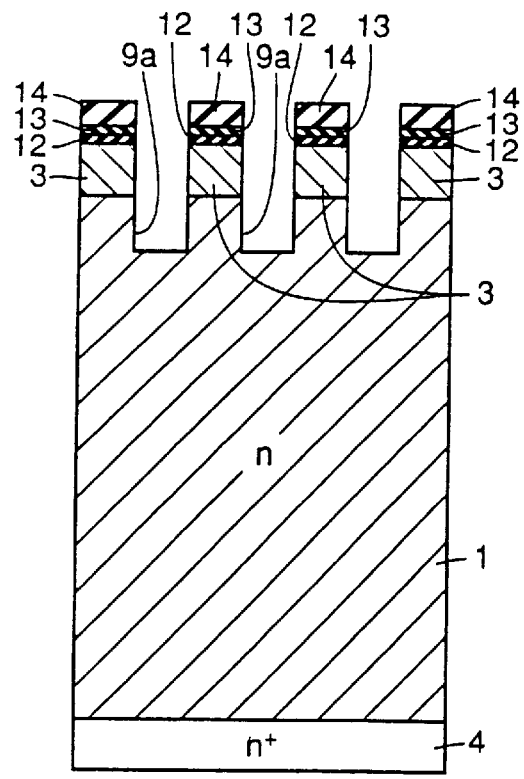
FIGS. 42 and 43 are schematic cross sectional views taken along lines 42,44,46—42,44,46 and 43,45,47—43,45,47 respectively, of FIG. 41 showing the fourth step of the method of manufacturing the high breakdown voltage semiconductor device according to the sixth embodiment of the present invention.
Figure 43:
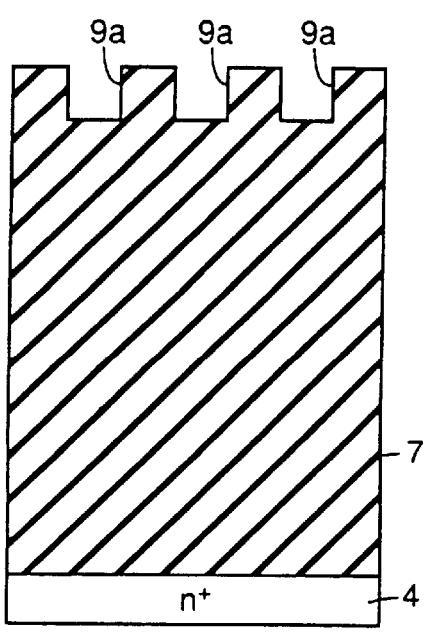

Referring to FIGS. 39 and 40, the stack structure 12, 13, 14 is used as a mask to anisotropically etch the underlying layer. The result of the anisotropic etching is perspectively shown in FIG. 41. Also the cross sections taken along lines 42,44,46—42,44,46 and 43,45,47—43,45,47 shown in FIG. 41 are shown in FIGS. 42 and 43, respectively. FIG. 41 does not show stack structure 12, 13, 14 which serves as a mask when etching is performed.

Referring to FIGS. 41–43, the above anisotropic etching allows formation of trench 9a which penetrates at least p type base region 3 and reaches n- and p-type diffusion regions 1 and 2. In the formation, the depth of trench 9a shown in FIG. 42 differs from that of trench 9a shown in FIG. 43, since trench 9a shown in FIG. 42 is formed in silicon, whereas trench 9a shown in FIG. 43 is formed within a silicon oxide film, and thus the etching rate of the silicon differs from that of the silicon oxide film in this etching. Then steps similar to those shown in FIGS. 13–17 are performed and then resist pattern 21a shown in FIG. 17 is removed to obtain the conditions shown in FIGS. 44 and 45.

Figure 44:
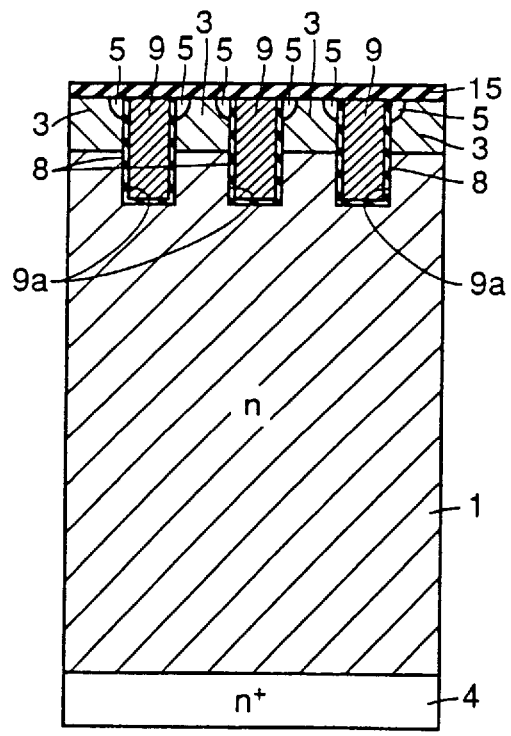
FIGS. 44 and 45 are schematic cross sectional views corresponding to 42,44,46—42,44,46 and 43,45,47—43,45, 47 cross sections, respectively, of FIG. 41 showing a fifth step of the method of manufacturing the high breakdown voltage semiconductor device according to the sixth embodiment of the present invention.
Figure 45:
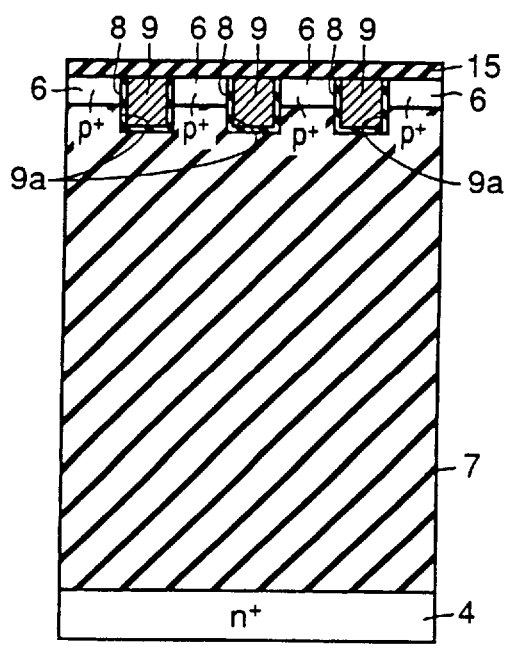

Referring to FIGS. 44 and 45, then cap oxide film 15 is selectively left only on gate electrode layer 9 by typical photolithography and etching techniques.

Figure 46:
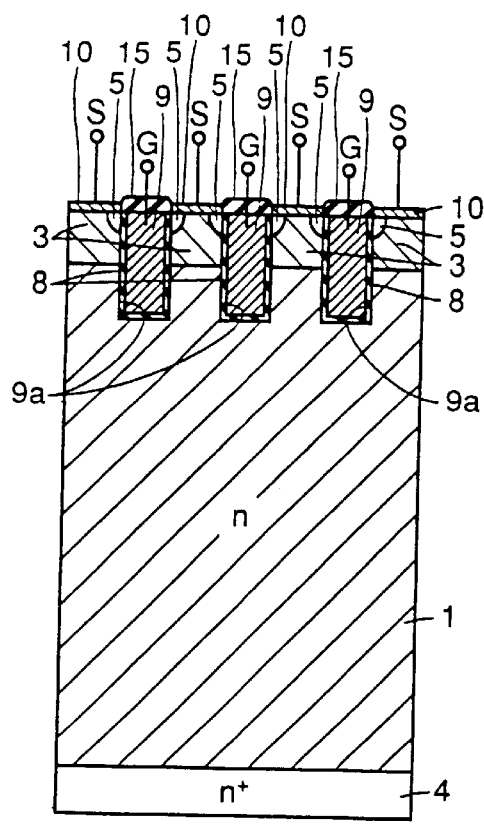
FIGS. 46 and 47 are schematic cross sectional views corresponding to 42,44,46—42,44,46 and 43,45,47—43,45, 47 cross sections, respectively, of FIG. 41 showing a sixth step of the method of manufacturing the high breakdown voltage semiconductor device according to the sixth embodiment of the present invention.
Figure 47:
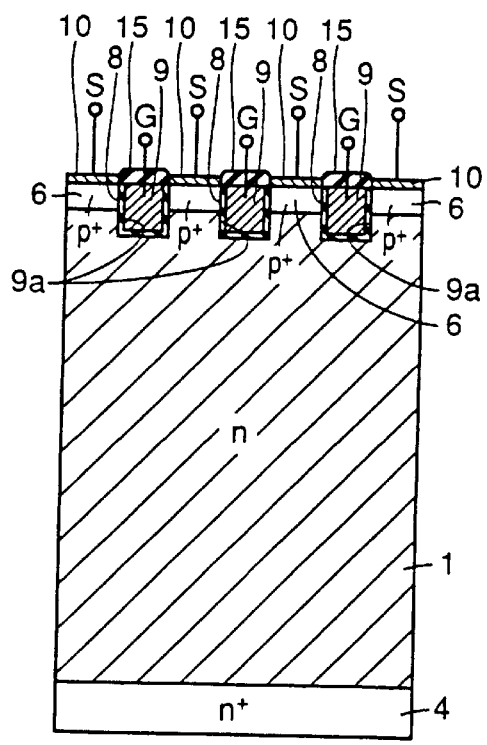

Referring to FIGS. 46 and 47, surfaces of p type base region 3, source $n^+$ diffusion region 5 and $p^+$ diffusion region 6 are thus exposed at cap oxide film 15. Source electrode 10 is formed in contact with the exposed surfaces.

For the arrangement of the gate electrode layer shown in FIG. 1, finer Wn, Wp and Wd cause constraints on dimensions such as the width of gate trench and the width of source $n^+$ diffusion region 5. When gate electrode layer 9 extends in the direction perpendicular to trench 7a, as is in the structure according to the present embodiment shown in FIG. 36, dimensional constraints on gate trench 9a are eliminated and designing with higher degree of freedom can be achieved.

Also for the arrangement of the gate electrode layer shown in FIG. 1, finer Wn, Wp and Wd increase gate electrode layer 9 density and consequently increase input capacitance and decrease switching speed. If gate electrode layer 9 is arranged as in the structure according to the present embodiment shown in FIG. 36, the space between gate trenches 9a can be wider than a dimension such as Wn and thus the problem that switching speed is reduced can be avoided.

Seventh Embodiment

Figure 48:
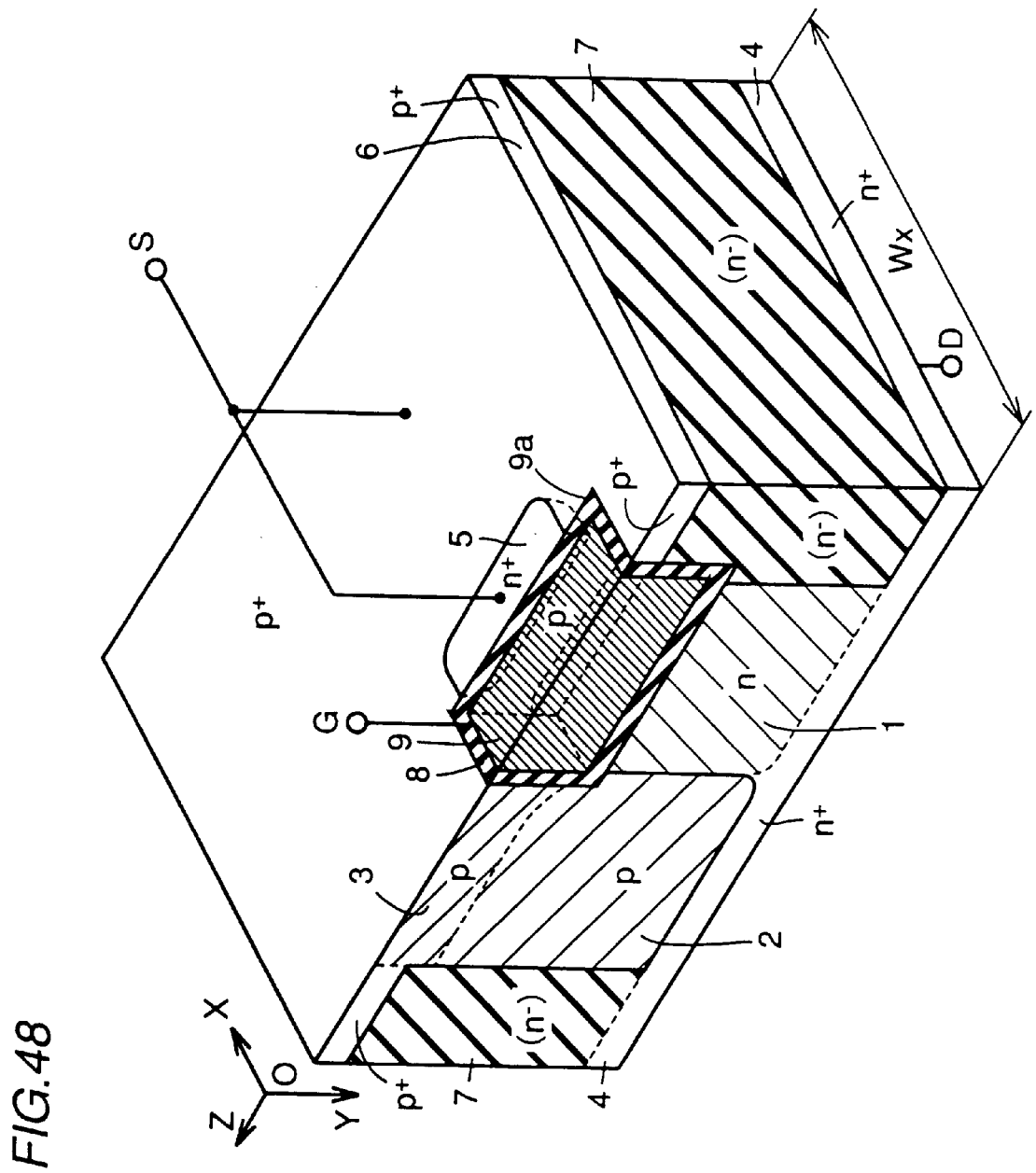
FIG. 48 is a schematic perspective view of a configuration of a high breakdown voltage semiconductor device according to a seventh embodiment of the present invention.

The structure shown in FIG. 48 has the aforementioned gate trench 9a according to the sixth embodiment provided only on n type diffusion region 1.

The rest of the structure is almost the same as the structure according to the sixth embodiment and thus identical members are labeled by identical reference characters and descriptions thereof are not repeated.

A method of manufacturing the present embodiment will now be described.

The method of manufacturing the present embodiment goes through steps similar to those according to the sixth embodiment until the step shown in FIG. 38. Then thermal oxide film 12, CVD silicon nitride film 13 and CVD silicon oxide film 14 are successively deposited on the first main surface shown in FIG. 38 and are then patterned by typical photolithography and etching techniques. The stack structure 12, 13, 14 is used as a mask to anisotropically etch the underlying layer. The condition is shown in FIGS. 49–51.

Figure 49:
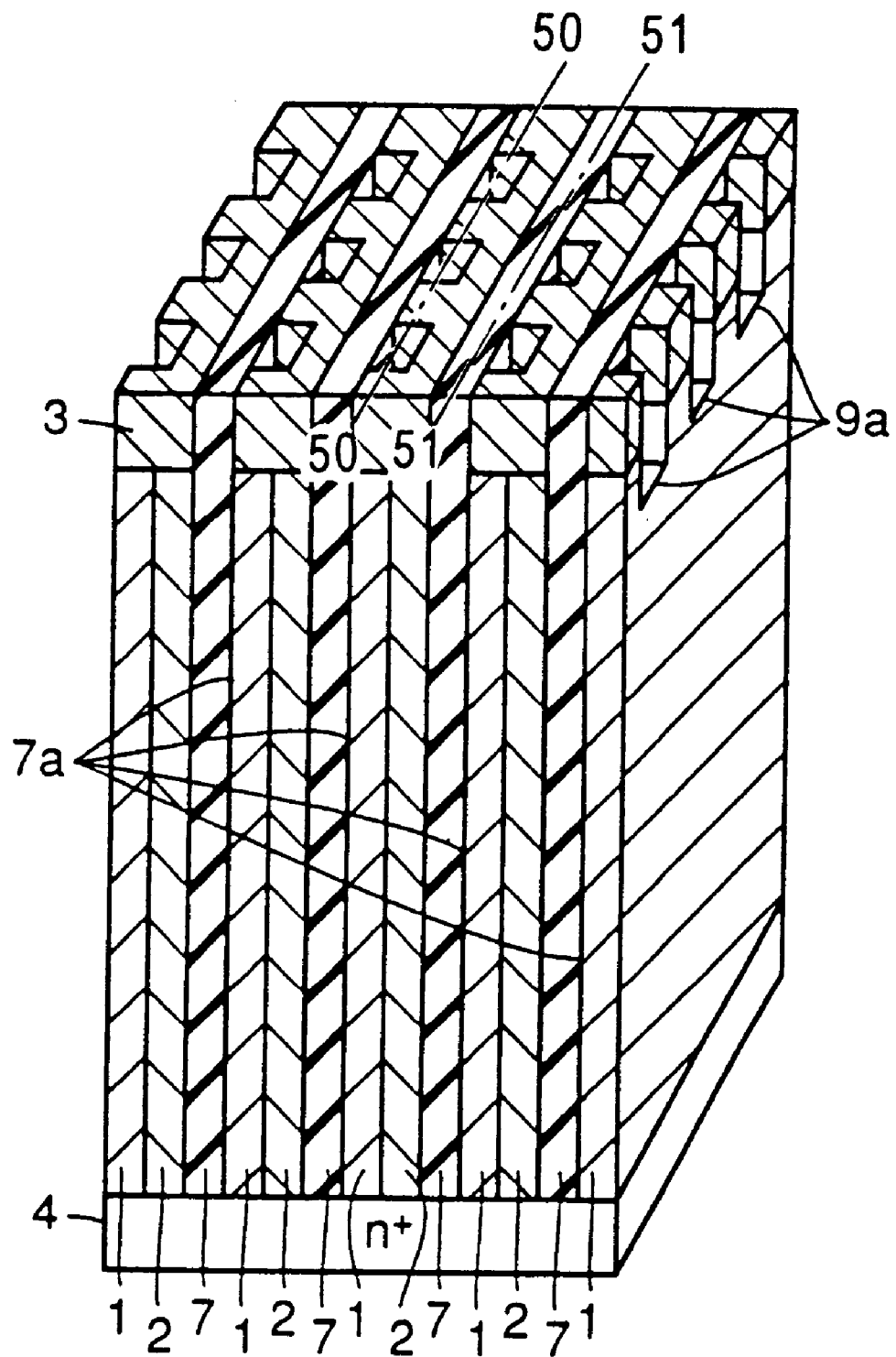
FIG. 49 is a schematic perspective view showing a first step of a method of manufacturing a high breakdown voltage semiconductor device according to the seventh embodiment of the present invention.
Figure 50:
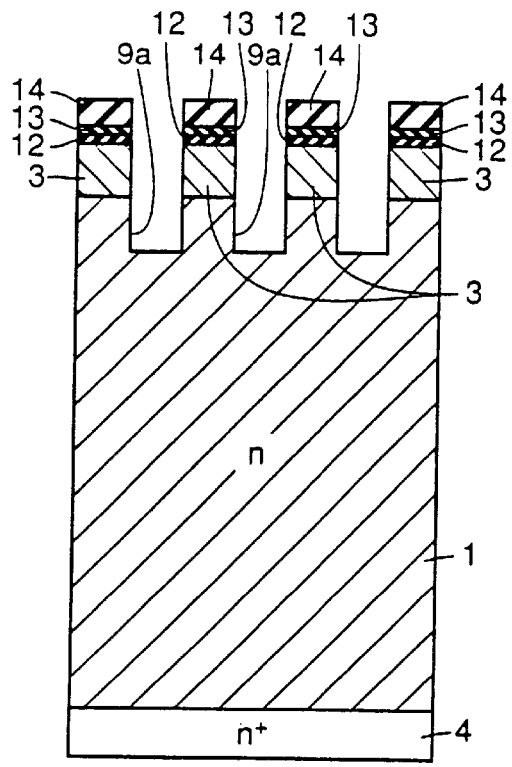
FIGS. 50 and 51 are schematic perspective views taken along lines 50=and 51—51, respectively, of FIG. 49 showing a first step of the method of manufacturing the high breakdown voltage semiconductor device according to the seventh embodiment of the present invention.
Figure 51:
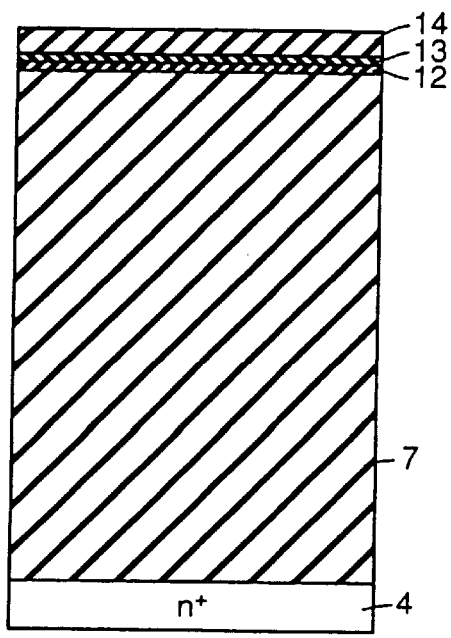

FIGS. 50 and 51 are schematic cross sectional views taken along lines 50—50 and 51—51 shown in FIG. 49, respectively. FIG. 49 does not show three-layer stack structure 12, 13, 14.

Referring to FIGS. 49–51, the aforementioned anisotropic etching allows formation of trench 9a which penetrates p type well 3 only on n type diffusion region 1. Then steps almost similar to those according to the first embodiment shown in FIGS. 13–18 are performed to obtain the conditions shown in FIGS. 52–53.

Figure 52:
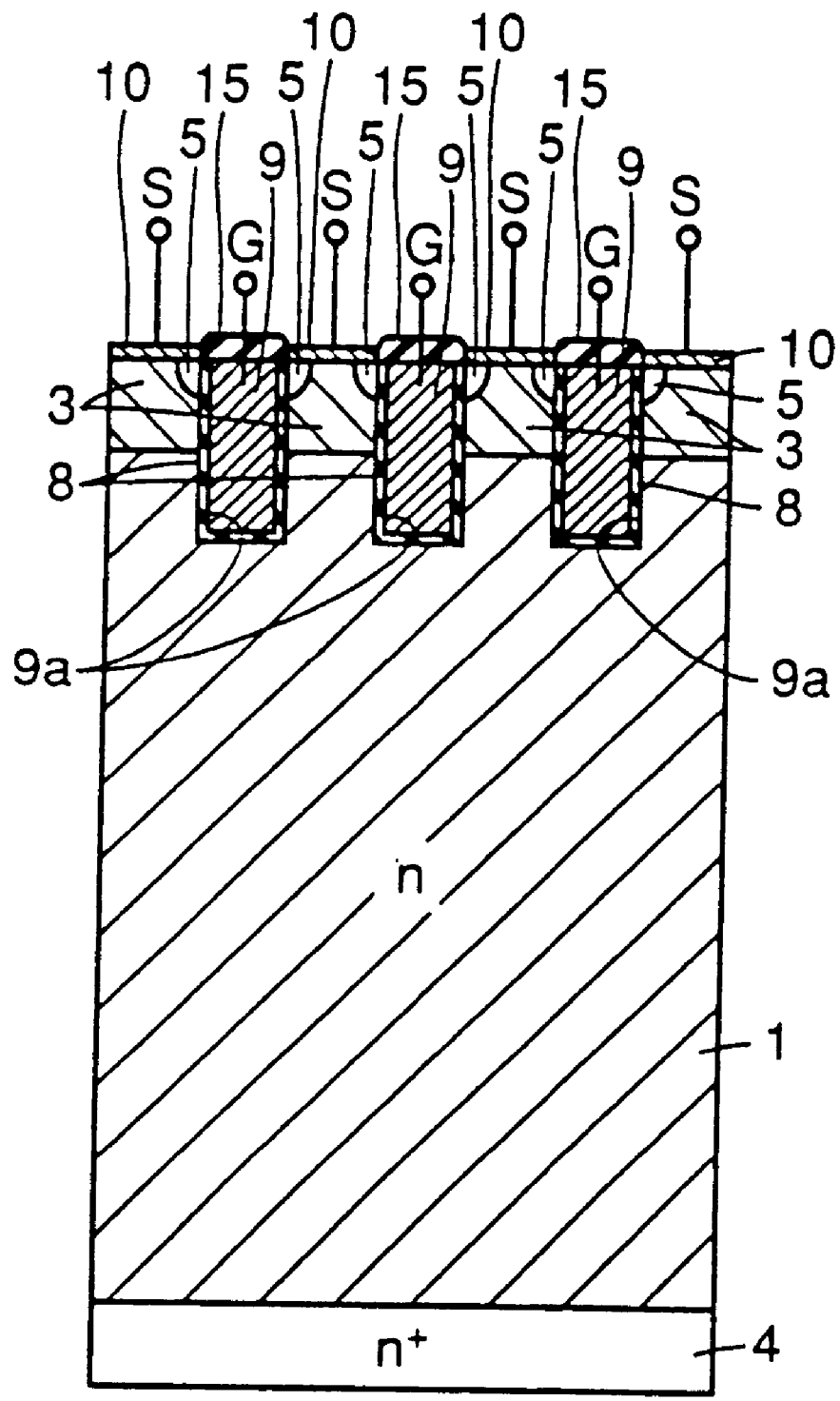
FIGS. 52 and 53 are schematic cross sectional views corresponding to 50=and 51—51 cross sections, respectively, of FIG. 49 showing a second step of the method of manufacturing the high breakdown voltage semiconductor device according to the seventh embodiment of the present invention.
Figure 53:
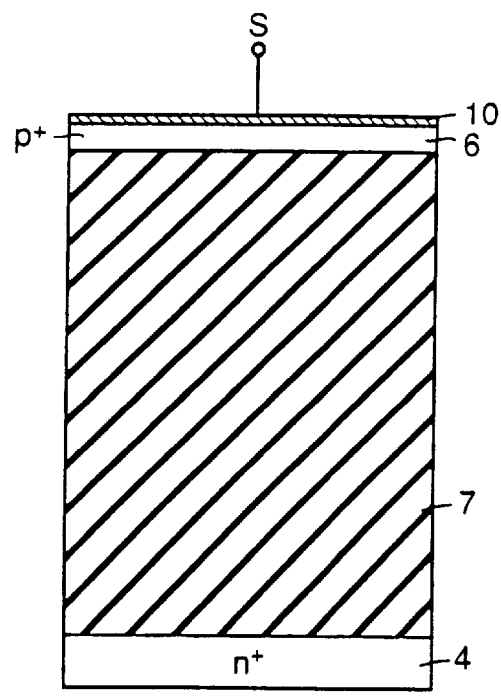

Referring to FIGS. 52 and 53, gate insulating layer 8 is formed at an internal wall surface of trench 9a, and gate electrode layer 9 is formed to fill trench 9a. Cap oxide film 15 is formed to cover an upper end of gate electrode layer 9. Furthermore, source n+ diffusion region 5 is formed along a sidewall of trench 9a such that p type base region 3 is sandwiched between a source $n^+$ diffusion region 5 and n type diffusion region 1, and source electrode 10 is formed in contact with p type base region 3 and source $n^+$ diffusion region 5.

According to the present embodiment, gate trench 9a is provided only on n type diffusion region 1 and thus the gate capacitance can be reduced to approximately one third of that of the structure according to the sixth embodiment.

Figure 54:
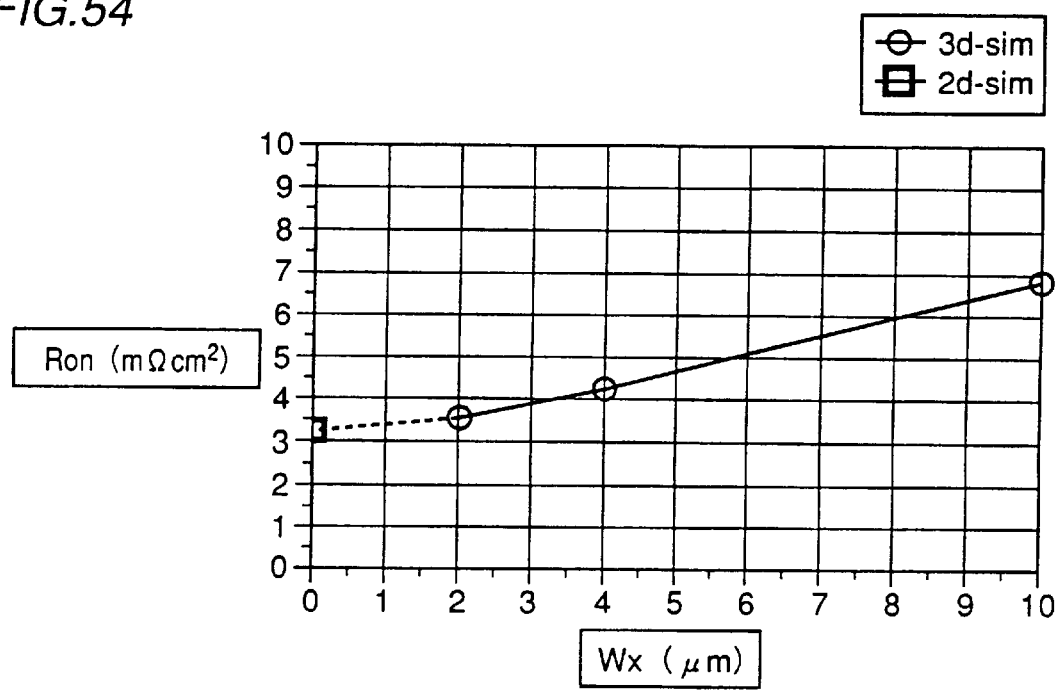
FIG. 54 shows a result of simulation of dependence of on-state resistance on space between gates in the structure shown in FIG. 49.

FIG. 54 shows an result of three dimensional numerical simulation of the gate trench pitch (practically, a half thereof, i.e., a width Wx of a device in the X direction) dependence of the on-state resistance in this structure. Referring to FIG. 54, "3d-sim" designates a calculation result for the structure according to the present embodiment shown in FIG. 48 and "2d-sim" designates a calculation result for the structure according to the first embodiment shown in FIG. 1. The results show that the on-state resistance obtained is almost the same as that for the gate electrode layer arrangement shown in FIG. 1 when Wx=2 $\mu$m, whereas the on-state resistance is almost twice that for the gate electrode layer arrangement shown in FIG. 1 when Wx=10 $\mu$m.

In this case, gate density of the structure according to the present embodiment (FIG. 48) is one fifth of that of the structure according to the first embodiment (FIG. 1). Accordingly, the input capacitance is reduced to one fifth and thus wider gate pitch is advantageous if performance is evaluated by the product of on-state resistance and input capacitance.

Eighth Embodiment

Figure 55:
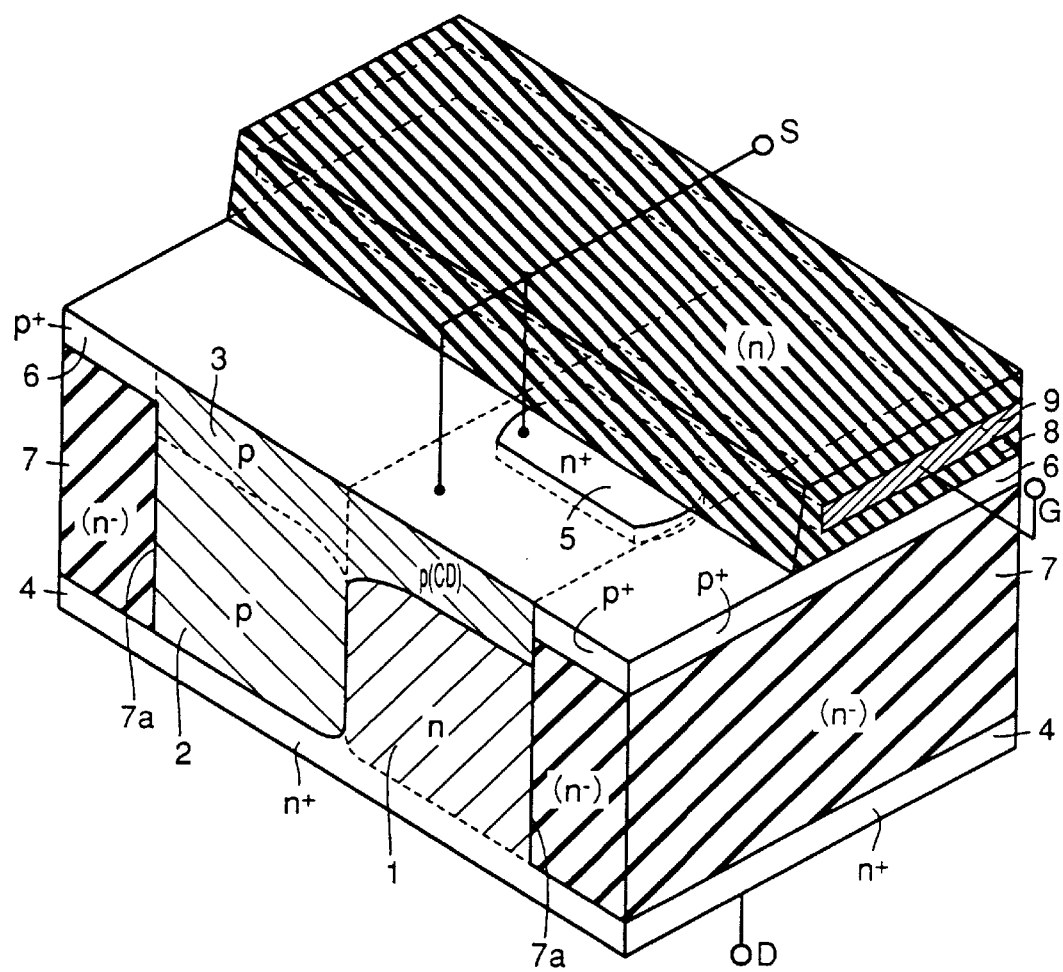
FIGS. 55, 56 and 57 are perspective views of a configuration of high breakdown voltage semiconductor devices according to eighth, ninth and tenth embodiments of the present invention, respectively.

The structure shown in FIG. 55 has a planar gate instead of a trench gate according to the sixth embodiment. More specifically, gate electrode layer 9 extends on the first main surface in a direction perpendicular to trench 7a with gate insulating layer 8 disposed therebetween. Furthermore gate electrode layer 9 is arranged opposite to p type well 3 disposed on the first main surface and sandwiched between n type diffusion region 1 and source $n^+$ diffusion region 5 with gate insulating layer 8 arranged between gate electrode layer 9 and p type well 3.

The rest of the structure is almost the same as the structure according to the sixth embodiment and thus identical members are labeled by identical reference characters and descriptions thereof are not repeated.

Gate electrode layer 9 according to the present embodiment is arranged in a direction perpendicular to trench 7a and thus wider gate interval necessary for planar gate structure can be achieved. Furthermore, although gate interval is increased and thus on-state resistance is slightly increased in the structure according to the present embodiment as compared with devices of trench gate type, the process for forming a gate structure is simplified and hence manufacturing at low cost can be achieved.

Ninth Embodiment

Figure 56:
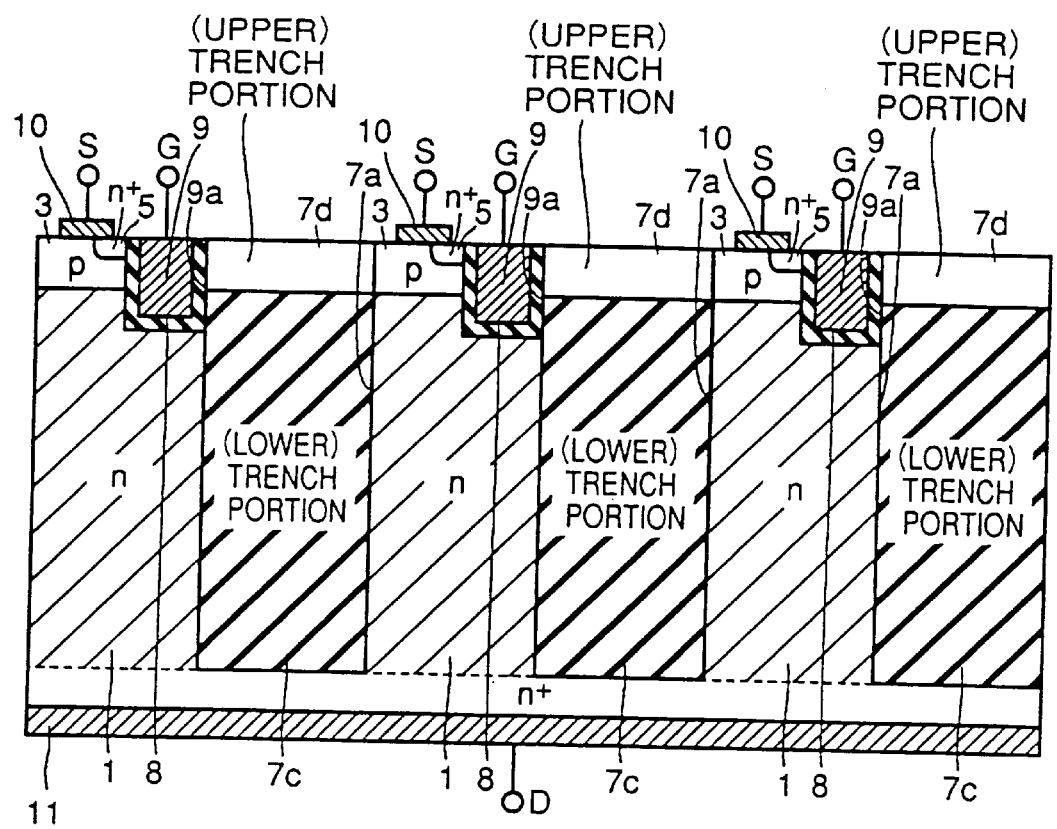
Figure 56:
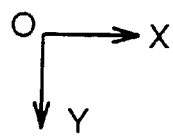

The structure shown in FIG. 56 has an n-trench repeat structure rather than the p-n-trench repeat structure which has been described above. More specifically, n type region 1 having a relatively high impurity concentration and trench 7a are alternately disposed.

Trench 7a has a lower portion in the figure filled with an insulator 7a which has a fixed negative charge and an upper portion filled with a layer 7d of p type silicon, silicon oxide or the like. The amount of fixed charge for insulator 7c is set to be equal to the amount of net donor ions for n type diffusion region 1. More specifically, insulator 7c has that amount of fixed charge of the opposite polarity which is equal to the amount of the charge when the impurity in n type region 1 is depleted.

Furthermore p type well 3 is formed in n type diffusion region 1 closer to a first main surface, and a first main surface has trench 9a formed to penetrate p type well 3 and reach n type diffusion region 1. Furthermore, source n+ diffusion region 5 is formed at that first main surface which faces a sidewall surface of trench 9a such that a portion of p type well 3 is sandwiched between source n+ diffusion region 5 and n type diffusion region 1. Gate electrode layer 9 which fills trench 9a is formed opposite to p type well 3 sandwiched between n type diffusion region 1 and source n+ diffusion region 5 with gate insulating layer 8 disposed therebetween.

Source electrode 10 is formed on a first main surface such that source electrode 10 is connected to p type well 3 and source n+ diffusion region 5. Furthermore drain electrode 11 is formed on a second main surface such that drain electrode 11 is in contact with drain n+ region 4 formed at the n-trench repeat structure closer to the second main surface.

It has been found from a numerical simulation for this structure that even with such a structure, high breakdown voltage can be obtained using n type diffusion region 1 of high impurity concentration. Ajustment of the amount of charge within trench 7a can, however, not achieve an electric field distribution in the shape of a rectangle in the Y direction and thus the breakdown voltage is slightly lower than that of the structure such as shown in FIG. 1. However, the impurity concentration in n type diffusion region can be as high as that shown in FIG. 1 and thus the on-state resistance can be significantly reduced.

With this structure, by selecting the material for an insulator to fill trench 7a, the entire device can be irradiated with charged particles such as electron ray to adjust the amount of fixed charge within insulator 7c. This advantageously allows a manufacturing method which optimizes breakdown voltage in a low temperature process after the silicon process. Furthermore the step of digging a trench for forming trench 7c need only be performed once and a highly precise oblique ion implanter is not required and thus manufacturing cost can be reduced.

Tenth Embodiment

Figure 57:
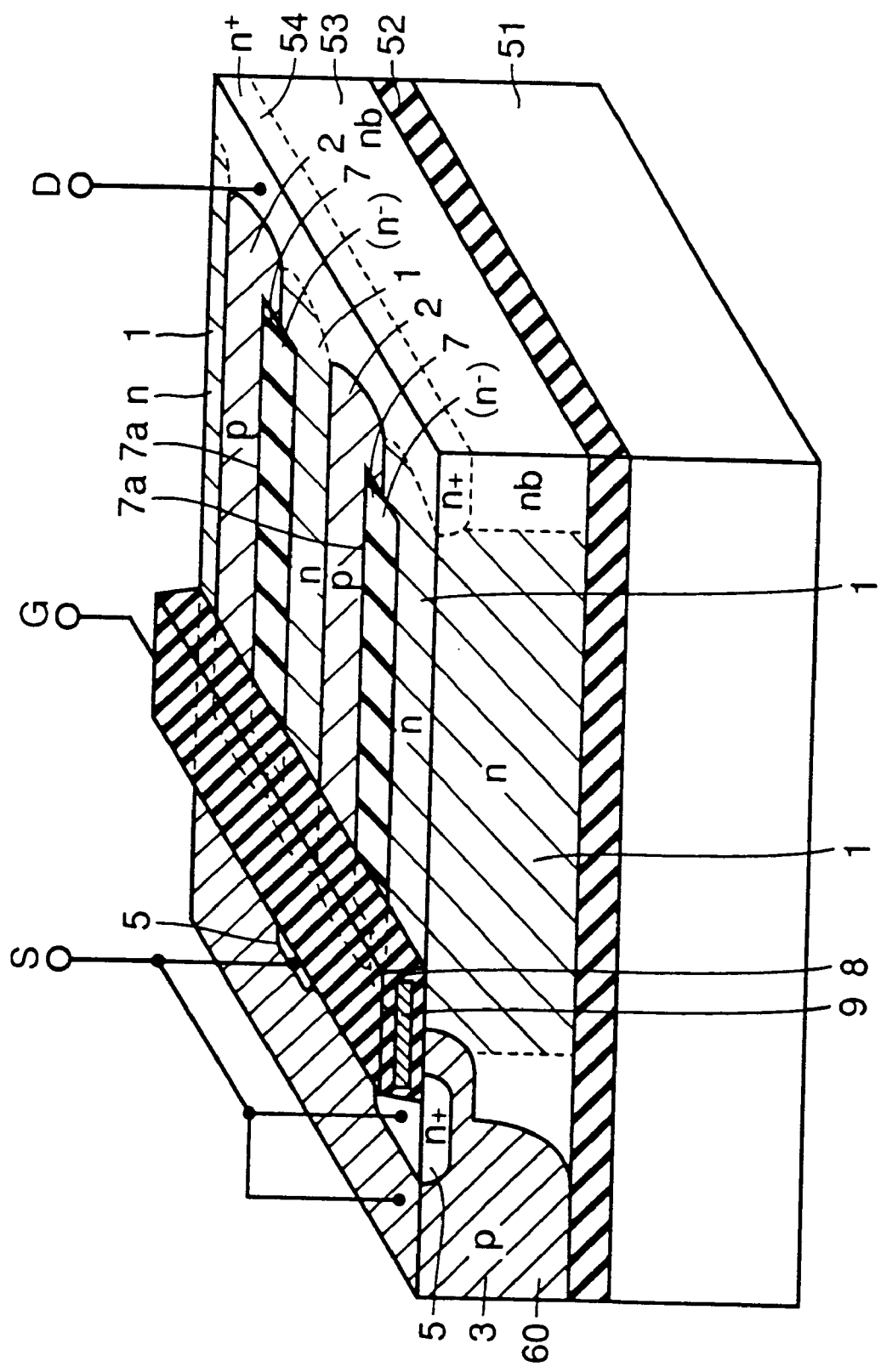

The structure shown in FIG. 57 is an application of the p-n-trench repeat structure according to the present embodiment when a lateral type power MOSFET is mounted on an SOI (Semiconductor on Insulator) substrate. More specifically, a semiconductor layer 60 is formed on a silicon substrate 51 with an insulating layer 52 of a silicon oxide film or the like disposed therebetween. Formed in semiconductor layer 60 is a lateral type power MOSFET to which the p-n-trench repeat structure according to the present invention is applied.

A plurality of trenches 7a which penetrate semiconductor layer 60 and reach insulating layer 52 are spaced apart from one another. Formed at a first main surface sandwiched between trenches 7a are n- and p-type diffusion regions 1 and 2 which reach insulating layer 52. Such a structure is repeated to form a p-n-trench repeat structure.

P type region 3 which forms a pn junction together with n type diffusion region 1 and is electrically connected to p type diffusion region 2 is formed at a first main surface. Source n+ diffusion region 5 is formed such that source n+ diffusion region 5 and n type diffusion region 1 sandwich a portion of p type region 3. Furthermore gate electrode layer 9 is formed opposite to p type region 3 sandwiched between n type diffusion region 1 and source n+ diffusion region 5 with gate insulating layer 8 posed therebetween. Gate electrode layer 9 extends on a first main surface in a direction from one trench 7a to another trench 7a.

In order to increase breakdown voltage in such an SOI type lateral device, long distance between the source/drain is only required. The depth of trench 7a is independent of this and only need be as much as the length of the active silicon layer (typically, approximately several µm) and thus the depth of trench 7a can be reduced and on-state resistance can be advantageously reduced with finer fabrication.

Furthermore, for SOI type lateral devices, trench separation is typically employed for separating devices and thus if trench 7a is simultaneously formed, the device can be manufactured without any significant change in the process. Although in this example, however, a filler for trench 7a is an insulator which is the same as a filler for a trench for separating devices such as silicon oxide, characteristically an equivalent can be obtained.

While the above first to tenth embodiments have been described with respect to an n channel type MOSFET using an n type substrate, the embodiments can be similarly applied to a p channel type MOSFET of the opposite conductivity, an SI (Static Induction) transistor or the like.

Although ion implantation method has been described as a method of introducing an impurity into a sidewall of a trench, any method other than this method may be used which has impurity concentration controllability with high precision which does not affect the final performance of a semiconductor device.

Furthermore filling layer 7 described in the first to tenth embodiments need only be formed of at least any selected from the group consisting of films which has extremely low concentration of conductive impurity and thus can substantially be regarded as a dielectric substance (an insulator), such as silicon oxide film, silicon nitride film, non-doped polycrystalline silicon film, non-doped non-crystalline silicon film, non-doped fine crystalline silicon film, organic silicon film, organic polymer.

Although the present invention has been described and illustrated in detail, it is clearly understood that the same is by way of illustration and example only and is not to be taken by way of limitation, the spirit and scope of the present invention being limited only by the terms of the appended claims.

In a high breakdown voltage semiconductor device according to the present invention, each of first and second impurity regions has an concentration of an impurity diffused from a sidewall surface of each of first and second trenches. Such a structure can, for example, be formed by oblique ion implantation method. This ion implantation method has an impurity concentration controllability greatly higher than that of epitaxial growth method. Thus, a power MOSFET having a micron-order fine pn repeat structure in which the p type impurity concentration is close to the n type impurity concentration can be formed with good controllability.

Furthermore, first and second impurity regions are formed in a region sandwiched between first and second trenches and thus the trade-off between the breakdown voltage and on-state voltage of an existing device can be greatly improved.

In the above aspect, preferably a source electrode is formed on a first main surface such that the source electrode is electrically connected to third and fourth impurity regions and a drain electrode is formed on a second main surface such that the drain electrode is electrically connected to the first impurity region. Thus a micron-order fine pn repeat structure can be obtained in a longitudinal power MOSFET.

In the above aspect, preferably a source electrode is formed on a first main surface such that the source electrode is electrically connected to third and fourth impurity regions and a drain electrode is formed on a first main surface such that the drain electrode is electrically connected to the first impurity region. Thus a micron-order fine pn repeat structure can be obtained in a lateral power MOSFET.

In the above aspect, preferably the space between adjacent trenches is not more than one third of the depth of the trenches. This allows a pn repeat structure of fine size.

In the above aspect, preferably the first impurity region is formed on one of sidewall surfaces of one trench opposite to each other and an impurity region of a conductivity type different from that of the first impurity region is formed on the other sidewall surface. This structure can be obtained by, for example, oblique ion implantation method.

In the above aspect, preferably the first impurity region is formed on one of sidewall surfaces of one trench opposite to each other and an impurity region of the same conductivity type as that of the first impurity region is formed on the other sidewall surface. This structure can be obtained by, for example, rotational oblique ion implantation method.

In the above method, preferably an inside of a trench is filled with silicon having no more than 10% of the impurity concentration of the first impurity region at a sidewall surface of one trench. This can prevent the charge density of a filling layer from significantly affecting electric field when the filling layer the material of which is silicon fills the trench.

In the above aspect, preferably an inside of a trench is filled with an insulating layer. Since a trench is filled with an insulating layer and the insulating layer has a sufficiently small charge density, the charge density does not significantly affect electric field.

In the above aspect, preferably a gate electrode layer extends in a direction in which it intersects one and another trenches. This allows designing with high degree of freedom. Furthermore, gate interval can be further increased, and thus increase in input capacitance due to high gate density and hence decrease in switching speed can be prevented.

In the above aspect, preferably a gate electrode layer has trench gate structure and is formed at a first main surface and also arranged only on the first impurity region. This allows designing with high degree of freedom. Furthermore, gate capacitance can be reduced and thus switching speed can be further improved.

In the above aspect, preferably a gate electrode layer has planar gate structure and is formed at a first main surface. This allows the gate interval to be larger than that of trench gate type and thus the process for forming a gate structure can be simplified and the device can be manufactured at low cost.

In the above aspect, preferably a repeat structure is formed in which a pn structure formed of first and second impurity regions adjacent to each other and a trench are repeated. A perimeter of the repeat structure is covered with a resistive film with a separating insulating layer disposed therebetween, and an end of the resistive film closer to the first main surface is electrically connected to a source electrode and an end of the resistive film closer to the second main surface is electrically connected to a drain electrode. This allows the electric field of the pn repeat structure to be linked to equipotential surface at an end of the repeat structure without contradiction and thus the breakdown voltage of the pn repeat structure is obtained intact. Furthermore, since the resistive film connected to the source and drain electrodes acts as a resistive field plate, effects of ions or the like in a sealing resin or the like are prevented and thus stable breakdown voltage can be obtained in the long term. Furthermore only a small area for the end structure is required and thus the device can be manufactured at a low cost.

In the above aspect, preferably a repeat structure is formed in which a pn structure formed of first and second impurity regions adjacent to each other and a trench are repeated. A perimeter of the repeat structure is connected to a semiconductor region of a first conductivity type, and an end of a depletion layer extending from the repeat structure when voltage is applied to a drain electrode ends within the semiconductor region. This allows an end structure with a simple repeat structure.

In the above aspect, preferably the diffusion length of an impurity of the first impurity region from a sidewall surface of one trench is shorter than the width of the first impurity region from the sidewall surface of one trench to an pn junction of the first and second impurity regions. The diffusion length of an impurity of the second impurity region from a sidewall surface of the other trench is shorter than the width of the second impurity region from the sidewall surface of the other trench to the pn junction of the first and second impurity regions. This relaxes changes of the electric field at the pn repeat structure and thus electric field concentration can be prevented.

In the above aspect, preferably a repeat structure is formed in which a pn structure formed of first and second impurity regions adjacent to each other and a trench are repeated. Trench interval is narrower at the periphery than at the center of the repeat structure at a first main surface. Thus, drop of breakdown voltage is less likely caused.

In the above aspect, preferably a semiconductor substrate is an SOI substrate having a substrate arranged closer to a second main surface and a semiconductor layer arranged closer to a first main surface and insulated from the substrate, and the first, second, third and fourth impurity regions are formed at the semiconductor layer. Thus, an SOI-type lateral power MOSFET can be obtained.

Furthermore since a micron-order fine pn repeat structure can be formed with good controllability, the trade-off between the breakdown voltage and on-state voltage of an existing device can be greatly improved.

What is claimed is:

1. A high breakdown voltage semiconductor device comprising:

a semiconductor substrate having first and second main surfaces opposite to each other and also having a plurality of trenches provided at said first main surface;

a first impurity region of a first conductivity type formed within a region of said semiconductor substrate sandwiched between one and another trenches of said plurality of trenches at a sidewall surface of said one trench;

a second impurity region of a second conductivity type formed within said region sandwiched between said one and another trenches at a sidewall surface of said another trench, and forming a pn junction together with said first impurity region;

a third impurity region of the second conductivity type formed closer to said first main surface than said first and second impurity regions;

a fourth impurity region of the first conductivity type formed on at least one of said first main surface and a sidewall surface of said one trench such that said fourth impurity region is disposed opposite to said first impurity region with said third impurity region disposed therebetween; and a gate electrode layer opposite to said third impurity region, sandwiched between said first and fourth impurity regions, with a gate insulating layer disposed therebetween;

wherein said first impurity region has a distribution of concentration of an impurity diffused from a sidewall surface of said one trench; and said second impurity region has a distribution of concentration of an impurity diffused from a sidewall surface of said another trench.

2. The high breakdown voltage semiconductor device according to claim 1, wherein a source electrode is formed on said first main surface to electrically connect with said third and fourth impurity regions and a drain electrode is formed on said second main surface to electrically connect with said first impurity region.

3. The high breakdown voltage semiconductor device according to claim 1, wherein a source electrode is formed on said first main surface to electrically connect with said third and fourth impurity regions and a drain electrode is formed on said first main surface to electrically connect with said first impurity region.

4. The high breakdown voltage semiconductor device according to claim 1, wherein a space between adjacent said trenches is at most one third of a depth of said trench.

5. The high breakdown voltage semiconductor device according to claim 1, wherein said first impurity region is formed at one of opposing sidewall surfaces of said one trench and an impurity region having a conductivity type different from that of said first impurity region is formed at the other of the opposing sidewall surfaces of said one trench.

6. The high breakdown voltage semiconductor device according to claim 1, wherein said first impurity region is formed at one of opposing sidewall surfaces of said one trench and an impurity region having a same conductivity type as that of said first impurity region is formed on the other of the opposing sidewall surfaces of said one trench.

7. The high breakdown voltage semiconductor device according to claim 1, wherein an inside of said trench is filled with silicon layer having an impurity concentration of at most 10% of an impurity concentration in said first impurity region at a sidewall surface of said one trench.

8. The high breakdown voltage semiconductor device according to claim 2, wherein:

a fifth impurity region of the first conductivity type is formed closer to said second main surface than said first and second impurity regions, said fifth impurity region being higher in impurity concentration than said first impurity region;

said drain electrode is electrically connected to said first impurity region with said fifth impurity region disposed therebetween; and a silicon layer filling the inside of said trench is spaced apart from said first and second impurity regions by an insulating layer and is also in contact with said fifth impurity region.

9. The high breakdown voltage semiconductor device according to claim 1, wherein an inside of said trench is filled with an insulating layer.

10. The high breakdown voltage semiconductor device according to claim 1, wherein said gate electrode layer extends along a direction in which said one and another trenches extend.

11. The high breakdown voltage semiconductor device according to claim 1, wherein said gate electrode layer extends along a direction in which said gate electrode layer intersects said one and another trenches.

12. The high breakdown voltage semiconductor device according to claim 11, wherein said gate electrode layer has a trench gate structure, is formed at said first main surface, and is arranged only on said first impurity region.

13. The high breakdown voltage semiconductor device according to claim 11, wherein said gate electrode layer has a planer gate structure and is formed on said first main surface.

14. The high breakdown voltage semiconductor device according to claim 2, having a repeat structure in which a pn structure of said first and second impurity regions and said trench are repeated, said pn structure and said trench being adjacent to each other, wherein a perimeter of said repeat structure is covered with resistive film with a separating insulating layer disposed therebetween, that end portion of said resistive film nearer said first main surface is electrically connected to said source electrode, and that end portion of said resistive film nearer said second main surface is electrically connected to said drain electrode.

15. The high breakdown voltage semiconductor device according to claim 2, having a repeat structure in which a pn structure of said first and second impurity regions and said trench are repeated, said pn structure and said trench being adjacent to each other, wherein a perimeter of said repeat structure is connected to a semiconductor region of the first conductivity type, and a tip of a depletion layer extending from said repeat structure when voltage is applied to said drain electrode ends within said semiconductor region.

16. The high breakdown voltage semiconductor device according to claim 15, wherein:

a diffusion length of an impurity of said first impurity region from a sidewall surface of said one trench is shorter than a width of said first impurity region between the sidewall surface of said one trench and said pn junction of said first and second impurity regions; and a diffusion length of an impurity of said second impurity region from a sidewall surface of said another trench is shorter than a width of said second impurity region between the sidewall surface of said another trench and said pn junction of said first and second impurity regions.

17. The high breakdown voltage semiconductor device according to claim 15, having a repeat structure in which a pn structure of said first and second impurity regions and said trench are repeated, said pn structure and said trench being adjacent to each other, wherein a space between said trenches is narrower at a perimeter than a center of said repeat structure at said first main surface.

18. The high breakdown voltage semiconductor device according to claim 15, wherein a filling layer including silicon as a material fills an inside of said trench and an impurity concentration of said filling layer is lower than that of said semiconductor region.

19. The high breakdown voltage semiconductor device according to claim 15, wherein a total amount of an impurity which is opposite in conductivity to said semiconductor region is larger when a total amount of an impurity of the first conductivity type introduced into said first and second impurity regions is compared with that of an impurity of the second conductivity type introduced into said first and second impurity region.

20. A high breakdown voltage semiconductor device comprising:

an SOI semiconductor substrate having first and second main surfaces opposite to each other, said SOI semiconductor substrate having a substrate arranged nearer said second main surface and a semiconductor layer arranged nearer said first main surface and insulated from said substrate, and also having a plurality of trenches provided at said first main surface;

a first impurity region of a first conductivity type formed within a region of said semiconductor layer sandwiched between one and another trenches of said plurality of trenches at a sidewall surface of said one trench;

a second impurity region of a second conductivity type formed within said region sandwiched between said one and another trenches at a sidewall surface of said another trench, and forming a pn junction together with said first impurity region;

a third impurity region of the second conductivity type formed within said semiconductor layer;

a fourth impurity region of the first conductivity type formed on at least one of said first main surface and a sidewall surface of said one trench such that said fourth impurity region is disposed opposite to said first impurity region with said third impurity region disposed therebetween; and a gate electrode layer opposite to said third impurity region, sandwiched between said first and fourth impurity regions, with a gate insulating layer disposed therebetween;

wherein said first impurity region has a distribution of concentration of an impurity diffused from a sidewall surface of said one trench; and said second impurity region has a distribution of concentration of an impurity diffused from a sidewall surface of said another trench;

a source electrode formed on said first main surface electrically connected with said third and fourth impurity regions and a drain electrode formed on said first main surface electrically connected with said first impurity region.

* * * * *

UNITED STATES PATENT AND TRADEMARK OFFICE
CERTIFICATE OF CORRECTION

PATENT NO. : 6,040,600
DATED : March 21, 2000
INVENTOR(S) : Akio UENISHI, et al.

It is certified that error appears in the above-identified patent and that said Letter Patent is hereby corrected as shown below:

Column 7, Line 67, change "24-24" to --2,4-2,4--.

Column 8, Line 4, change "24-24" to --2,4-2,4--.

Column 9, Line 28, change "50=" to --50-50--.

Line 33, change "50=" to --50-50--.

Column 10, Line 66, change "24-24" to --2,4-2,4--.

Column 11, Line 32, change "24-24" to --2,4-2,4--.

Signed and Sealed this

Twentieth Day of March, 2001

*Attest:*

NICHOLAS P. GODICI

*Attesting Officer*   *Acting Director of the United States Patent and Trademark Office*